US012772589B2

(12) United States Patent
Chen et al.

(10) Patent No.: US 12,772,589 B2
(45) Date of Patent: Oct. 20, 2026

(54) DIELECTRIC STRUCTURE FOR SMALL PIXEL DESIGNS

(71) Applicant: Taiwan Semiconductor Manufacturing Company, Ltd., Hsinchu (TW)

(72) Inventors: Wei Long Chen, New Taipei City (TW); Wen-I Hsu, Tainan City (TW); Feng-Chi Hung, Chu-Bei City (TW); Jen-Cheng Liu, Hsin-Chu City (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 838 days.

(21) Appl. No.: 18/149,767

(22) Filed: Jan. 4, 2023

(65) Prior Publication Data

US 2024/0021641 A1 Jan. 18, 2024

Related U.S. Application Data

(60) Provisional application No. 63/415,389, filed on Oct. 12, 2022, provisional application No. 63/389,087, filed on Jul. 14, 2022.

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/18* (2025.01); *H10F 39/811* (2025.01)

(58) Field of Classification Search
CPC ...... H10F 39/807; H10F 39/014; H10F 39/18; H10F 39/811; H10F 39/199;
(Continued)

(56) References Cited

U.S. PATENT DOCUMENTS

2012/0099361 A1* 4/2012 Lin ........................ H10B 20/00
365/102
2018/0130834 A1* 5/2018 Lee ....................... H10F 39/807
(Continued)

OTHER PUBLICATIONS

Weng et al. (Feasible approach for processes integration of CMOS transistor gate/side-wall spacer patterning fabrication, Microelectronics Reliability, vol. 50, Issue 12, 2010-NPLWeng10) (Year: 2010).*

(Continued)

*Primary Examiner* — Christine S. Kim
*Assistant Examiner* — Nathalie R Fayette
(74) *Attorney, Agent, or Firm* — Eschweiler & Potashnik, LLC

(57) ABSTRACT

Various embodiments of the present disclosure are directed towards an image sensor. The image sensor comprise a substrate having a first region and a second region. A first gate overlies the first region. A second gate overlies the second region. A deep trench isolation (DTI) structure is in the substrate and laterally between the first region and the second region. A first floating diffusion node is in the first region. A second floating diffusion node is in the second region. An interlayer dielectric (ILD) structure is over the substrate. A dielectric structure is between the ILD structure and the substrate. The dielectric structure is laterally between the first and second floating diffusion nodes. The dielectric structure is laterally spaced from the first and second gates. The dielectric structure overlies the DTI structure. A width of the dielectric structure is greater than a width of the DTI structure.

20 Claims, 28 Drawing Sheets

(58) Field of Classification Search
CPC ........... H10F 39/8037; H10F 39/80373; H10F 39/8053; H10F 39/8063; H10F 39/813; H10F 39/802; H10F 39/805
See application file for complete search history.

(56) References Cited

U.S. PATENT DOCUMENTS

| | | | | |
|---|---|---|---|---|
| 2019/0165009 | A1 | 5/2019 | Wu et al. | |
| 2020/0091212 | A1 | 3/2020 | Park et al. | |
| 2020/0098798 | A1* | 3/2020 | Takahashi | H10F 39/199 |
| 2020/0119097 | A1 | 4/2020 | Lee et al. | |
| 2020/0176500 | A1* | 6/2020 | Sze | H04N 25/778 |
| 2020/0212093 | A1* | 7/2020 | Lee | H10F 39/8037 |
| 2020/0279877 | A1 | 9/2020 | Kim | |
| 2021/0210532 | A1* | 7/2021 | Hung | H10F 39/182 |
| 2021/0343776 | A1 | 11/2021 | Nagahama | |
| 2021/0375973 | A1* | 12/2021 | Ha | H10F 39/807 |
| 2022/0013566 | A1 | 1/2022 | Kim et al. | |
| 2022/0271069 | A1 | 8/2022 | Fukui | |
| 2022/0367535 | A1* | 11/2022 | Cheng | H10F 39/807 |
| 2022/0384496 | A1 | 12/2022 | Cheng et al. | |
| 2023/0261021 | A1* | 8/2023 | Wang | H10F 39/807 257/292 |

OTHER PUBLICATIONS

U.S. Appl. No. 17/749,457, filed May 20, 2022.
U.S. Appl. No. 17/837,534, filed Jun. 10, 2022.
U.S. Appl. No. 17/845,624, filed Jun. 21, 2022.

* cited by examiner

DIELECTRIC STRUCTURE FOR SMALL PIXEL DESIGNS

REFERENCE TO RELATED APPLICATIONS

This Application claims the benefit of U.S. Provisional Application No. 63/389,087, filed on Jul. 14, 2022 & U.S. Provisional Application No. 63/415,389, filed on Oct. 12, 2022. The contents of the above-referenced patent applications are hereby incorporated by reference in their entirety.

BACKGROUND

Many modern day electronic devices (e.g., smartphones, digital cameras, biomedical imaging devices, automotive imaging devices, etc.) comprise image sensors. The image sensors comprise one or more photodetectors (e.g., photodiodes, phototransistors, photoresistors, etc.) configured to absorb incident radiation and output electrical signals corresponding to the incident radiation. Some types of image sensors include charge-coupled device (CCD) image sensors and complementary metal-oxide-semiconductor (CMOS) image sensors. Compared to CCD image sensors, CMOS image sensors are favored due to low power consumption, small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
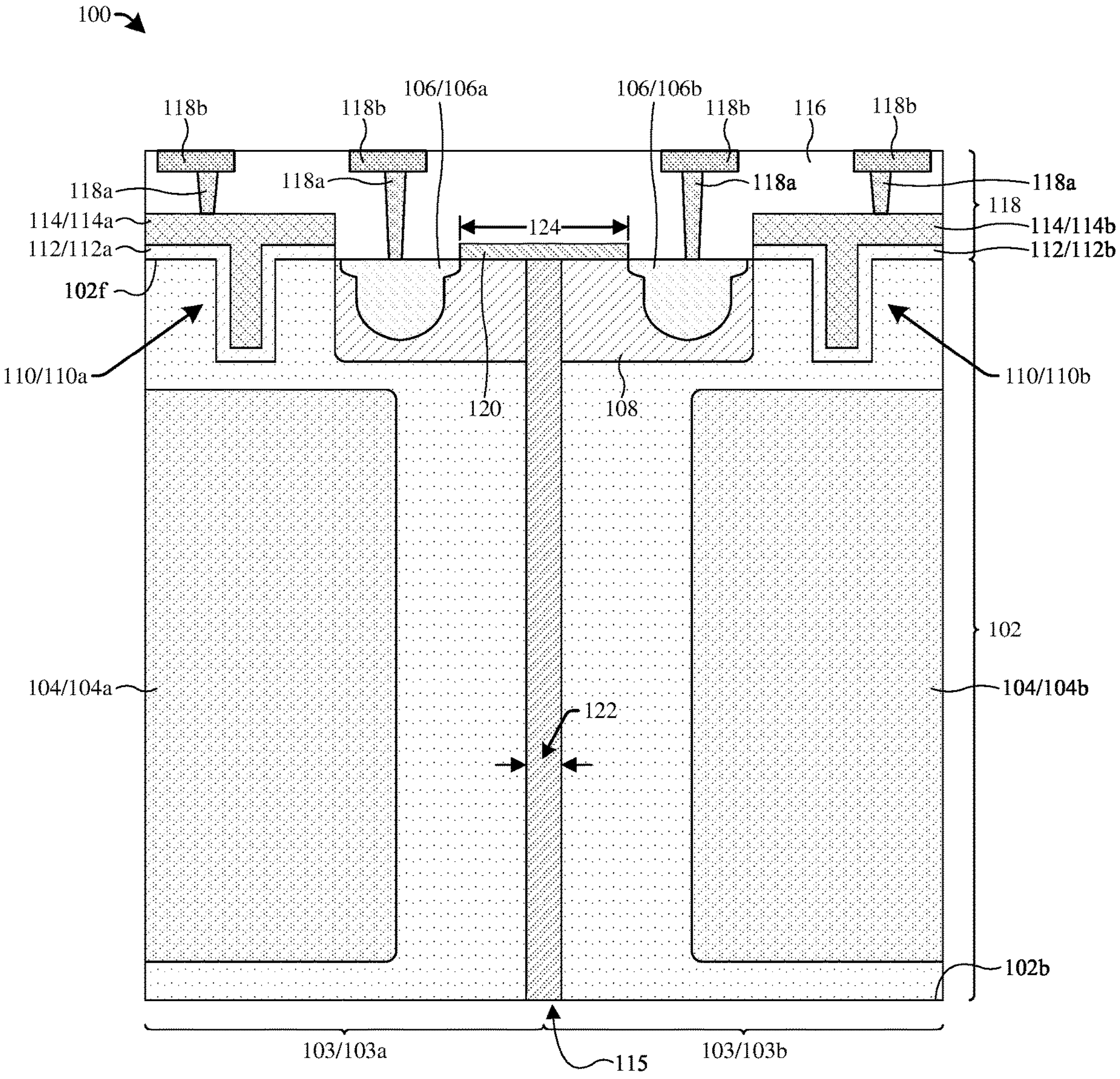
FIG. 1 illustrates a cross-sectional view of some embodiments of an image sensor having a dielectric structure for small pixel designs.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, etc.) include an image sensor for capturing images. One example of such an image sensor is a complementary metal-oxide-semiconductor (CMOS) image sensor (CIS) comprising a plurality of pixel sensors. Each of the pixel sensors comprises a photodetector disposed in a pixel region of a substrate (e.g., semiconductor substrate). Each of the pixel sensors comprises a transfer gate that is configured to transfer accumulated charges from its photodetector to a floating diffusion node. A backside deep trench isolation (BDTI) structure is disposed in the substrate and laterally surrounds the pixel regions. The BDTI structure is configured to provide isolation (e.g., electrical isolation, optical isolation, etc.) between the pixel sensors.

The BDTI structure extends into the substrate from a backside of the substrate, which is opposite a front side of the substrate. Typically, the BDTI structure extends partially through the substrate (e.g., not fully through the substrate from the backside to the front side of the substrate). However, as pixel sizes have continued to shrink, key performance indicators (KPIs) (e.g., dark current, white pixels, full well capacity, etc.) of the pixel sensors have been negatively affected (e.g., increased dark current, increased white pixels, etc.) due to the BDTI structure extending only partially through the substrate. For example, because the BDTI structure extends only partially through the substrate, a portion of the substrate between the BDTI structure and the front side of the substrate may allow charge carriers to easily move between neighboring pixel sensor (e.g., electron cross-talk), thereby negatively affecting the KPIs of the pixel sensors.

One partial solution to improving the KPIs of the pixel sensors due to the BDTI structure extending only partially through the substrate is to increase the depth of the BDTI structure so that the BDTI structure extends fully through the substrate. By having the BDTI structure extend fully through the substrate, the KPIs of the pixel sensors may be improved (e.g., decreased dark current, decreased white pixels, increased full well capacity, etc.). However, as pixel sizes are further scaled down, it becomes more difficult to control the lateral spacing between the BDTI structure and the floating diffusion nodes (e.g., to consistently maintain a predefined lateral spacing between the BDTI structure and the floating diffusion nodes). If the floating diffusion nodes are disposed too close to (or directly contacting) the BDTI structure, the KPIs of the pixel sensors may be negatively affected due to charge carriers being trapped along the BDTI structure.

In some embodiments, it may be difficult to control the lateral spacing between the BDTI structure and the floating diffusion nodes due to a process for forming the floating diffusion nodes. For example, the floating diffusion nodes are typically formed by a doping process (e.g., ion implantation process) that utilizes a photoresist (e.g., a positive/negative photoresist material) comprising a plurality of small openings. The plurality of small openings correspond to the locations in which the floating diffusion nodes are to be formed. However, as pixel sizes are further scaled down, the plurality of small openings become have become increasingly difficult to reduce in size (e.g., current generation photolithography tools do not have the resolution to continue to reduce the size of the openings).

Various embodiments of the present disclosure are related to an image sensor (e.g., CIS). The image sensor includes a semiconductor substrate having a first side opposite a second side. The semiconductor substrate has a first pixel region and a second pixel region. A first transfer gate overlies the first pixel region. A second transfer gate overlies the second pixel region. A deep trench isolation (DTI) structure (e.g., BDTI structure) is disposed in the semiconductor substrate and laterally between the first pixel region and the second pixel region. The DTI structure extends fully through the semiconductor substrate from the first side of the semiconductor substrate to the second side of the semiconductor substrate. A first floating diffusion node is disposed in the first pixel region. A second floating diffusion node is disposed in the second pixel region. The DTI structure is disposed laterally between the first floating diffusion node and the second floating diffusion node. An interlayer dielectric (ILD) structure is disposed over the semiconductor substrate, the first transfer gate, the second transfer gate, the DTI structure, the first floating diffusion node, and the second floating diffusion node. A dielectric structure is disposed between the ILD structure and semiconductor substrate. The dielectric structure overlies the DTI structure, and the dielectric structure is disposed laterally between the first floating diffusion node and the second floating diffusion node. A width of the dielectric structure is greater than a width of the DTI structure.

Because the dielectric structure overlies the DTI structure and is disposed laterally between the first and second floating diffusion nodes, the lateral spacing between the DTI structure and the first and second floating diffusion nodes may be better controlled (e.g., the dielectric structure allows a more consistent lateral spacing between the DTI structure and the first and second floating diffusion nodes to be achieved). More specifically, the dielectric structure is utilized as a masking structure during a doping process (e.g., ion implantation process) for forming the first and second floating diffusion nodes. Because the dielectric structure is utilized as the masking structure during the doping process, and because the width of the dielectric structure is greater than the width of the DTI structure, the first and second floating diffusion nodes may be formed so that the first and second floating diffusion nodes are more precisely laterally spaced from the DTI structure. Thus, in comparison to a typical image sensor, the image sensor of the present disclosure may have improved performance (e.g., decreased dark current, decreased white pixels, etc.). In addition, in some embodiments, a cost to fabricate the image sensor of the present disclosure may be less than a cost to fabricate the typical image sensor (e.g., the dielectric structure may allow better control over the lateral spacing while still utilizing current generation fabrication tools, such as current generation lithography tools, current generation etching tools, etc.).

FIG. 1 illustrates a cross-sectional view 100 of some embodiments of an image sensor having a dielectric structure 120 for small pixel designs.

As shown in the cross-sectional view 100 of FIG. 1, the image sensor comprises a substrate 102 (e.g., semiconductor substrate). The substrate 102 has a front side **102*f* and a back side 102*b* opposite the front side 102*f*. In some embodiments, the front side 102*f* of the substrate 102 is defined by a first surface (e.g., a front side surface), and the back side 102*b* of the substrate 102** is defined by a second surface (e.g., a back side surface) that is opposite the first surface.

The substrate 102 comprises a plurality of pixel regions 103. For example, the substrate 102 comprises a first pixel region **103*a* and a second pixel region 103*b*. The plurality of pixel regions 103 are portions of the substrate 102 in which features (e.g., structural features that are described in more detail below) of individual pixels (e.g., pixel sensors) of the image sensor are disposed. For example, the first pixel region 103*a* is a first portion of the substrate 102 in which features (e.g., structural features that are described in more detail below) of a first individual pixel of the image sensor are disposed; the second pixel region 103*b* is a second portion of the substrate 102** in which features (e.g., structural features that are described in more detail below) of a second individual pixel of the image sensor are disposed; and so forth.

The substrate 102 may comprise any type of semiconductor body (e.g., monocrystalline silicon/CMOS bulk, germanium (Ge), a group III-V semiconductor material, silicon-germanium (SiGe), silicon on insulator (SOI), etc.). In some embodiments, the image sensor (e.g., backside illumination image sensor) is configured to record incident radiation (e.g., photons) that passes through the back side **102*b* of the substrate 102. In other embodiments, the image sensor (e.g., front-side illumination image sensor) is configured to record incident radiation (e.g., photons) that passes through the front side 102*f* of the substrate 102. The substrate 102 may have a first doping type (e.g., p-type/n-type), or may be intrinsic. In other embodiments, the substrate 102** may have a second doping type (e.g., n-type/p-type) opposite the first doping type.

A plurality of photodetectors 104 are disposed in the plurality of pixel regions 103, respectively. For example, a first photodetector 104*a* is disposed in the first pixel region 103*a*; a second photodetector 104*b* is disposed in the second pixel region 103*b*; and so forth. In some embodiments, the plurality of photodetectors 104 respectively comprise portions of the substrate 102 having the second doping type. In other embodiments, the plurality of photodetectors 104 respectively comprise portions of the substrate 102 having the first doping type. In some embodiments, portions of the substrate 102 adjoining the plurality of photodetectors 104 have the first doping type (e.g., p-type/n-type), or may be intrinsic. The plurality of photodetectors 104 are configured to absorb the incident radiation (e.g., light) and generate electrical signals corresponding to the incident radiation.

A plurality of floating diffusion nodes 106 are disposed in the plurality of pixel regions 103, respectively. For example, a first floating diffusion node 106*a* is disposed in the first pixel region 103*a*; a second floating diffusion node 106*b* is disposed in the second pixel region 103*b*; and so forth. The plurality of floating diffusion nodes 106 are regions of the substrate 102 having the second doping type. The plurality of floating diffusion nodes 106 are spaced from the plurality of photodetectors 104. In some embodiments, the plurality of floating diffusion nodes 106 correspond to the plurality of photodetectors 104, respectively. For example, the first floating diffusion node 106*a* corresponds to the first photodetector 104*a*; the second floating diffusion node 106*b* corresponds to the second photodetector 104*b*; and so forth. The plurality of floating diffusion nodes 106 are spaced from their corresponding photodetector.

In some embodiments, a doped well 108 is disposed in the substrate 102. In further embodiments, the doped well 108 is disposed in the plurality of pixel regions 103. The doped well 108 is a region of the substrate 102 having the first doping type. In further embodiments, the plurality of floating diffusion nodes 106 may be disposed in the doped well 108.

A plurality of transfer gates 110 are disposed over/on the front side 102*f* of the substrate 102. The plurality of transfer gates 110 may overlie the plurality of pixel regions 103, respectively. For example, a first transfer gate 110*a* overlies the first pixel region 103*a*; a second transfer gate 110*b* overlies the second pixel region 103*b*; and so forth. The plurality of transfer gates 110 are configured to transfer accumulated charges from a corresponding photodetector to a corresponding floating diffusion node. For example, the first transfer gate 110*a* is configured to transfer charges accumulated in the first photodetector 104*a* from the first photodetector 104*a* to the first floating diffusion node 106*a*; the second transfer gate 110*b* is configured to transfer charges accumulated in the second photodetector 104*b* from the second photodetector 104*b* to the second floating diffusion node 106*b*; and so forth.

The plurality of transfer gates 110 comprise a plurality of gate dielectric structures 112, respectively. The plurality of transfer gates 110 comprise a plurality of gate electrode structures 114, respectively. The plurality of gate electrode structures 114 respectively overlie the plurality of gate dielectric structures 112. For example, the first transfer gate 110*a* comprises a first gate dielectric structure 112*a* and a first gate electrode structure 114*a* overlying the first gate dielectric structure 112*a*; the second transfer gate 110*b* comprises a second gate dielectric structure 112*b* and a second gate electrode structure 114*b* overlying the second gate dielectric structure 112*b*; and so forth. In some embodiments, the plurality of gate dielectric structures 112 are or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the plurality of gate electrode structures 114 are or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing.

In some embodiments, the plurality of transfer gates 110 have upper portions and lower portions. In further embodiments, the upper portions of the plurality of transfer gates 110 overlie the front side 102*f* of the substrate 102. In yet further embodiments, the lower portions of the plurality of transfer gates 110 extend vertically into the substrate 102 from their corresponding upper portion, as shown in the cross-sectional view 100 of FIG. 1. In such embodiments, the plurality of transfer gates 110 may be referred to as vertical transfer gates.

A deep trench isolation (DTI) structure 115 is disposed in the substrate 102. The DTI structure 115 extends vertically into the substrate 102 from the back side 102*b* of the substrate 102. The DTI structure 115 extends through the substrate 102. In some embodiments, the DTI structure 115 extends fully through the substrate 102 from the back side 102*b* of the substrate to the front side 102*f* of the substrate 102. In other embodiments, the DTI structure 115 may extend partially through the substrate 102 (e.g., not fully through the substrate 102).

The DTI structure 115 is disposed laterally between the first pixel region 103*a* and the second pixel region 103*b*. In some embodiments, the DTI structure 115 is disposed laterally between the first floating diffusion node 106*a* and the second floating diffusion node 106*b*. In some embodiments, the DTI structure 115 is disposed laterally between the first photodetector 104*a* and the second photodetector 104*b*. In some embodiments, the DTI structure 115 is disposed laterally between the first transfer gate 110*a* and the second transfer gate 110*b*.

The DTI structure 115 extends laterally through the substrate 102. In some embodiments, the DTI structure 115 extends laterally through the substrate 102 and laterally surrounds the first pixel region 103*a*. In further embodiments, the DTI structure 115 extends laterally through the substrate 102 and laterally surrounds the second pixel region 103*b*. In yet further embodiments, the DTI structure 115 extends laterally through the substrate 102 and laterally surrounds each of the pixel regions of the plurality of pixel regions 103.

In some embodiments, a first portion of the DTI structure 115 is disposed in the first pixel region 103*a* and a second portion of the DTI structure 115 is disposed in the second pixel region 103*b*. In further embodiments, the first portion of the DTI structure 115 and the second portion of the DTI structure 115 may have ring-shaped layouts (e.g., in embodiments in which the DTI structure 115 laterally surrounds each of the plurality of pixel regions 103). In some embodiments, a thickness (e.g., ring thickness) of the first portion of the DTI structure 115 is substantially the same as a thickness of the second portion of the DTI structure 115. In other embodiments, the thickness of the first portion of the DTI structure 115 may be different than the thickness of the second portion of the DTI structure 115. It will be appreciated that other portions of the DTI structure 115 may be disposed in other pixel regions of the plurality of pixel regions 103.

In some embodiments, the DTI structure 115 is referred to as an isolation structure. In some embodiments, the DTI structure 115 may be referred to as backside deep trench isolation (BDTI) structure. In such embodiments, the DTI structure 115 may extend into the substrate 102 from the back side 102*b* of the substrate 102. It will be appreciated that, in some embodiments, the DTI structure 115 may extend into the substrate from the front side 102*f* of the substrate 102, rather than the back side 102*b* of the substrate 102. In such embodiments, the DTI structure 115 may be referred to as front-side deep trench isolation (FDTI) structure.

In some embodiments, the DTI structure 115 may be or comprise, for example, an oxide (e.g., $SiO_2$), a nitride (e.g., silicon nitride (SiN)), an oxy-nitride (e.g., silicon oxynitride (SiON)), tetraethoxysilane (TEOS), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, the sidewalls of the DTI structure 115 may be substantially straight (e.g., vertical), as illustrated in the cross-sectional view 100 of FIG. 1. In other embodiments, the DTI structure 115 may have angled sidewalls.

An interlayer dielectric (ILD) structure 116 is disposed over the front side 102*f* of the substrate 102. The ILD structure 116 is disposed over the plurality of transfer gates 110. The ILD structure is disposed over the DTI structure 115. In some embodiments, the ILD structure 116 comprises one or more stacked ILD layers, which may respectively comprise a low-k dielectric (e.g., a dielectric material with a dielectric constant less than about 3.9), an oxide (e.g., $SiO_2$), or the like.

An interconnect structure 118 (e.g., copper interconnect) is disposed in the ILD structure 116 and over the front side 102*f* of the substrate 102. The interconnect structure 118 comprises a plurality of conductive contacts 118*a* (e.g., metal contacts) and a plurality of conductive wires 118*b* (e.g., metal vias). Although not shown in the cross-sectional view 100 of FIG. 1, it will be appreciated that, in some embodiments, the interconnect structure 118 may comprise additional conductive features (e.g., a plurality of conductive vias). In some embodiments, the interconnect structure 118 may be or comprise, for example, copper (Cu), aluminum (Al), tungsten (W), gold (Au), some other conductive material, or a combination of the foregoing. In further embodiments, the plurality of conductive contacts 118*a* may comprise a first conductive material (e.g., W), and the plurality of conductive wires 118*b* may comprise a second conductive material (e.g., Cu) different than the first conductive material.

A dielectric structure 120 is disposed vertically between the ILD structure 116 and the DTI structure 115. The dielectric structure 120 is disposed vertically between the ILD structure 116 and the substrate 102. In some embodiments, the dielectric structure 120 is disposed vertically between the ILD structure 116 and the front side 102*f* of the substrate 102. The dielectric structure 120 overlies the DTI structure 115. The dielectric structure 120 is disposed laterally between the first floating diffusion node 106*a* and the second floating diffusion node 106*b*. In some embodiments, the dielectric structure 120 contacts (e.g., directly contacts) the DTI structure 115. In further embodiments, an upper surface of the DTI structure 115 contacts a lower surface of the dielectric structure 120.

In some embodiments, the dielectric structure 120 may be or comprise, for example, for example, a nitride (e.g., SiN), an oxy-nitride (e.g., $SiO_XN_Y$), an oxide (e.g., $SiO_2$), a carbide (e.g., silicon carbide (SiC)), some other dielectric material, or a combination of the foregoing (e.g., oxide-nitride-oxide multilayer structure). In further embodiments, the dielectric structure 120 may be or comprise silicon nitride (SiN). In further embodiments, the dielectric structure 120 has a different chemical composition than the ILD structure 116. For example, in some embodiments, the dielectric structure 120 is silicon nitride (SiN) and the ILD structure 116 is silicon dioxide ($SiO_2$).

The DTI structure 115 has a width 122. The dielectric structure 120 has a width 124. The width 124 of the dielectric structure 120 is greater than the width 122 of the DTI structure 115.

Because the dielectric structure 120 overlies the DTI structure 115 and is disposed laterally between the first floating diffusion node 106*a* and the second floating diffusion node 106*b*, a lateral spacing between the DTI structure 115 and the first floating diffusion node 106*a* and a lateral spacing between the DTI structure 115 and the second floating diffusion node 106*b* may be better controlled (e.g., the dielectric structure 120 allows a more consistent lateral spacing between the DTI structure 115 and the first and second floating diffusion nodes 106*a*, 106*b* to be achieved). More specifically, the dielectric structure 120 is utilized as a masking structure during a doping process (e.g., ion implantation process) for forming the first floating diffusion node 106*a* and the second floating diffusion node 106*b*, which is described in more detail herein. Because the dielectric structure 120 is utilized as the masking structure during the doping process, and because the width 124 of the dielectric structure 120 is greater than the width 122 of the DTI structure 115, the first floating diffusion node 106*a* and the second floating diffusion node 106*b* may be formed so that the first floating diffusion node 106*a* and the second floating diffusion node 106*b* are more precisely laterally spaced from the DTI structure 115. Thus, in comparison to a typical image sensor (e.g., an image sensor not comprising the dielectric structure 120), the image sensor of the present disclosure may have improved performance (e.g., decreased dark current, decreased white pixels, etc.). In addition, in some embodiments, a cost to fabricate the image sensor of the present disclosure may be less than a cost to fabricate the typical image sensor (e.g., the dielectric structure 120 may allow better control over the lateral spacing while utilizing current generation fabrication tools, such as current generation lithography tools, current generation etching tools, etc.).

Figure 2:
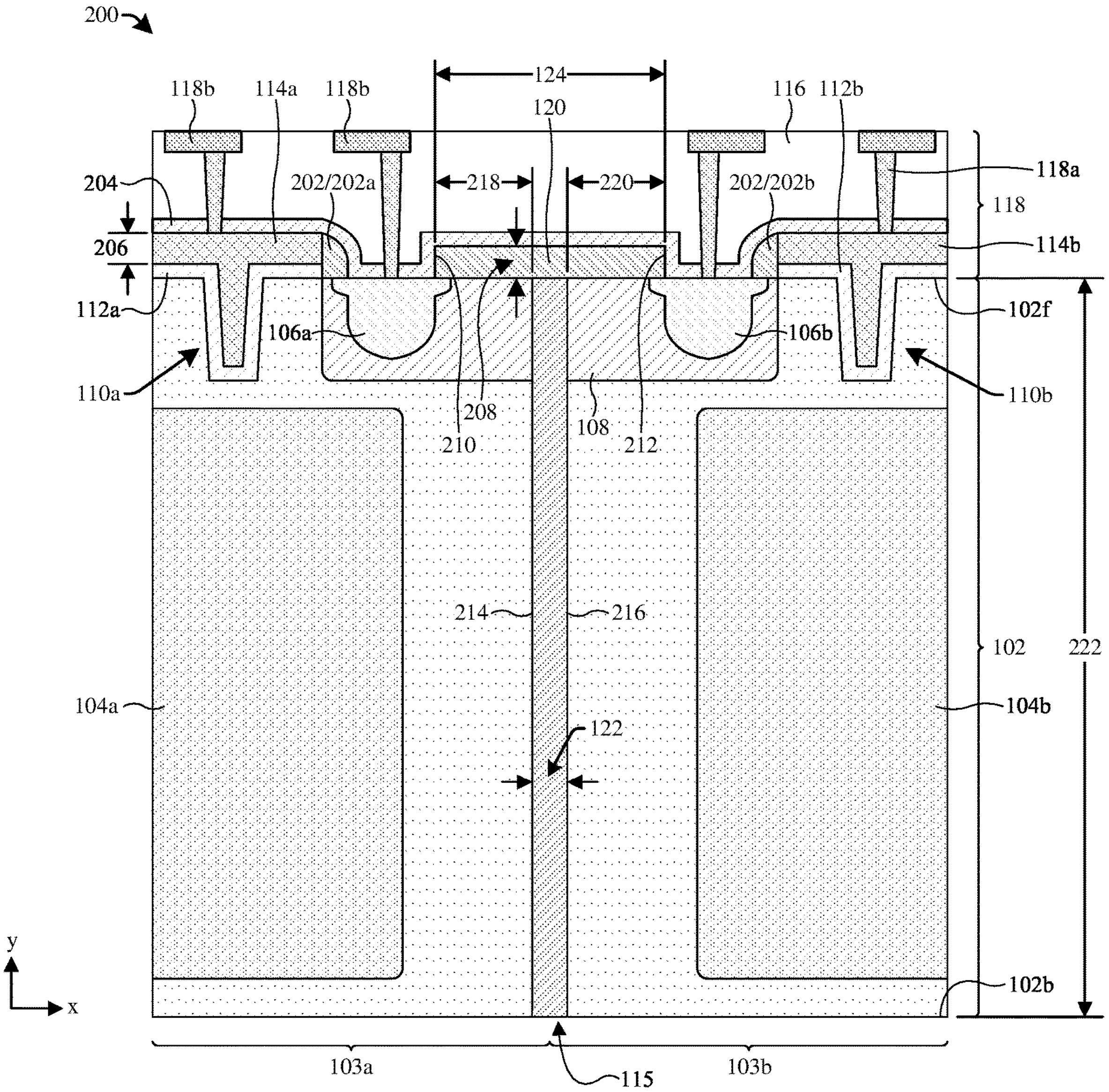
FIG. 2 illustrates a cross-sectional view of some other embodiments of an image sensor having a dielectric structure for small pixel designs.

FIG. 2 illustrates a cross-sectional view 200 of some other embodiments of an image sensor having a dielectric structure 120 for small pixel designs.

As shown in the cross-sectional view 200 of FIG. 2, the image sensor comprises a plurality of sidewall spacers 202 disposed over the substrate 102. For example, the image sensor comprises a first sidewall spacer 202*a* disposed over the substrate 102; a second sidewall spacer 202*b* disposed over the substrate 102; and so forth. The plurality of sidewall spacers 202 are disposed along sidewalls of the plurality of transfer gates 110. For example, the first sidewall spacer 202*a* is disposed along sidewalls of the first transfer gate 110*a*; the second sidewall spacer 202*b* is disposed along sidewalls of the second transfer gate 110*b*; and so forth. The plurality of sidewall spacers 202 are disposed along sidewalls of the plurality of gate electrode structures 114. For example, the first sidewall spacer 202*a* is disposed along sidewalls of the first gate electrode structure 114*a*; the second sidewall spacer 202*b* is disposed along sidewalls of the second gate electrode structure 114*b*; and so forth. In some embodiments, the plurality of sidewall spacers 202 are disposed along sidewalls of the plurality of gate dielectric structures 112. For example, the first sidewall spacer 202*a* is disposed along sidewalls of the first gate dielectric structure 112*a*; the second sidewall spacer 202*b* is disposed along sidewalls of the second gate dielectric structure 112*b*; and so forth. In further embodiments, the plurality of sidewall spacers 202 may extend laterally around the plurality of transfer gates 110 in closed loop paths, respectively. For example, the first sidewall spacer 202*a* extends laterally around the first transfer gate 110*a* in a first closed loop path; the second sidewall spacer 202*b* extends laterally around the second transfer gate 110*b* in a second closed loop path; and so forth.

The plurality of sidewall spacers 202 are laterally spaced from the dielectric structure 120. For example, the first sidewall spacer 202*a* is laterally spaced (along the x-axis) from the dielectric structure in a first direction, and the second sidewall spacer 202*b* is laterally spaced (along the x-axis) from the dielectric structure in a second direction opposite the first direction. In some embodiments, the plurality of sidewall spacers 202 may be or comprise, for example, an oxide (e.g., $SiO_2$), a nitride (e.g., SiN), an oxy-nitride (e.g., $SiO_XN_Y$), some other dielectric, or a combination of the foregoing (e.g., oxide-nitride-oxide (ONO) sidewall spacer). In further embodiments, the plurality of sidewall spacers 202 may be or comprise silicon nitride (SiN). In further embodiments, the plurality of sidewall spacers 202 have a same chemical composition as the dielectric structure 120. For example, in some embodiments, the plurality of sidewall spacers 202 and the dielectric structure 120 are each silicon nitride (SiN).

Also shown in the cross-sectional view 200 of FIG. 2, an etch stop layer 204 (e.g., contact etch stop layer (CESL)) is disposed over the substrate 102. In some embodiments, the etch stop layer 204 is also disposed over the plurality of transfer gates 110, the dielectric structure 120, the plurality of sidewall spacers 202, the plurality of floating diffusion nodes 106, the DTI structure 115, and the doped well 108. In some embodiments, the etch stop layer 204 lines the substrate 102, the plurality of transfer gates 110, the dielectric structure 120, and the plurality of sidewall spacers 202.

The etch stop layer 204 is disposed vertically between the ILD structure 116 and the dielectric structure 120. In some embodiments, the etch stop layer 204 contacts (e.g., directly contacts) the ILD structure 116 and the dielectric structure 120. In some embodiments, the etch stop layer 204 is also disposed vertically between the ILD structure 116 and the plurality of sidewall spacers 202 and/or disposed vertically between the ILD structure 116 and the plurality of transfer gates 110. In further embodiments, the etch stop layer 204 may contact (e.g., directly contact) the plurality of sidewall spacers 202 and/or the plurality of transfer gates 110. The etch stop layer 204 may be or comprise, for example, an oxide (e.g., SiO2), a nitride (e.g., SiN), an oxy-nitride (e.g., SiON), some other dielectric material, or a combination of the foregoing. In further embodiments, a chemical composition of the etch stop layer 204 is different than the chemical composition of the dielectric structure 120 and/or the chemical composition of the ILD structure 116 (e.g., the etch stop layer is a different material than the dielectric structure 120 and/or the ILD structure 116).

The plurality of gate electrode structures 114 have a thickness 206. In some embodiments, the thickness 206 of the plurality of gate electrode structures 114 corresponds to a thickness of upper portions of the plurality of gate electrode structures 114 that are disposed over the front side 102*f* of the substrate 102. In further embodiments, the thickness 206 is between about 100 angstroms (Å) and about 1000 Å (e.g., about 100 Å and about 1000 Å includes small variations due to fabrication methods). In yet further embodiments, the thickness 206 is between about 500 Å and about 800 Å.

The dielectric structure 120 has a thickness 208. In some embodiments, the thickness 208 is between about 150 Å and about 950 Å. In further embodiments, the thickness 208 is between about 400 Å and about 520 Å. In some embodiments, the thickness 208 is less than or equal to the thickness 206. In further embodiments, the thickness 208 is between about 50% and about 65% of the thickness 206. In some embodiments, if the thickness 208 is less than 50% of the thickness 206, the dielectric structure 120 may not adequately work as a masking structure (e.g., may not adequately block the implantation of ions into the substrate 102). In some embodiments, if the thickness 208 is greater than 65% of the thickness 206, a thickness of the ILD structure 116 may be increased beyond a predefined thickness, thereby increasing a cost to fabricate the image sensor without adding a meaningful benefit.

Also shown in the cross-sectional view 200 of FIG. 2, the dielectric structure 120 has a first sidewall 210 and a second sidewall 212. The first sidewall 210 is opposite the second sidewall 212. The DTI structure 115 has a first sidewall 214 and a second sidewall 216. The second sidewall 216 is opposite the first sidewall 214.

The first sidewall 210 of the dielectric structure 120 is laterally spaced from the first sidewall 214 of the DTI structure 115 by a first distance 218. The second sidewall 212 of the dielectric structure 120 is laterally spaced from the second sidewall 216 of the DTI structure 115 by a second distance 220. In some embodiments, the first distance 218 is substantially equal to the second distance 220 (e.g., a substantially equal distance may include small variations due to fabrication methods). In further embodiments, the first distance 218 and the second distance 220 are between about 40 Å and about 60 Å. In some embodiments, if the first distance 218 and/or the second distance 220 is less than about 40 Å, the lateral spacing between the first floating diffusion node 106*a* and the DTI structure 115 and/or the lateral spacing between the second floating diffusion node 106*b* and the DTI structure 115 may be too small, thereby causing performance of the image sensor to be negatively affected (e.g., degraded KPIs of the pixel sensors) due to charge carriers being trapped along the DTI structure 115. In some embodiments, if the first distance 218 and/or the second distance 220 is greater than about 60 Å, the lateral spacing between the first floating diffusion node 106*a* and the DTI structure 115 and/or the lateral spacing between the second floating diffusion node 106*b* and the DTI structure 115 may be too large, thereby negatively affecting yield (e.g., due to the landing zones for the conductive contacts that are electrically coupled to the floating diffusion nodes being too small).

Also shown in the cross-sectional view 200 of FIG. 2, the substrate 102 has a thickness 222. The thickness 222 may be between about 1 micrometer (μm) and about 10 μm. In some embodiments, the thickness 222 is between about 2 μm and about 5 μm. In further embodiments, the thickness 222 is about 3 μm.

Figure 3:
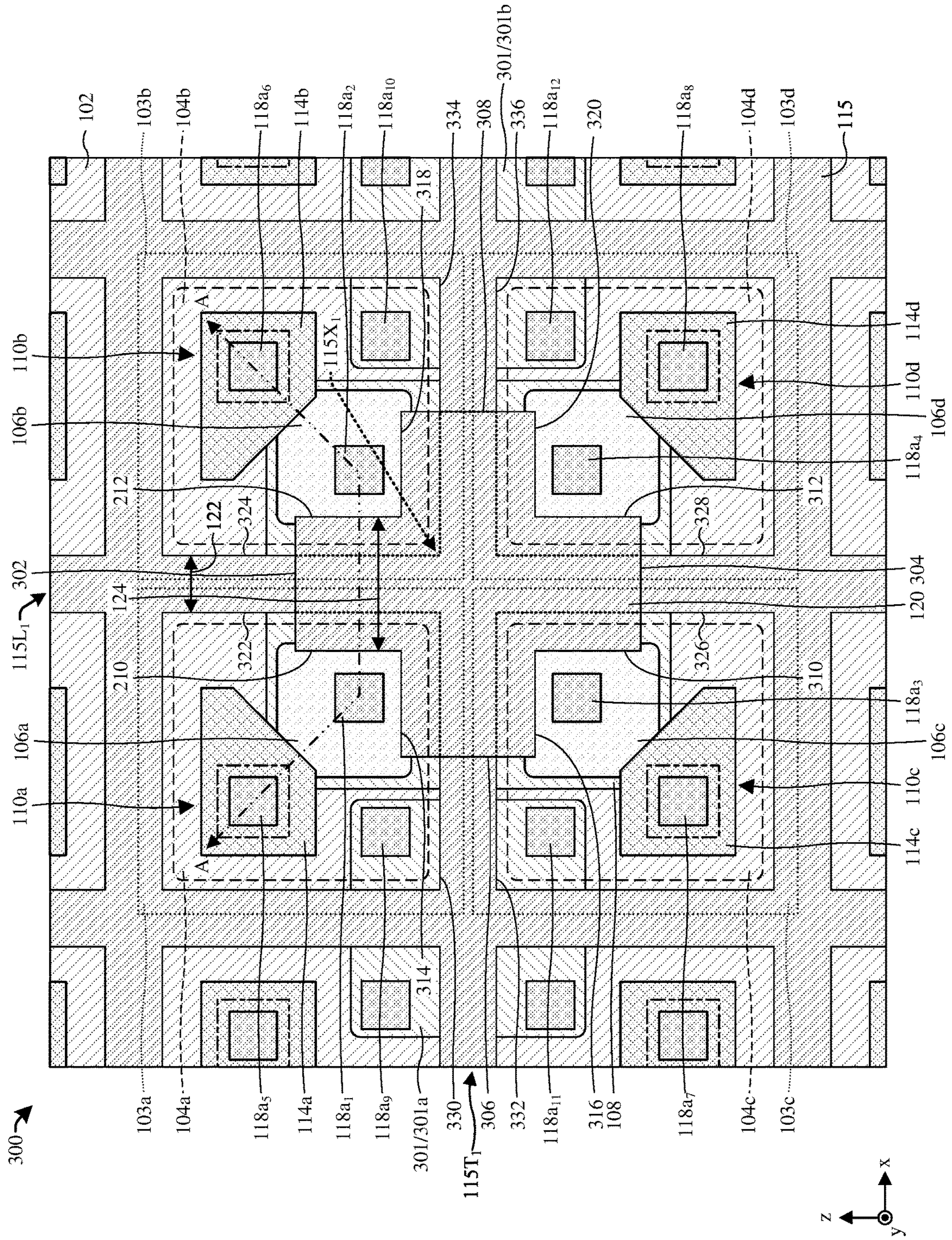
FIG. 3 illustrates a layout view of some other embodiments of an image sensor having a dielectric structure for small pixel designs.

FIG. 3 illustrates a layout view 300 of some other embodiments of an image sensor having a dielectric structure 120 for small pixel designs. It will be appreciated that, for clarity in the layout view 300 of FIG. 3, some features of the image sensor may not be illustrated in the layout view 300 of FIG. 3 (e.g., the plurality of sidewall spacers 202, the etch stop layer 204, the doped well 108, etc.).

As shown in the layout view 300 of FIG. 3, the image sensor comprises the first pixel region 103*a*, the second pixel region 103*b*, a third pixel region 103*c*, and a fourth pixel region 103*d*. In some embodiments, the plurality of pixel regions 103 comprises the first pixel region 103*a*, the second pixel region 103*b*, the third pixel region 103*c*, and the fourth pixel region 103*d*.

A third photodetector 104*c* is disposed in the third pixel region 103*c*. A fourth photodetector 104*d* is disposed in the fourth pixel region 103*d*. In some embodiments, the plurality of photodetectors 104 comprises the first photodetector 104*a*, the second photodetector 104*b*, the third photodetector 104*c*, and the fourth photodetector 104*d*.

A third floating diffusion node 106*c* is disposed in the substrate 102 and in the third pixel region 103*c*. A fourth floating diffusion node 106*d* is disposed in the substrate 102 and in the fourth pixel region 103*d*. In some embodiments, the plurality of floating diffusion nodes 106 comprises the first floating diffusion node 106*a*, the second floating diffusion node 106*b*, the third floating diffusion node 106*c*, and the fourth floating diffusion node 106*d*.

A third transfer gate 110*c* is disposed over the substrate 102 and overlying the third pixel region 103*c*. A fourth transfer gate 110*d* is disposed over the substrate 102 and overlying the fourth pixel region 103*d*. In some embodiments, the plurality of transfer gates 110 comprises the first transfer gate 110*a*, the second transfer gate 110*b*, the third transfer gate 110*c*, and the fourth transfer gate 110*d*.

The third transfer gate 110*c* comprises a third gate electrode structure 114*c* and a third gate dielectric structure (not shown). The fourth transfer gate 110*d* comprises a fourth gate electrode structure 114*d* and a fourth gate dielectric structure (not shown). In some embodiments, the plurality of gate electrode structures 114 comprises the first gate electrode structure 114*a*, the second gate electrode structure 114*b*, the third gate electrode structure 114*c*, and the fourth gate electrode structure 114*d*. In some embodiments, the plurality of gate dielectric structures 112 comprises the first gate dielectric structure 112*a*, the second gate dielectric structure 112*b*, the third gate dielectric structure, and the fourth gate dielectric structure.

The plurality of conductive contacts 118*a* comprises a first conductive contact $\mathbf{118}a_1$, a second conductive contact $\mathbf{118}a_2$, a third conductive contact $\mathbf{118}a_3$, and a fourth conductive contact $\mathbf{118}a_4$. In some embodiments, the first conductive contact $\mathbf{118}a_1$, the second conductive contact $\mathbf{118}a_2$, the third conductive contact $\mathbf{118}a_3$, and the fourth conductive contact $\mathbf{118}a_4$ are collectively referred to as a first group of conductive contacts $\mathbf{118}a_1$-$\mathbf{118}a_4$. The first group of conductive contacts $\mathbf{118}a_1$-$\mathbf{118}a_4$ are electrically coupled to the plurality of floating diffusion nodes 106, respectively. The first group of conductive contacts $\mathbf{118}a_1$-$\mathbf{118}a_4$ respectively overlie the plurality of floating diffusion nodes 106. For example, the first conductive contact $\mathbf{118}a_1$ overlies and is electrically coupled to the first floating diffusion node 106*a*; the second conductive contact $\mathbf{118}a_2$ overlies and is electrically coupled to the second floating diffusion node 106*b*; and so forth. The first group of conductive contacts $\mathbf{118}a_1$-$\mathbf{118}a_4$ extend vertically from the plurality of floating diffusion nodes 106.

The plurality of conductive contacts 118*a* comprises a fifth conductive contact $\mathbf{118}a_5$, a sixth conductive contact $\mathbf{118}a_6$, a seventh conductive contact $\mathbf{118}a_7$, and an eighth conductive contact $\mathbf{118}a_8$. In some embodiments, the fifth conductive contact $\mathbf{118}a_5$, the sixth conductive contact $\mathbf{118}a_6$, the seventh conductive contact $\mathbf{118}a_7$, and the eighth conductive contact $\mathbf{118}a_8$ are collectively referred to as a second group of conductive contacts $\mathbf{118}a_5$-$\mathbf{118}a_8$. The second group of conductive contacts $\mathbf{118}a_1$-$\mathbf{118}a_4$ are electrically coupled to the plurality of gate electrode structures 114, respectively. The second group of conductive contacts $\mathbf{118}a_5$-$\mathbf{118}a_8$ respectively overlie the plurality of gate electrode structures 114. For example, the fifth conductive contact $\mathbf{118}a_5$ overlies and is electrically coupled to the first gate electrode structure 114*a*; the sixth conductive contact $\mathbf{118}a_6$ overlies and is electrically coupled to the second gate electrode structure 114*b*; and so forth. The second group of conductive contacts $\mathbf{118}a_5$-$\mathbf{118}a_8$ extend vertically from the plurality of gate electrode structures 114.

In some embodiments, the second group of conductive contacts $\mathbf{118}a_5$-$\mathbf{118}a_8$ respectively overlie the lower portions of the plurality of transfer gates 110 (see, e.g., FIG. 1). For example, the fifth conductive contact $\mathbf{118}a_5$ overlies the lower portion of the first transfer gate 110*a*; the sixth conductive contact $\mathbf{118}a_6$ overlies the lower portion of the second transfer gate 110*b*; and so forth. For clarity, outlines of the lower portions of the plurality of transfer gates 110 are illustrated by dashed lines in the layout view 300 of FIG. 3.

The plurality of conductive contacts 118*a* comprises a ninth conductive contact $\mathbf{118}a_9$, a tenth conductive contact $\mathbf{118}a_{10}$, an eleventh conductive contact $\mathbf{118}a_{11}$, and a twelfth conductive contact $\mathbf{118}a_{12}$. In some embodiments, the ninth conductive contact $\mathbf{118}a_9$, the tenth conductive contact $\mathbf{118}a_{10}$, the eleventh conductive contact $\mathbf{118}a_{11}$, and the twelfth conductive contact $\mathbf{118}a_{12}$ are collectively referred to as a third group of conductive contacts $\mathbf{118}a_9$-$\mathbf{118}a_{12}$. The third group of conductive contacts $\mathbf{118}a_9$-$\mathbf{118}a_{12}$ are electrically coupled to the substrate 102. The third group of conductive contacts $\mathbf{118}a_9$-$\mathbf{118}a_{12}$ respectively overlie the plurality of pixel regions 103. For example, the ninth conductive contact $\mathbf{118}a_9$ overlies the first pixel region 103*a*; the tenth conductive contact $\mathbf{118}a_{10}$ overlies the second pixel region 103*b*; and so forth. The third group of conductive contacts $\mathbf{118}a_9$-$\mathbf{118}a_{12}$ extend vertically from the substrate 102.

In some embodiments, a plurality of ground wells 301 are disposed in the substrate 102. For example, a first ground well 301*a* is disposed in the substrate 102; a second ground well 301*b* is disposed in the substrate 102; and so forth. The plurality of ground wells 301 are regions of the substrate 102 having the first doping type. In some embodiments, the first ground well 301*a* is disposed in the first pixel region 103*a* and the third pixel region 103*c*. In some embodiments, the second ground well 301*b* is disposed in the second pixel region 103*b* and the fourth pixel region 103*d*.

In some embodiments, the third group of conductive contacts $\mathbf{118}a_9$-$\mathbf{118}a_{12}$ overlie the plurality of ground wells 301. For example, the ninth conductive contact $\mathbf{118}a_9$ and the eleventh conductive contact $\mathbf{118}a_{11}$ overlie the first ground well 301*a*, and the tenth conductive contact $\mathbf{118}a_{10}$ and the twelfth conductive contact $\mathbf{118}a_{12}$ overlie the second ground well 301*b*. In further embodiments, the third group of conductive contacts $\mathbf{118}a_9$-$\mathbf{118}a_{12}$ are electrically coupled to the plurality of ground wells 301. For example, the ninth conductive contact $118a_9$ and the eleventh conductive contact $118a_{11}$ are electrically coupled to the first ground well 301*a*, and the tenth conductive contact $118a_{10}$ and the twelfth conductive contact $118a_{12}$ are electrically coupled to the second ground well 301*b*. In yet further embodiments, the third group of conductive contacts $118a_9$-$118a_{12}$ are configured to electrically couple the plurality of ground wells 301 to an electrical ground (e.g., 0 volts (V)).

In some embodiments, the DTI structure 115 has a first transverse portion $115T_1$ and a first longitudinal portion $115L_1$. The first transverse portion $115T_1$ of the DTI structure 115 is perpendicular to the first longitudinal portion $115L_1$ of the DTI structure 115. The first transverse portion $115T_1$ extends laterally through the substrate 102 in a first direction (along the x-axis). The first longitudinal portion $115L_1$ extends laterally through the substrate 102 in a second direction (along the z-axis) that is perpendicular to the first direction. The first transverse portion $115T_1$ of the DTI structure 115 intersects the first longitudinal portion $115L_1$ of the DTI structure 115. The region in which the first transverse portion $115T_1$ of the DTI structure 115 intersects the first longitudinal portion $115L_1$ of the DTI structure 115 is referred to as a first intersection portion $115X_1$ of the DTI structure 115. The first intersection portion $115X_1$ of the DTI structure 115 is laterally disposed between the first pixel region 103*a* and the fourth pixel region 103*d* and laterally between the second pixel region 103*b* and the third pixel region 103*c*.

In some embodiments, the dielectric structure 120 overlies, at least partially, each of the first transverse portion $115T_1$ of the DTI structure 115, the first longitudinal portion $115L_1$ of the DTI structure 115, and the first intersection portion $115X_1$ of the DTI structure 115. In further embodiment, the first intersection portion $115X_1$ of the DTI structure 115 is disposed laterally within a perimeter of the dielectric structure 120. In some embodiments, the dielectric structure 120 has a cross-like shape when viewed along a layout view, as shown in the layout view 300 of FIG. 3. In other words, in some embodiments, the dielectric structure 120 has a cross-like shape when viewed from a top view.

In some embodiments, the dielectric structure 120 completely overlies the first intersection portion $115X_1$ of the DTI structure 115. In further embodiments, the dielectric structure 120 partially overlies the first transverse portion $115T_1$ and partially overlies the first longitudinal portion $115L_1$. In yet further embodiments, a center point of the dielectric structure 120 overlies (e.g., directly overlies) a center point of the first intersection portion $115X_1$ of the DTI structure 115.

As shown in the layout view 300 of FIG. 3, in some embodiments, the DTI structure 115 laterally surrounds each of the plurality of pixel regions 103. The first longitudinal portion $115L_1$ is disposed laterally between the first pixel region 103*a* and the second pixel region 103*b*. The first longitudinal portion $115L_1$ is disposed laterally between the third pixel region 103*c* and the fourth pixel region 103*d*. The first transverse portion $115T_1$ is disposed laterally between the first pixel region 103*a* and the third pixel region 103*c*. The first transverse portion $115T_1$ is disposed laterally between the second pixel region 103*b* and the fourth pixel region 103*d*.

The dielectric structure 120 has the first sidewall 210 and the second sidewall 212. The first sidewall 210 is opposite the second sidewall 212. The first sidewall 210 is laterally spaced from the second sidewall 212 in the first direction (along the x-axis). The dielectric structure 120 may also have a third sidewall 302, a fourth sidewall 304, a fifth sidewall 306, a sixth sidewall 308, a seventh sidewall 310, an eighth sidewall 312, a ninth sidewall 314, a tenth sidewall 316, an eleventh sidewall 318, and a twelfth sidewall 320.

The third sidewall 302 is opposite the fourth sidewall 304. The third sidewall 302 is laterally spaced from the fourth sidewall 304 in the second direction (along the z-axis). The fifth sidewall 306 is opposite the sixth sidewall 308. The fifth sidewall 306 is laterally spaced form the sixth sidewall 308 in the first direction (along the x-axis). The seventh sidewall 310 is opposite the eighth sidewall 312. The seventh sidewall 310 is laterally spaced from the eighth sidewall 312 in the first direction (along the x-axis). The ninth sidewall 314 is opposite the tenth sidewall 316. The ninth sidewall 314 is laterally spaced from the tenth sidewall 316 in the second direction (along the z-axis). The eleventh sidewall 318 is opposite the twelfth sidewall 320. The eleventh sidewall 318 is laterally spaced from the twelfth sidewall 320 in the second direction (along the z-axis).

In some embodiments, the first sidewall 210 and the seventh sidewall 310 are aligned along a first plane. In further embodiments, the second sidewall 212 is aligned with the eighth sidewall 312 along a second plane. In some embodiments, the ninth sidewall 314 and the eleventh sidewall 318 are aligned along a third plane. In further embodiments, the tenth sidewall 316 is aligned with the twelfth sidewall 320 along a fourth plane.

In some embodiments, the first group of conductive contacts $118a_1$-$118a_4$ are disposed laterally between the third sidewall 302 and the fourth sidewall 304. In further embodiments, the first group of conductive contacts $118a_1$-$118a_4$ are also disposed laterally between the fifth sidewall 306 and the sixth sidewall 308. For example, the first conductive contact $118a_1$ is laterally disposed between the third sidewall 302 and the fourth sidewall 304 and is laterally disposed between the fifth sidewall 306 and the sixth sidewall 308; the second conductive contact $118a_2$ is laterally disposed between the third sidewall 302 and the fourth sidewall 304 and is laterally disposed between the fifth sidewall 306 and the sixth sidewall 308; and so forth.

As shown in the layout view 300 of FIG. 3, in some embodiments, the width 124 of the dielectric structure 120 corresponds to a distance between the first sidewall 210 and the second sidewall 212. In some embodiments, a distance between the seventh sidewall 310 and the eighth sidewall 312 may be substantially the same as the distance between the first sidewall 210 and the second sidewall 212. In some embodiments, a distance between the ninth sidewall 314 and the tenth sidewall 316 may be substantially the same as the distance between the first sidewall 210 and the second sidewall 212. In some embodiments, a distance between the eleventh sidewall 318 and the twelfth sidewall 320 may be substantially the same as the distance between the first sidewall 210 and the second sidewall 212.

The first longitudinal portion $115L_1$ of the DTI structure 115 has a first sidewall 322 and a second sidewall 324. The second sidewall 324 is opposite the first sidewall 322. The first sidewall 322 is laterally spaced from the second sidewall 324 in the first direction (along the x-axis). The DTI structure 115 has the width 122. In some embodiments, the width 122 corresponds to a distance between the first sidewall 322 and the second sidewall 324. In some embodiments, the width 124 is greater than the width 122. In further embodiments, both the first sidewall 322 and the second sidewall 324 are disposed laterally between the first sidewall 210 and the second sidewall 212.

The first longitudinal portion $115L_1$ of the DTI structure 115 has a third sidewall 326 and a fourth sidewall 328. The third sidewall 326 is opposite the fourth sidewall 328. The third sidewall 326 is laterally spaced from the fourth sidewall 328 in the first direction (along the x-axis). In some embodiments, the third sidewall 326 is aligned with the first sidewall 322 along a fifth plane. In some embodiments, the fourth sidewall 328 is aligned with the second sidewall 324 along a sixth plane. In some embodiments, a width between the third sidewall 326 and the fourth sidewall 328 is substantially equal to the distance between the first sidewall 322 and the second sidewall 324. In further embodiments, both the third sidewall 326 and the fourth sidewall 328 are disposed laterally between the seventh sidewall 310 and the eighth sidewall 312.

The first transverse portion 115$T_1$ of the DTI structure 115 has a first sidewall 330 and a second sidewall 332. The second sidewall 332 is opposite the first sidewall 330. The first sidewall 330 is laterally spaced from the second sidewall 332 in the second direction (along the z-axis). In some embodiments, a width between the first sidewall 330 and the second sidewall 332 is substantially equal to the distance between the first sidewall 322 and the second sidewall 324. In further embodiments, both the first sidewall 330 and the second sidewall 332 are disposed laterally between the ninth sidewall 314 and the tenth sidewall 316.

The first transverse portion 115$T_1$ of the DTI structure 115 has a third sidewall 334 and a fourth sidewall 336. The third sidewall 334 is opposite the fourth sidewall 336. The third sidewall 334 is laterally spaced from the fourth sidewall 336 in the second direction (along the z-axis). In some embodiments, the third sidewall 334 is aligned with the first sidewall 330 along a seventh plane. In some embodiments, the fourth sidewall 336 is aligned with the second sidewall 332 along an eighth plane. In some embodiments, a width between the third sidewall 334 and the fourth sidewall 336 is substantially equal to the distance between the first sidewall 322 and the second sidewall 324. In further embodiments, both the third sidewall 334 and the fourth sidewall 336 are disposed laterally between the eleventh sidewall 318 and the twelfth sidewall 320. In some embodiments, the cross-sectional view 100 of FIG. 1 and/or the cross-sectional view 200 of FIG. 2 are taken along line A-A of the layout view 300 of FIG. 3.

Figure 4:
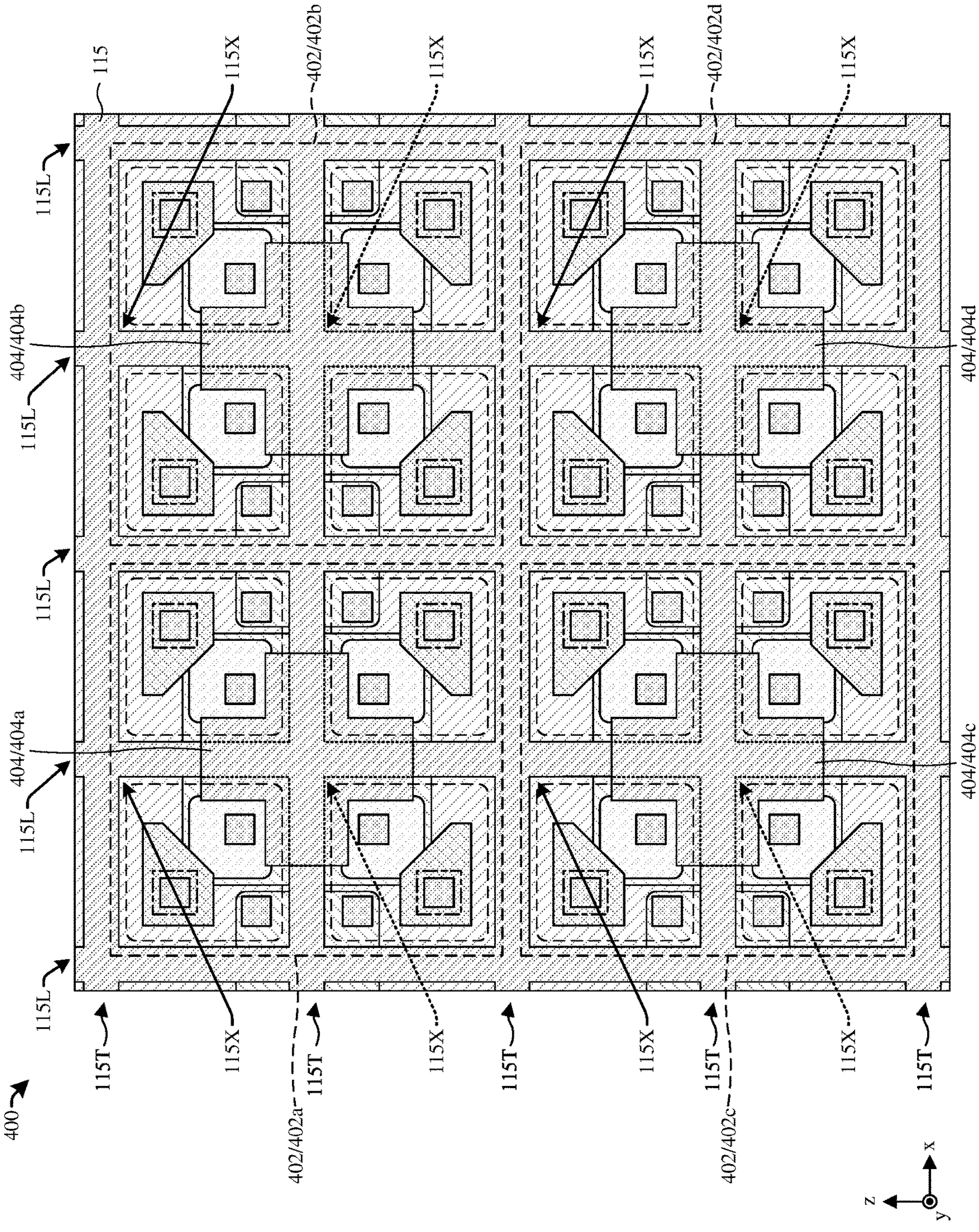
FIG. 4 illustrates a layout view of some other embodiments of an image sensor having a dielectric structure for small pixel designs.

FIG. 4 illustrates a layout view 400 of some other embodiments of an image sensor having a dielectric structure 120 for small pixel designs.

As shown in the layout view 400 of FIG. 4, the image sensor comprises groups of pixel regions 402. For example, the image sensor comprises a first group of pixel regions 402*a*, a second group of pixel regions 402*b*, a third group of pixel regions 402*c*, and a fourth group of pixel regions 402*d*. The groups of pixel regions 402 may be disposed in an array comprising rows and columns. In some embodiments, each individual group of pixel regions comprises a plurality of pixel regions. For example, the first group of pixel regions 402*a* comprises a first plurality of pixel regions (see, e.g., the plurality of pixel regions 103); the second group of pixel regions 402*b* comprises a second plurality of pixel regions; and so forth. A more detailed layout view of one possible embodiment of an individual group of pixel regions of the groups of pixel regions 402 is illustrated in the layout view 300 of FIG. 3. In some embodiments, the groups of pixel regions 402 may have substantially similar layouts as one another.

Also shown in the layout view 400 of FIG. 4, the image sensor comprises a plurality of dielectric structures 404. For example, the image sensor comprises a first dielectric structure 404*a*, a second dielectric structure 404*b*, a third dielectric structure 404*c*, and a fourth dielectric structure 404*d*. The plurality of dielectric structures 404 are laterally spaced. The plurality of dielectric structures 404 may be disposed in an array comprising rows and columns. A more detailed layout view of one possible embodiment of a dielectric structure of the plurality of dielectric structures is illustrated in the layout view 300 of FIG. 3 (see, e.g., the dielectric structure 120 illustrated in the layout view 300 of FIG. 3). In some embodiments, the plurality of dielectric structures 404 may have substantially similar layouts as one another.

Also shown in the layout view 400 of FIG. 4, the DTI structure 115 comprises a plurality of transverse portions 115T, a plurality of longitudinal portions 115L, and a plurality of intersection portions 115X. In some embodiments, the DTI structure 115 laterally surrounds the groups of pixel regions 402. In further embodiments, the plurality of pixel regions of the groups of pixel regions 402. A more detailed layout view of one possible embodiment of the DTI structure 115 is illustrated in the layout view 300 of FIG. 3 (see, e.g., the DTI structure 115 illustrated in the layout view 300 of FIG. 3).

Figure 5:
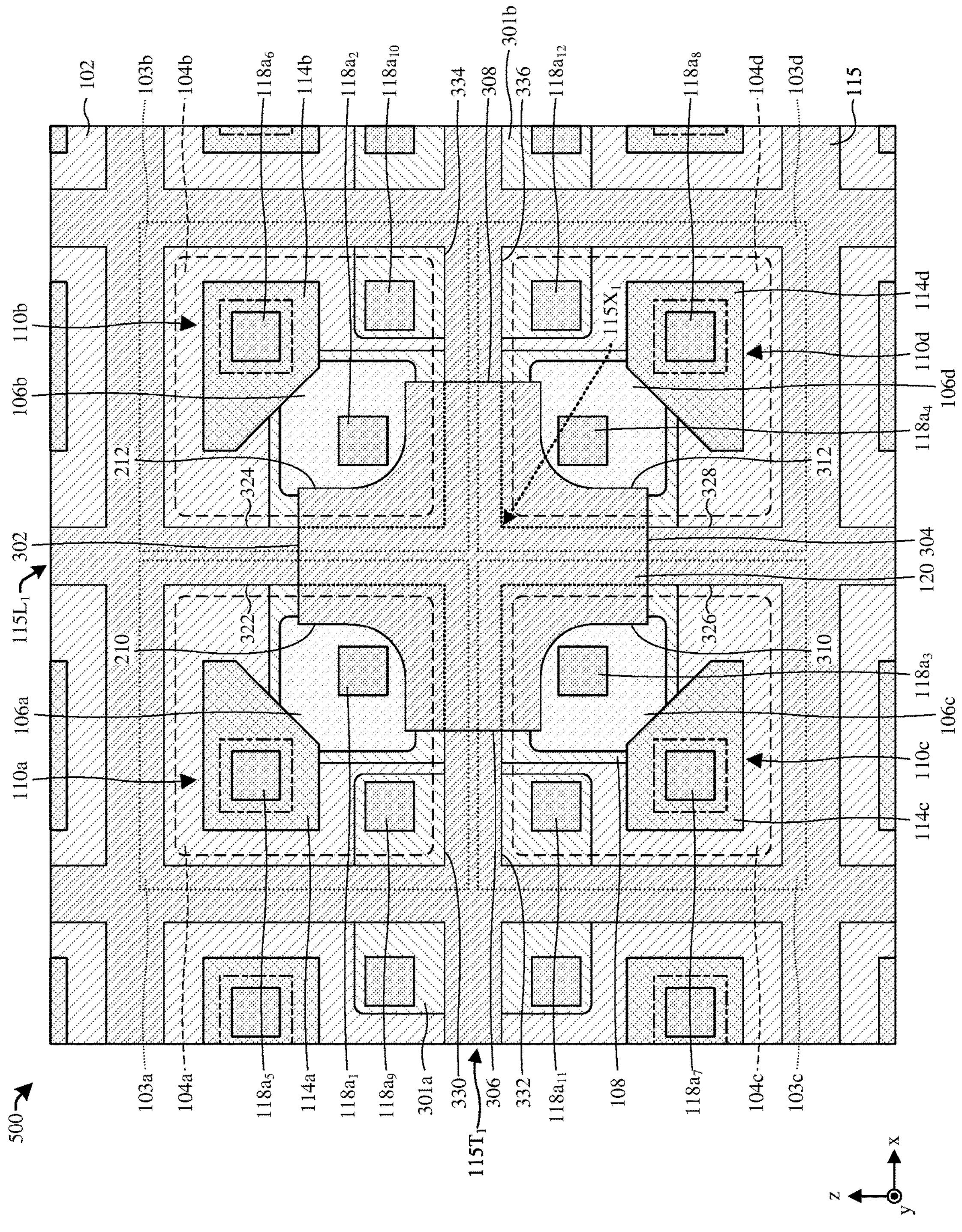
FIG. 5 illustrates a layout view of some other embodiments of an image sensor having a dielectric structure for small pixel designs.

FIG. 5 illustrates a layout view 500 of some other embodiments of an image sensor having a dielectric structure 120 for small pixel designs.

As shown in the layout view 500 of FIG. 5, the dielectric structure 120 may comprise the first sidewall 210, the second sidewall 212, the third sidewall 302, the fourth sidewall 304, the fifth sidewall 306, the sixth sidewall 308, the seventh sidewall 310, and the eighth sidewall 312.

In some embodiments, the first sidewall 210 may be curved (e.g., either fully or partially) and extend from the third sidewall 302 to the fifth sidewall 306. In further embodiments, the first sidewall 210 may curve around the first conductive contact 118$a_1$. In yet further embodiments, the curve of the first sidewall 210 may be concave.

In some embodiments, the second sidewall 212 may be curved (e.g., either fully or partially) and extend from the third sidewall 302 to the sixth sidewall 308. In further embodiments, the second sidewall 212 may curve around the second conductive contact 118$a_2$. In yet further embodiments, the curve of the second sidewall 212 may be concave.

In some embodiments, the seventh sidewall 310 may be curved (e.g., either fully or partially) and extend from the fourth sidewall 304 to the fifth sidewall 306. In further embodiments, the seventh sidewall 310 may curve around the third conductive contact 118$a_3$. In yet further embodiments, the curve of the seventh sidewall 310 may be concave.

In some embodiments, the eighth sidewall 312 may be curved (e.g., either fully or partially) and extend from the fourth sidewall 304 to the sixth sidewall 308. In further embodiments, the seventh sidewall 310 may curve around the fourth conductive contact 118$a_4$. In yet further embodiments, the curve of the eighth sidewall 312 may be concave.

Figure 6:
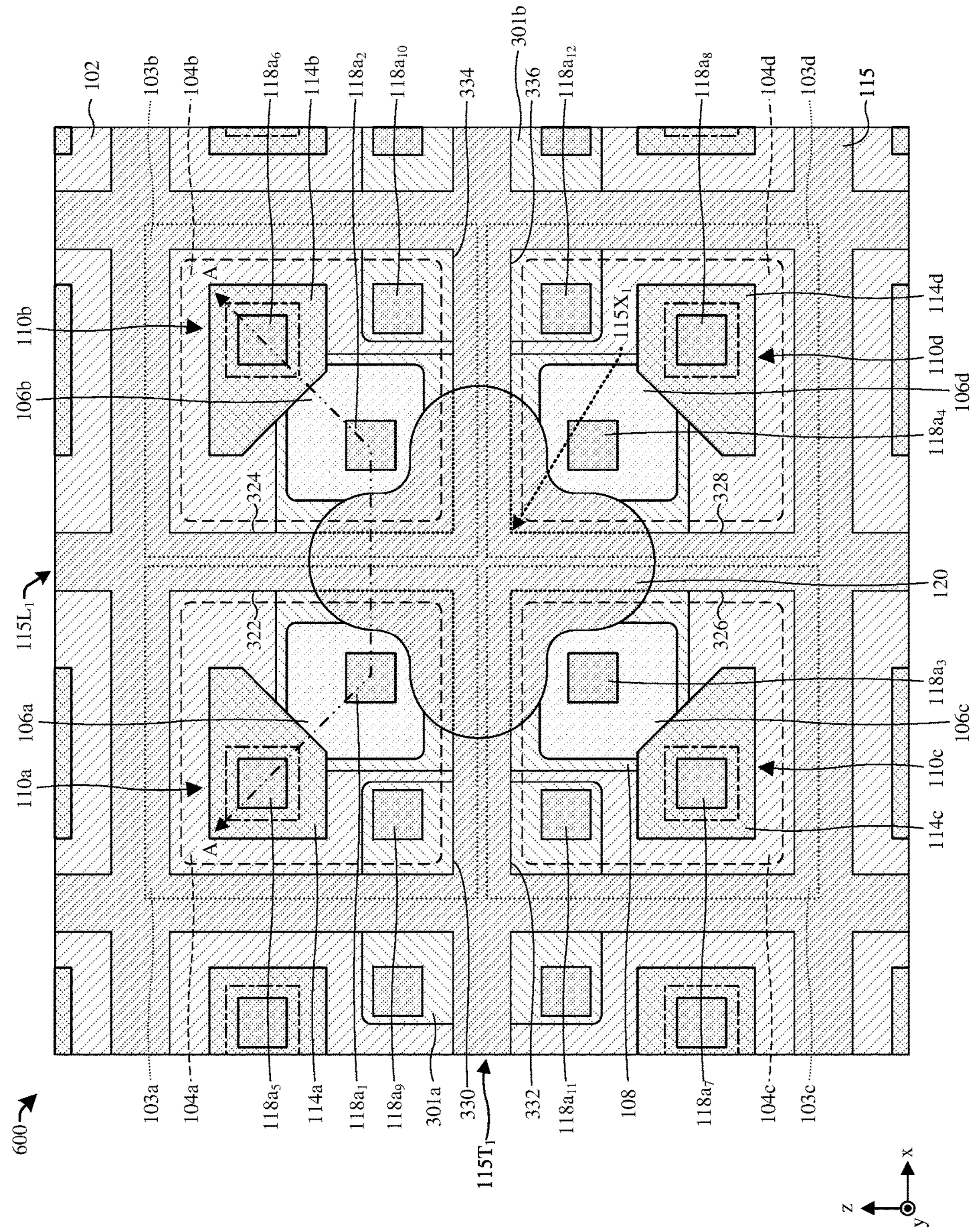
FIG. 6 illustrates a layout view of some other embodiments of an image sensor having a dielectric structure for small pixel designs.

FIG. 6 illustrates a layout view 600 of some other embodiments of an image sensor having a dielectric structure 120 for small pixel designs.

As shown in the layout view 600 of FIG. 6, in some embodiments, the dielectric structure 120 has a quatrefoil-like shape when viewed along a layout view. In other words, in some embodiments, the dielectric structure 120 has a quatrefoil-like shape when viewed from a top view.

Figure 7:
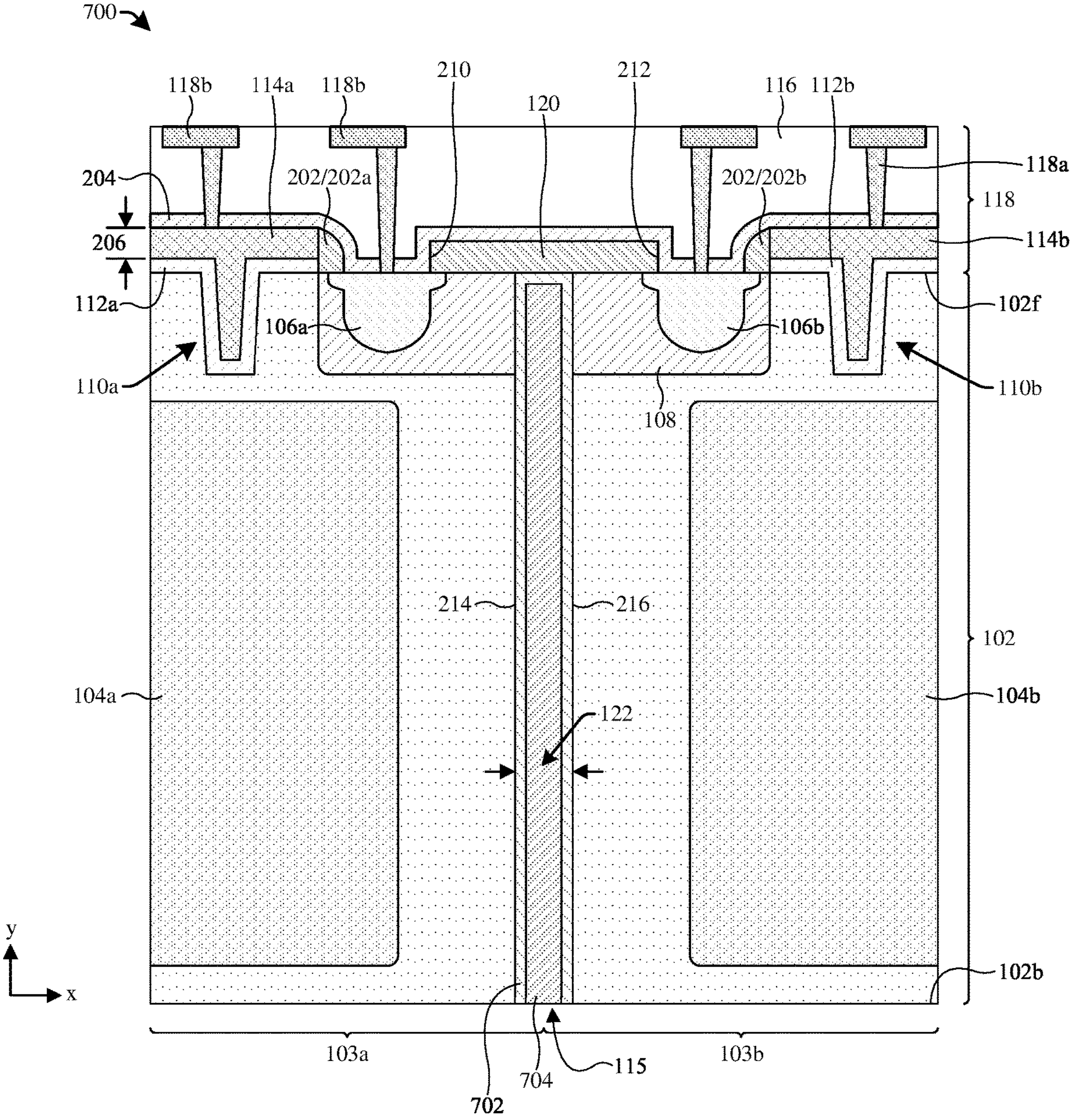
FIG. 7 illustrates a cross-sectional view of some other embodiments of an image sensor having a dielectric structure for small pixel designs.

FIG. 7 illustrates a cross-sectional view 700 of some other embodiments of an image sensor having a dielectric structure 120 for small pixel designs.

As shown in the cross-sectional view 700 of FIG. 7, in some embodiments, the DTI structure 115 comprises a dielectric liner structure 702 and a dielectric filler structure 704. The dielectric liner structure 702 lines the substrate 102 and lines surfaces (e.g., sidewalls and upper surfaces) of the dielectric filler structure 704. In some embodiments, the dielectric liner structure 702 contacts (e.g., directly contacts) the substrate 102. In some embodiments, the dielectric liner structure 702 contacts (e.g., directly contacts) the dielectric structure 120. In some embodiments, the dielectric liner structure 702 contacts (e.g., directly contacts) the doped well 108.

In embodiments in which the DTI structure 115 comprises the dielectric liner structure 702, an upper surface of the DTI structure 115 may be defined by an upper surface of the dielectric liner structure 702. In embodiments in which the DTI structure 115 comprises the dielectric liner structure 702, the first sidewall 214 of the DTI structure 115 may be defined by a first sidewall of the dielectric liner structure 702. In embodiments in which the DTI structure 115 comprises the dielectric liner structure 702, the second sidewall 216 of the DTI structure 115 may be defined by a second sidewall of the dielectric liner structure 702.

In some embodiments, the dielectric liner structure 702 may be or comprise, for example, a high-k dielectric material (e.g., HfO, TaO, HfSiO, HfTaO, AlO, ZrO, etc.), an oxide (e.g., $SiO_2$), a nitride (e.g., SiN), an oxy-nitride (e.g., SiON), a carbide (e.g., silicon carbide (SiC)), some other dielectric material, or a combination of the foregoing. In some embodiments, the dielectric filler structure 704 may be or comprise, for example, an oxide (e.g., $SiO_2$), a nitride (e.g., SiN), an oxy-nitride (e.g., SiON), tetraethoxysilane (TEOS), some other dielectric material, or a combination of the foregoing. In some embodiments, the dielectric filler structure 704 has a first chemical composition (e.g., TEOS), and the dielectric liner structure 702 has a second chemical composition different than the first chemical composition (e.g., a high-k dielectric material). In some embodiments, a lower surface of the dielectric liner structure 702 may be substantially co-planar with the back side **102*b* of the substrate 102. In some embodiments, a lower surface of the dielectric filler structure 704 may be substantially co-planar with the back side 102*b* of the substrate 102**.

Figure 8:
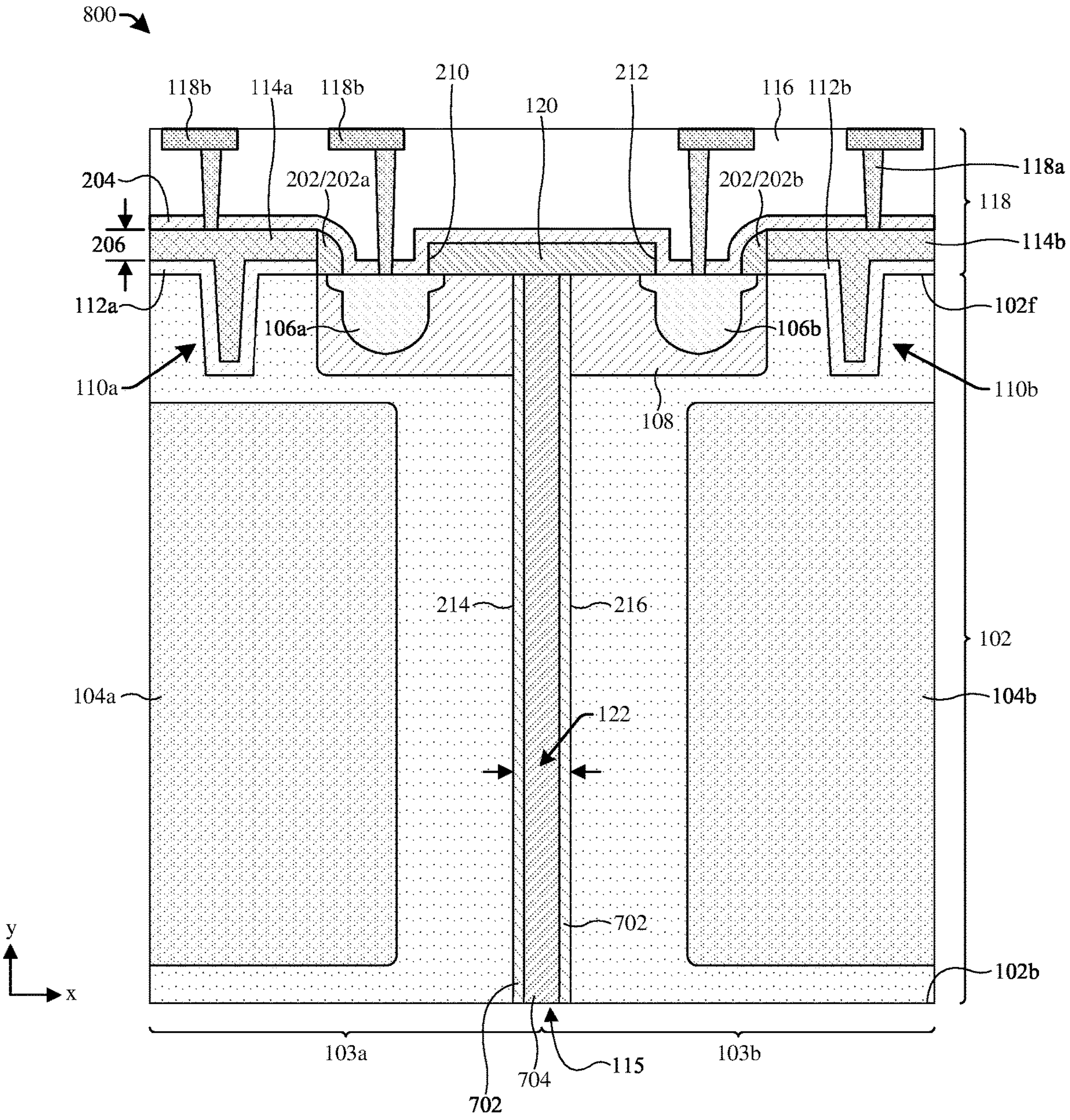
FIG. 8 illustrates a cross-sectional view of some other embodiments of an image sensor having a dielectric structure for small pixel designs.

FIG. 8 illustrates a cross-sectional view 800 of some other embodiments of an image sensor having a dielectric structure 120 for small pixel designs.

As shown in the cross-sectional view 800 of FIG. 8, in some embodiments, the dielectric liner structure 702 has an upper surface that is substantially co-planar with an upper surface of the dielectric filler structure 704. In further embodiments, the dielectric liner structure 702 may contact (e.g., directly contact) the dielectric structure 120. In further embodiments, the dielectric filler structure 704 may contact (e.g., directly contact) the dielectric structure 120.

Figure 9:
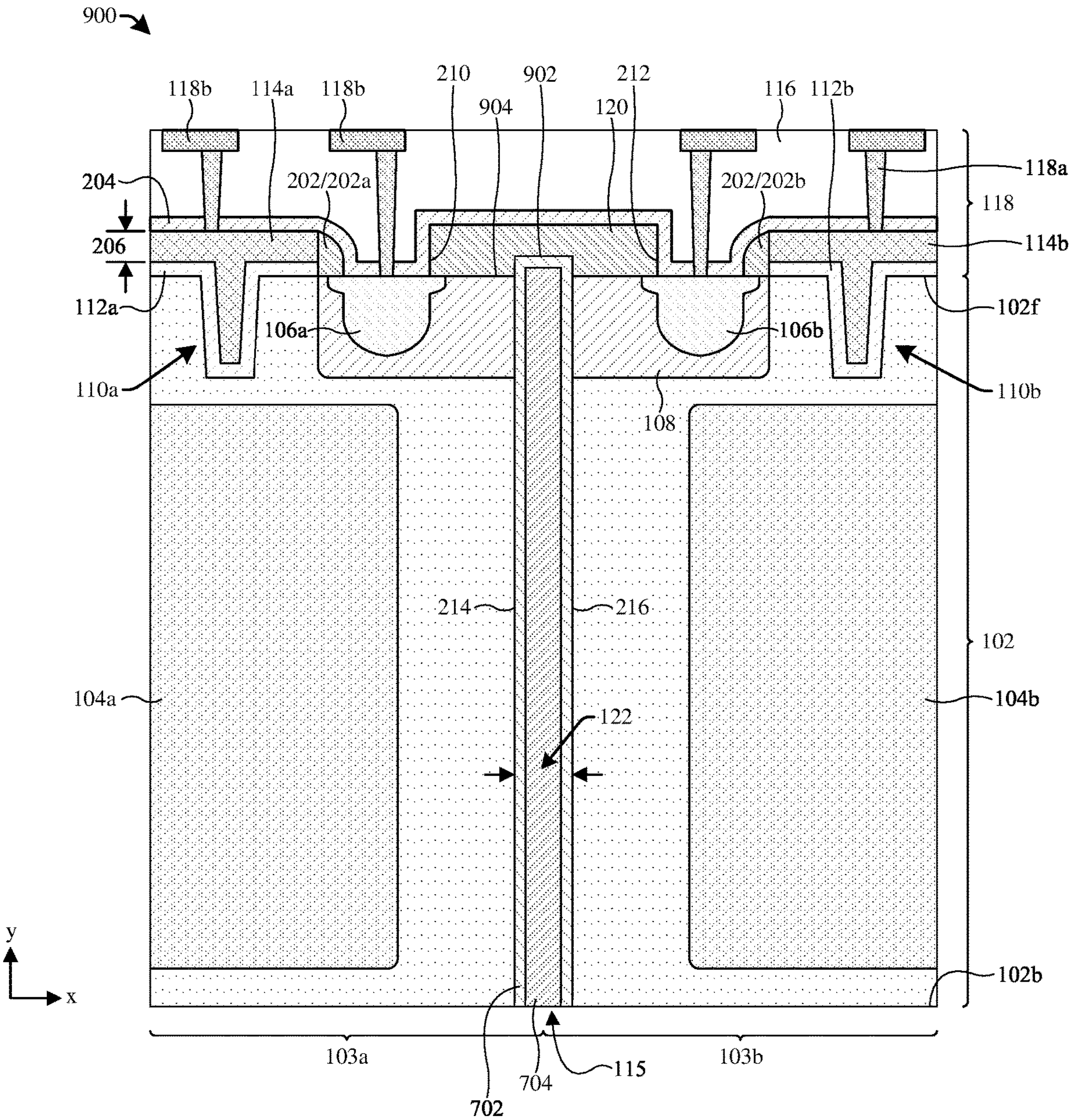
FIG. 9 illustrates a cross-sectional view of some other embodiments of an image sensor having a dielectric structure for small pixel designs.

FIG. 9 illustrates a cross-sectional view 900 of some other embodiments of an image sensor having a dielectric structure 120 for small pixel designs.

As shown in the cross-sectional view 900 of FIG. 9, the DTI structure 115 may extend vertically into the dielectric structure 120. In some embodiments, the DTI structure 115 may extend from the back side **102*b* of the substrate 102 to a first lower surface 902 of the dielectric structure 120. In further embodiments, the DTI structure 115 contacts (e.g., directly contacts) the first lower surface 902 of the dielectric structure 120. In some embodiments, the dielectric liner structure 702 contacts (e.g., directly contacts) the first lower surface 902 of the dielectric structure 120. In some embodiments, the dielectric filler structure 704 contacts (e.g., directly contacts) the first lower surface 902 of the dielectric structure 120. The dielectric structure 120 has a second lower surface 904 that is disposed between the first lower surface 902 and the front side 102*f* of the substrate 102. In some embodiments, the second lower surface 904 contacts (e.g., directly contacts) the front side 102*f* of the substrate 102**.

Figure 10:
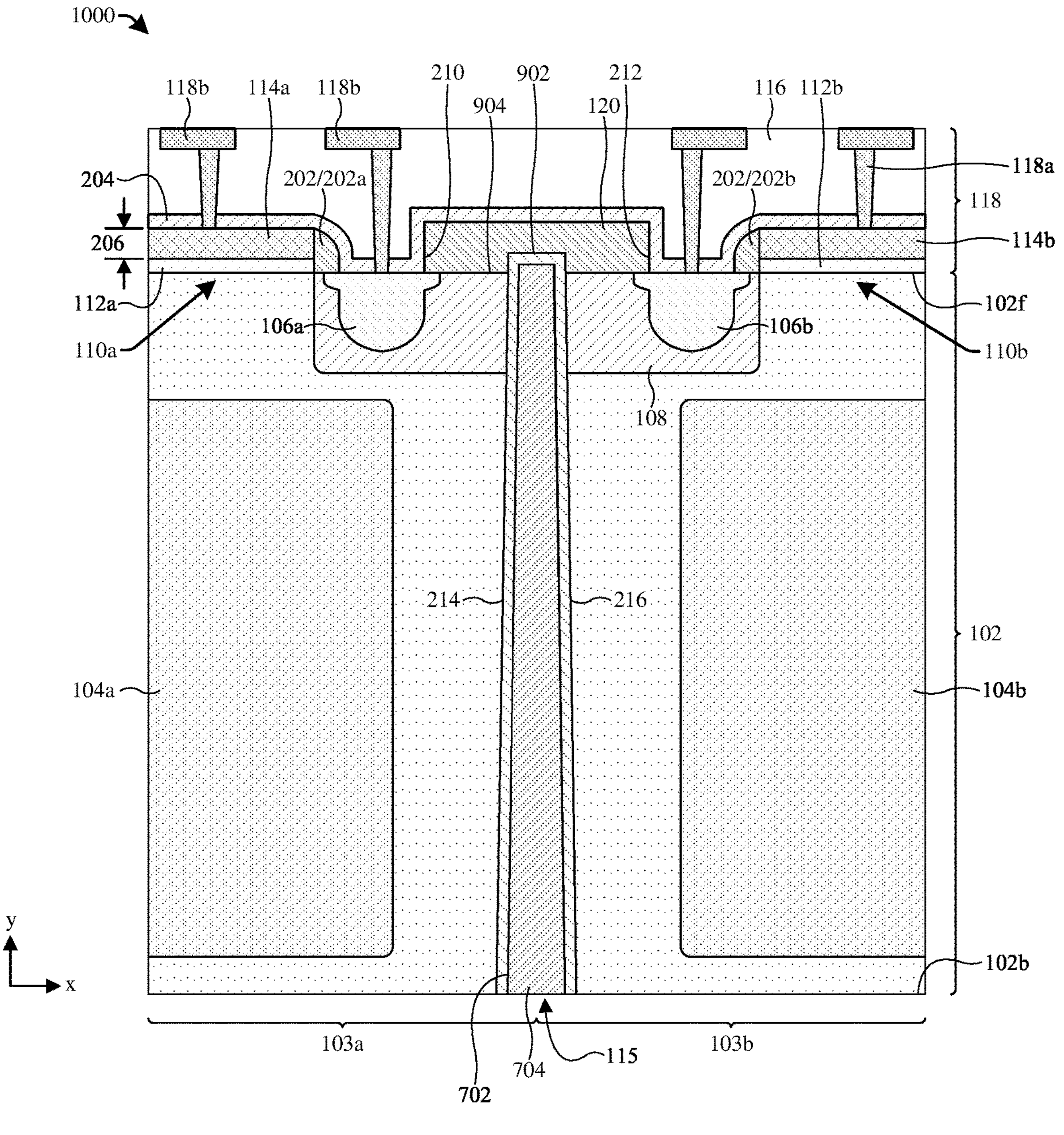
FIG. 10 illustrates a cross-sectional view of some other embodiments of an image sensor having a dielectric structure for small pixel designs.

FIG. 10 illustrates a cross-sectional view 1000 of some other embodiments of an image sensor having a dielectric structure 120 for small pixel designs.

As shown in the cross-sectional view 1000 of FIG. 10, the DTI structure 115 may have angled sidewalls. For example, in some embodiments, the first sidewall 214 and the second sidewall 216 may be angled. In some embodiments, the dielectric liner structure 702 may have angled sidewalls. In some embodiments, the dielectric filler structure 704 may have angled sidewalls. Also shown in the cross-sectional view 1000 of FIG. 10, the plurality of transfer gates 110 may not comprise lower portions that extend vertically into the substrate 102.

Figure 11:
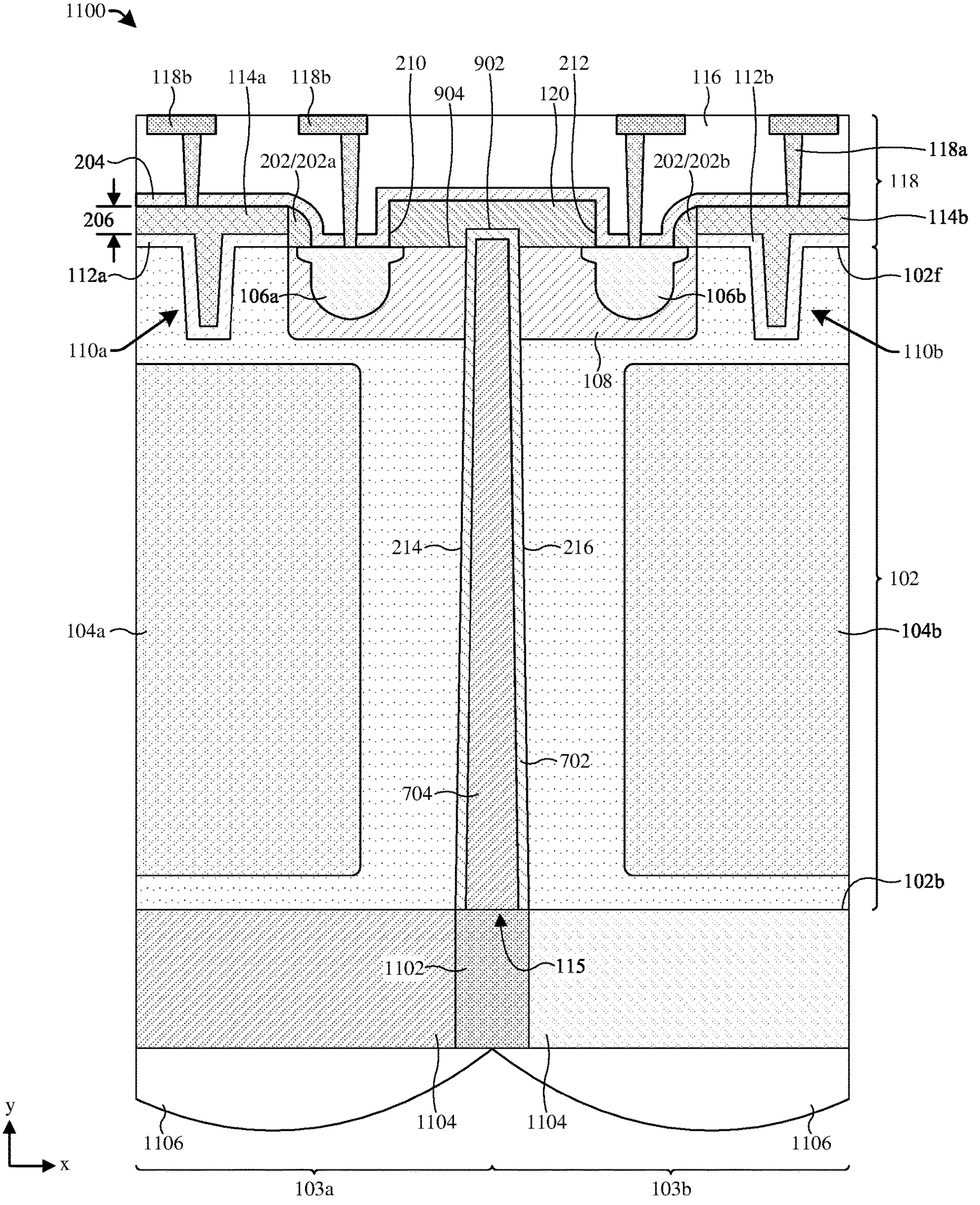
FIG. 11 illustrates a cross-sectional view of some other embodiments of an image sensor having a dielectric structure for small pixel designs.

FIG. 11 illustrates a cross-sectional view 1100 of some other embodiments of an image sensor having a dielectric structure 120 for small pixel designs.

As shown in the cross-sectional view 1100 of FIG. 11, the image sensor may comprise an isolation grid 1102 disposed along the back side **102*b* of the substrate 102. In some embodiments, the isolation grid 1102 is disposed along a lower surface of the DTI structure 115. The isolation grid 1102 may be or comprise, for example, a metal (e.g., tungsten (W), aluminum (Al), cobalt (Co), copper (Cu), silver (Ag), gold (Au), some other metal, or a combination of the foregoing), an oxide (e.g., SiO2), a nitride (e.g., SiN), a carbide (e.g., SiC), a high-k dielectric material (e.g., HfO, TaO, etc.), a low-k dielectric material, some other isolation material, or a combination of the foregoing. In further embodiments, the isolation grid 1102** may be a metal grid. In such embodiments, the metal grid comprises a metal material (e.g., tungsten (W)).

In some embodiments, an electromagnetic radiation (EMR) filter 1104 (e.g., color filter, infrared filter, etc.) is disposed along the back side **102*b* of the substrate 102 and within the isolation grid 1102. The EMR filter 1104 is configured to transmit specific wavelengths (or specific ranges of wavelengths) of incident radiation to corresponding photodetectors of the plurality of photodetectors 104. For example, the EMR filter 1104 may comprise a first portion substantially centered on the first pixel region 103*a* that is configured to transmit incident radiation having a first wavelength range to the first photodetector 104*a* (e.g., a red color filter); the EMR filter 1104 may comprise a second portion substantially centered on the second pixel region 103*b* that is configured to transmit incident radiation having a second wavelength range to the second photodetector 104*b* (e.g., a green color filter); and so forth. It will be appreciated that the EMR filter 1104 may be one EMR filter of a plurality of EMR filters disposed within the isolation grid 1102**.

In some embodiments, a plurality of micro-lenses 1106 are disposed along the EMR filter 1104. In some embodiments, the EMR filter 1104 vertically separates the plurality of micro-lenses 1106 from the back side **102*b* of the substrate 102. In some embodiments, the plurality of micro-lenses 1106 are substantially centered over the plurality of pixel regions 103, respectively. The plurality of micro-lenses 1106 are configured to focus the incident radiation towards the plurality of photodetectors 104**, respectively.

Figure 12:
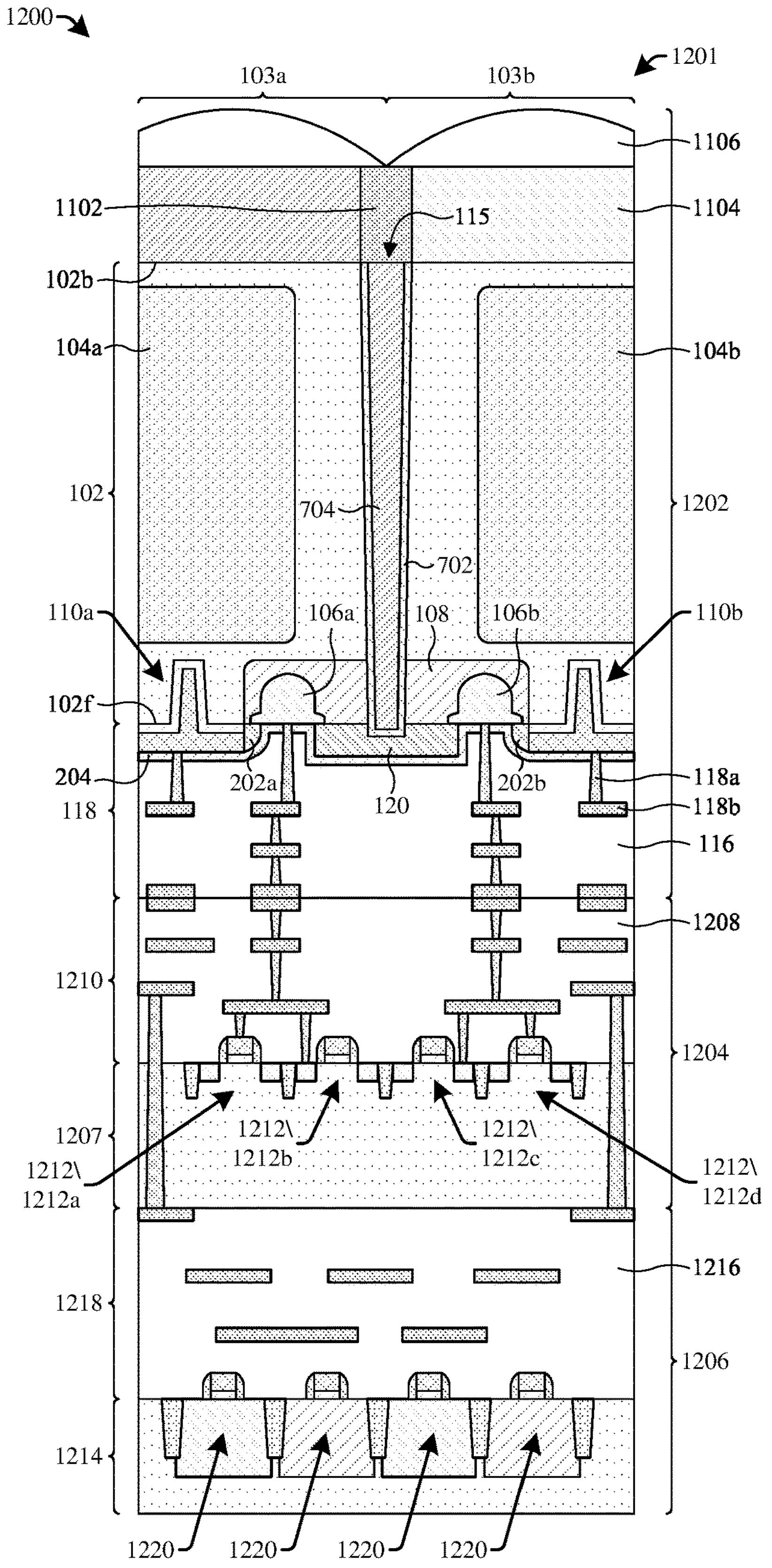
FIG. 12 illustrates a cross-sectional view of some embodiments of an integrated chip (IC) comprising some embodiments of the image sensor having the dielectric structure for small pixel designs.

FIG. 12 illustrates a cross-sectional view 1200 of some embodiments of an integrated chip (IC) 1201 comprising some embodiments of the image sensor having the dielectric structure 120 for small pixel designs.

As shown in the cross-sectional view 1200 of FIG. 12, the IC 1201 comprises a first chip 1202, a second chip 1204, and a third chip 1206. The first chip 1202 comprises the image sensor of the present disclosure. For example, the first chip 1202 comprises the plurality of pixel regions 103, the plurality of photodetectors 104, the plurality of floating diffusion nodes 106, the DTI structure 115, the dielectric structure 120, the EMR filter 1104, and so forth.

The second chip 1204 comprises a substrate 1207 (e.g., semiconductor substrate), an ILD structure 1208, a conductive interconnect structure 1210, and one more semiconductors devices 1212 (e.g., metal-oxide-semiconductor field-effect transistors (MOSFETs)). In some embodiments, the one more semiconductors devices 1212 comprises a first semiconductor device 1212*a*, a second semiconductor device 1212*b*, a third semiconductor device 1212*c*, and a fourth semiconductor device 1212*d*. In further embodiments, the first semiconductor device 1212*a* may be a first source follower transistor. In further embodiments, the second semiconductor device 1212*b* may be a first reset transistor. In further embodiments, the third semiconductor device 1212*c* may be a second reset transistor. In further embodiments, the fourth semiconductor device 1212*d* may be a second source follower transistor.

The third chip 1206 comprises a substrate 1214 (e.g., semiconductor substrate), an ILD structure 1216, a conductive interconnect structure 1218, and one more semiconductors devices 1220 (e.g., MOSFETs). In some embodiments, the third chip 1206 comprises an application-specific integrated circuit (ASIC).

The first chip 1202, the second chip 1204, and the third chip 1206 are bonded together (e.g., via one or more bonding structures). The first chip 1202, the second chip 1204, and the third chip 1206 are vertically stacked and electrically coupled together (e.g., via one or more conductive pads of their respective conductive interconnect structures). In such embodiments, the image sensor may be referred to as a three (3) chip image sensor (e.g., 3-chip CIS). While the cross-sectional view 1200 of FIG. 12 illustrates the IC 1201 comprising three (3) chips that are bonded together, it will be appreciated that the IC 1201 may comprise any number of chips bonded together (e.g., 2 chips, 3 chips, 4 chips, 5 chips, etc.). It will also be appreciated that, in some embodiments, the IC may only comprise the first chip 1202 (e.g., a 1-chip CIS).

FIGS. 13-27 illustrate a series of cross-sectional views 1300-2700 of some embodiments of a method for forming an image sensor having a dielectric structure 120 for small pixel designs.

Figure 13:
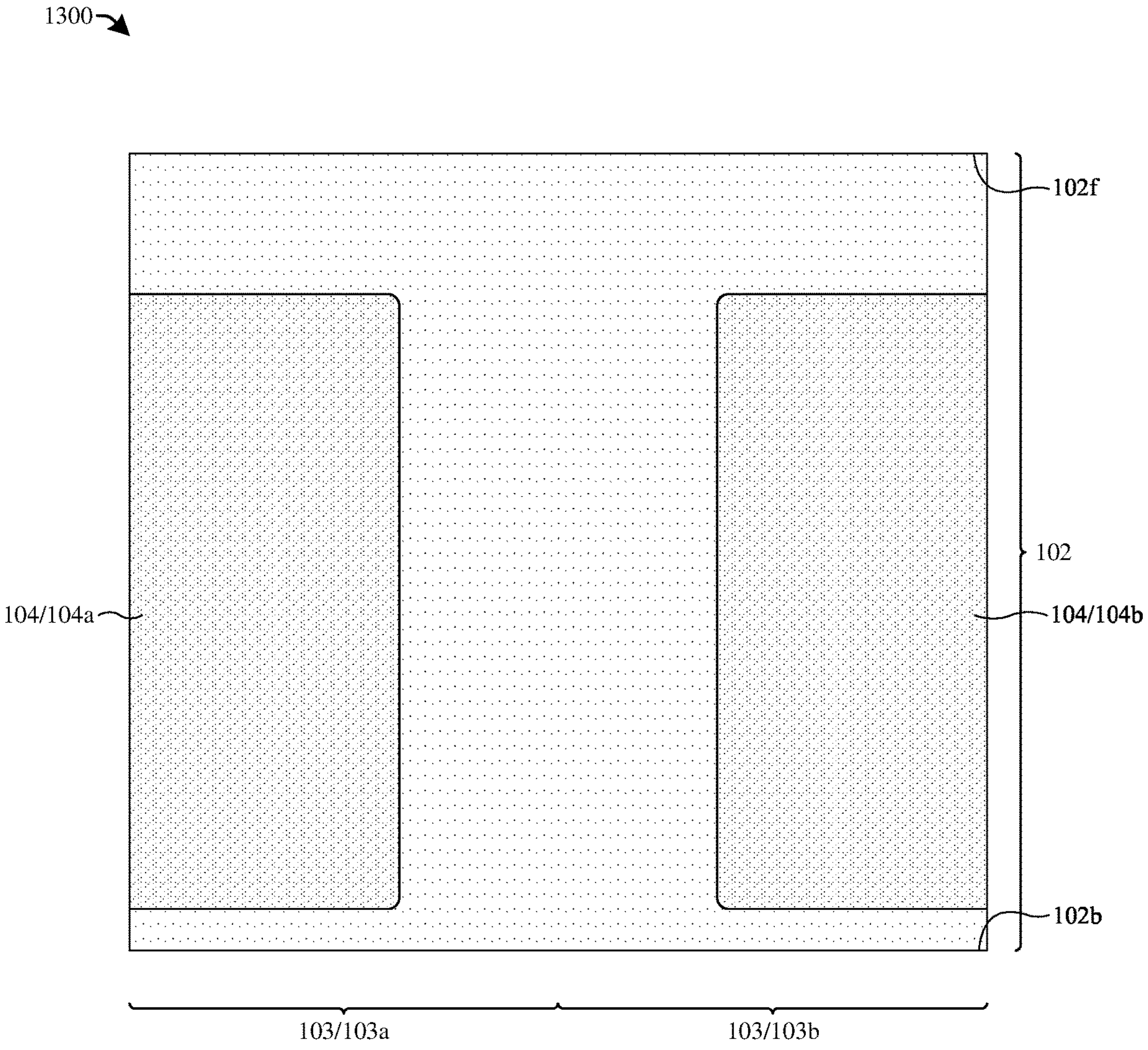
FIGS. 13-27 illustrate a series of cross-sectional views of some embodiments of a method for forming an image sensor having a dielectric structure for small pixel designs.

As shown in the cross-sectional view 1300 of FIG. 13, a plurality of photodetectors 104 are formed in a substrate 102. The plurality of photodetectors 104 are formed in a plurality of pixel regions 103, respectively. In some embodiments, the plurality of photodetectors 104 respectively comprise portions of the substrate 102 having a second doping type (e.g., n-type/p-type).

In some embodiments, a process for forming the plurality of photodetectors 104 comprises forming a patterned masking layer (not shown) (e.g., negative/positive photoresist, a hardmask, etc.) over the front side 102*f* of the substrate 102. In some embodiments, a process for forming the patterned masking layer comprises depositing a masking layer (not shown) on the front side 102*f* of the substrate 102. The masking layer may be deposited by, for example, chemical vapor deposition (CVD), physical vapor deposition (PVD), atomic layer deposition (ALD), a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer over the front side 102*f* of the substrate 102. With the patterned masking layer in place, a doping process (e.g., an ion implantation process, a diffusion process, etc.) is performed on the substrate 102 to selectively implant second doping type dopants (e.g., n-type dopants, such as phosphorus, arsenic, antimony, etc.) into the substrate 102 according to the patterned masking layer, thereby forming the plurality of photodetectors 104. Subsequently, in some embodiments, the patterned masking layer is stripped away.

Figure 14:
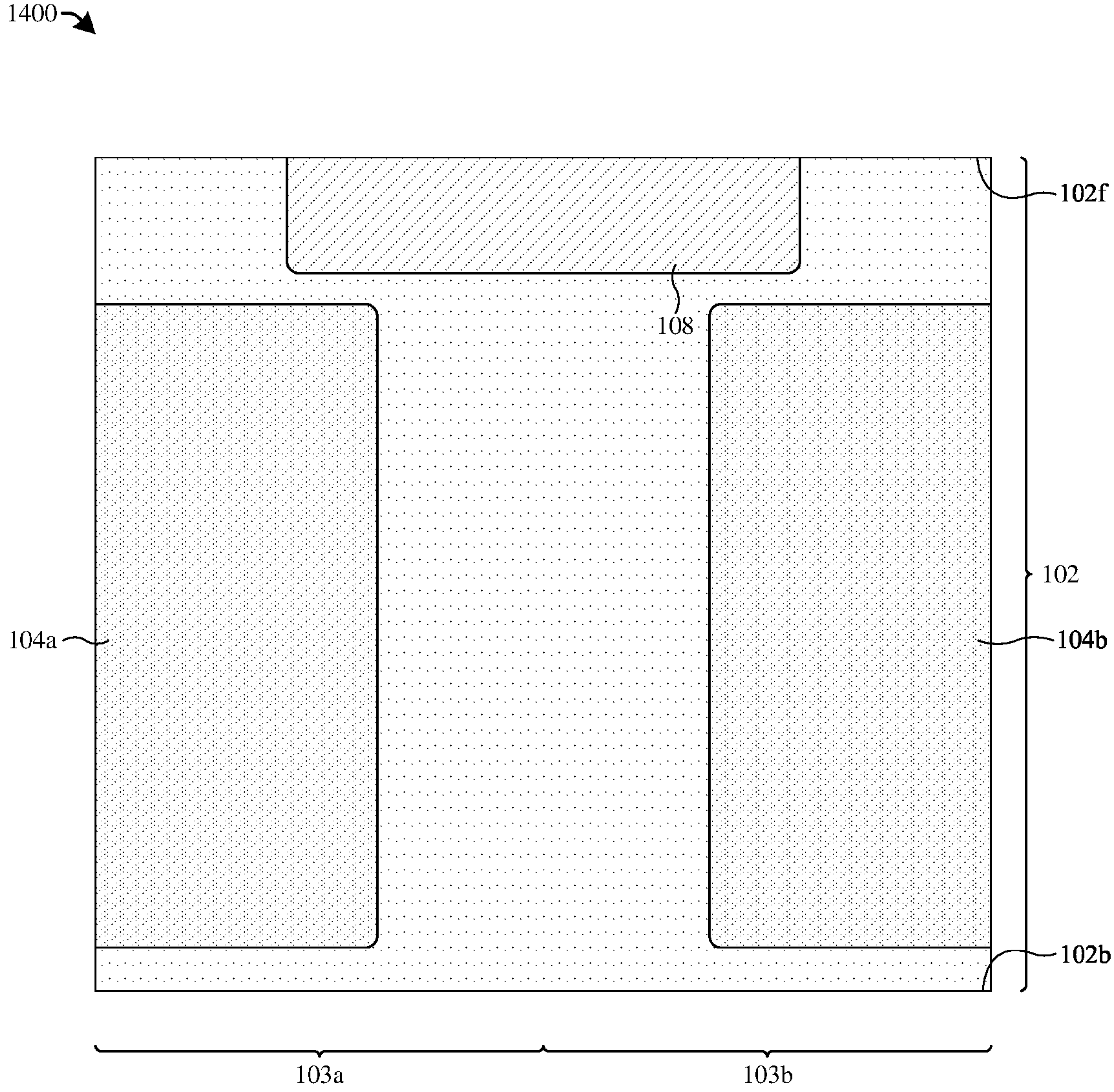

As shown in the cross-sectional view 1400 of FIG. 14, a doped well 108 is formed in the substrate 102. In some embodiments, the doped well 108 is formed in the plurality of pixel regions 103. In some embodiments, the doped well 108 is a portion of the substrate 102 having a first doping type (e.g., p-type/n-type).

In some embodiments, a process for forming the doped well 108 comprises forming a patterned masking layer (not shown) (e.g., negative/positive photoresist, a hardmask, etc.) over the front side 102*f* of the substrate 102. Thereafter, with the patterned masking layer in place, a doping process (e.g., an ion implantation process, a diffusion process, etc.) is performed on the substrate 102 to selectively implant first doping type dopants (e.g., p-type dopants, such as boron, aluminum, gallium, etc.) into the substrate 102 according to the patterned masking layer, thereby forming the doped well 108. Subsequently, in some embodiments, the patterned masking layer is stripped away.

Figure 15:
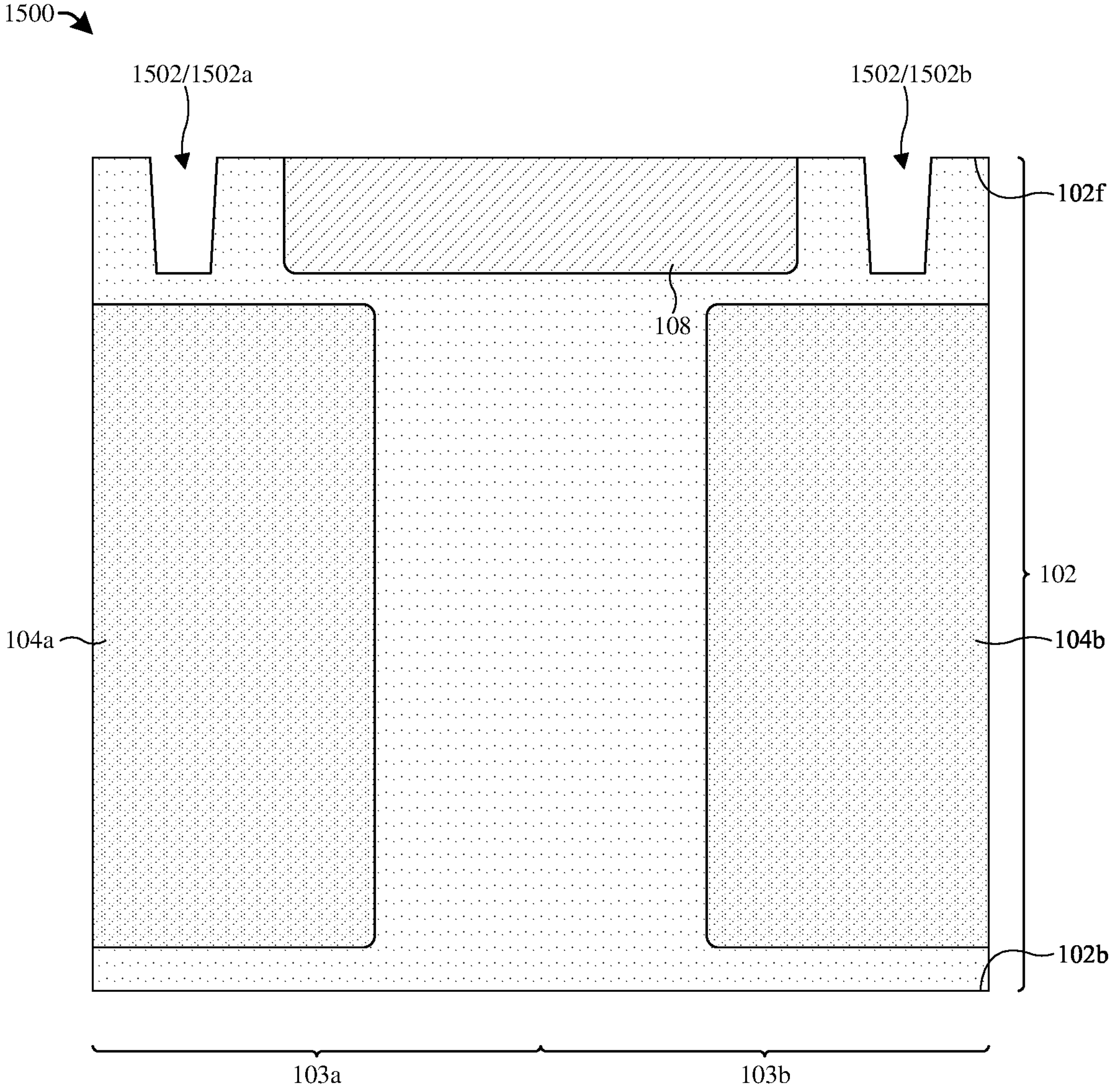

As shown in the cross-sectional view 1500 of FIG. 15, a plurality of vertical gate openings 1502 are formed in the substrate 102. The plurality of vertical gate openings 1502 are formed in the plurality of pixel regions 103, respectively. For example, a first vertical gate opening 1502*a* is formed in the first pixel region 103*a*; a second vertical gate opening 1502*b* is formed in the second pixel region 103*b*; and so forth. In some embodiments, the plurality of vertical gate openings 1502 are formed with angled sidewalls, as shown in the cross-sectional view 1500 of FIG. 15. In other embodiments, the plurality of vertical gate openings 1502 are formed with substantially straight sidewalls (e.g., substantially vertical sidewalls).

In some embodiments, a process for forming the plurality of vertical gate openings 1502 comprises forming a patterned masking layer (not shown) (e.g., negative/positive photoresist, a hardmask, etc.) over the front side 102*f* of the substrate 102. Thereafter, with the patterned masking layer in place, an etching process is performed on the substrate 102. The etching process removes unmasked portions of the substrate 102, thereby forming the plurality of vertical gate openings 1502 in the substrate 102. The etching process may be or comprise, for example, a wet etching process, a dry etching process, a reactive ion etching (RIE) process, some other etching process, or a combination of the foregoing. Subsequently, in some embodiments, the patterned masking layer is stripped away.

Figure 16:
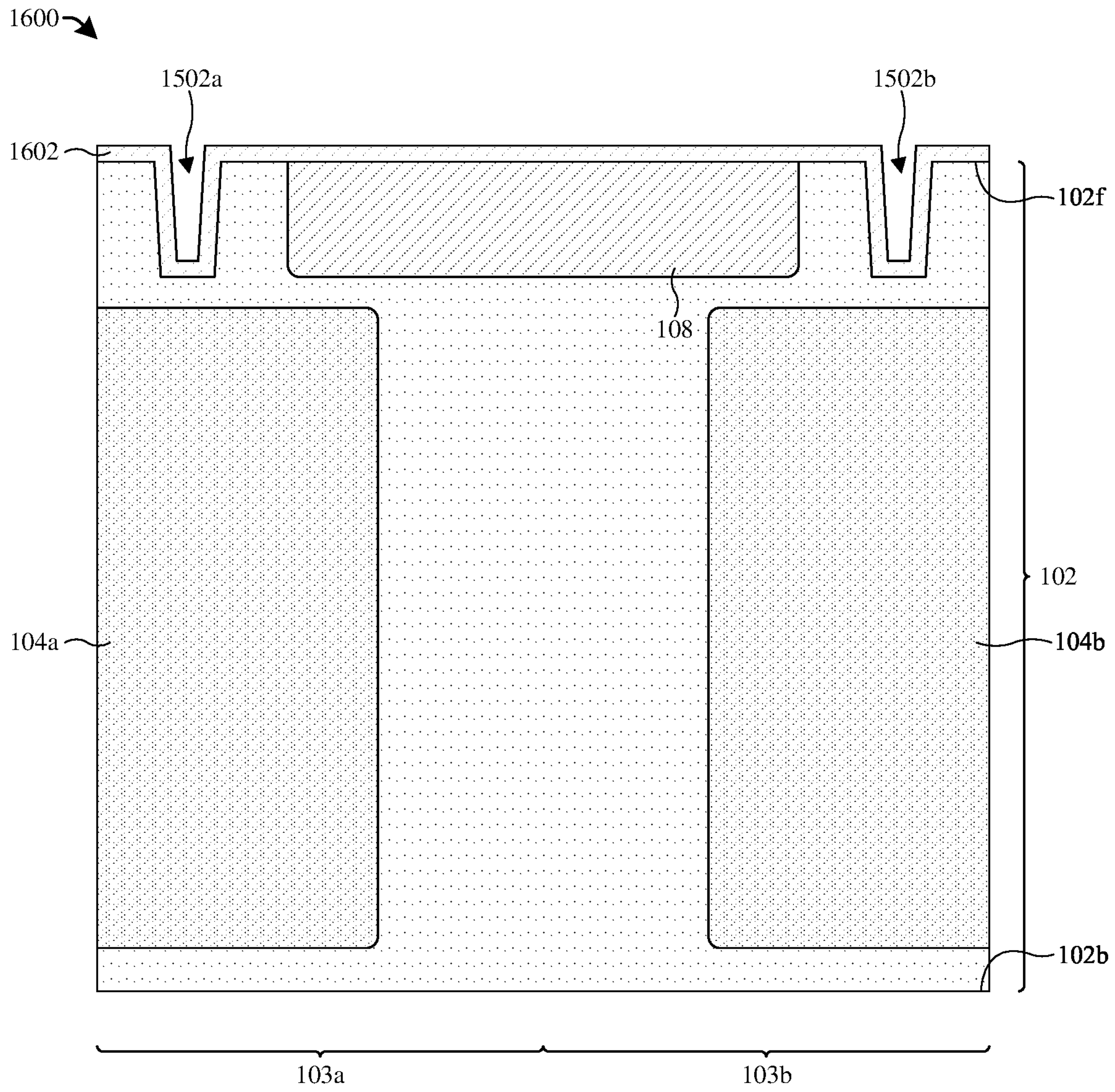

As shown in the cross-sectional view 1600 of FIG. 16, a gate dielectric layer 1602 is formed over/on the front side 102*f* of the substrate 102 and lining the plurality of vertical gate openings 1502. In some embodiments, the gate dielectric layer 1602 is or comprises, for example, an oxide (e.g., silicon dioxide ($SiO_2$)), a high-k dielectric material (e.g., hafnium oxide (HfO), tantalum oxide (TaO), hafnium silicon oxide (HfSiO), hafnium tantalum oxide (HfTaO), aluminum oxide (AlO), zirconium oxide (ZrO), some other dielectric material with a dielectric constant greater than about 3.9), some other dielectric material, or a combination of the foregoing. In some embodiments, a process for forming the gate dielectric layer 1602 comprises depositing or growing the gate dielectric layer 1602 on the front side **102*f* of the substrate 102 and surfaces of the plurality of vertical gate openings 1502. The gate dielectric layer 1602** may be deposited or grown by, for example, CVD, PVD, ALD, thermal oxidation, sputtering, some other deposition or growth process, or a combination of the foregoing.

Figure 17:
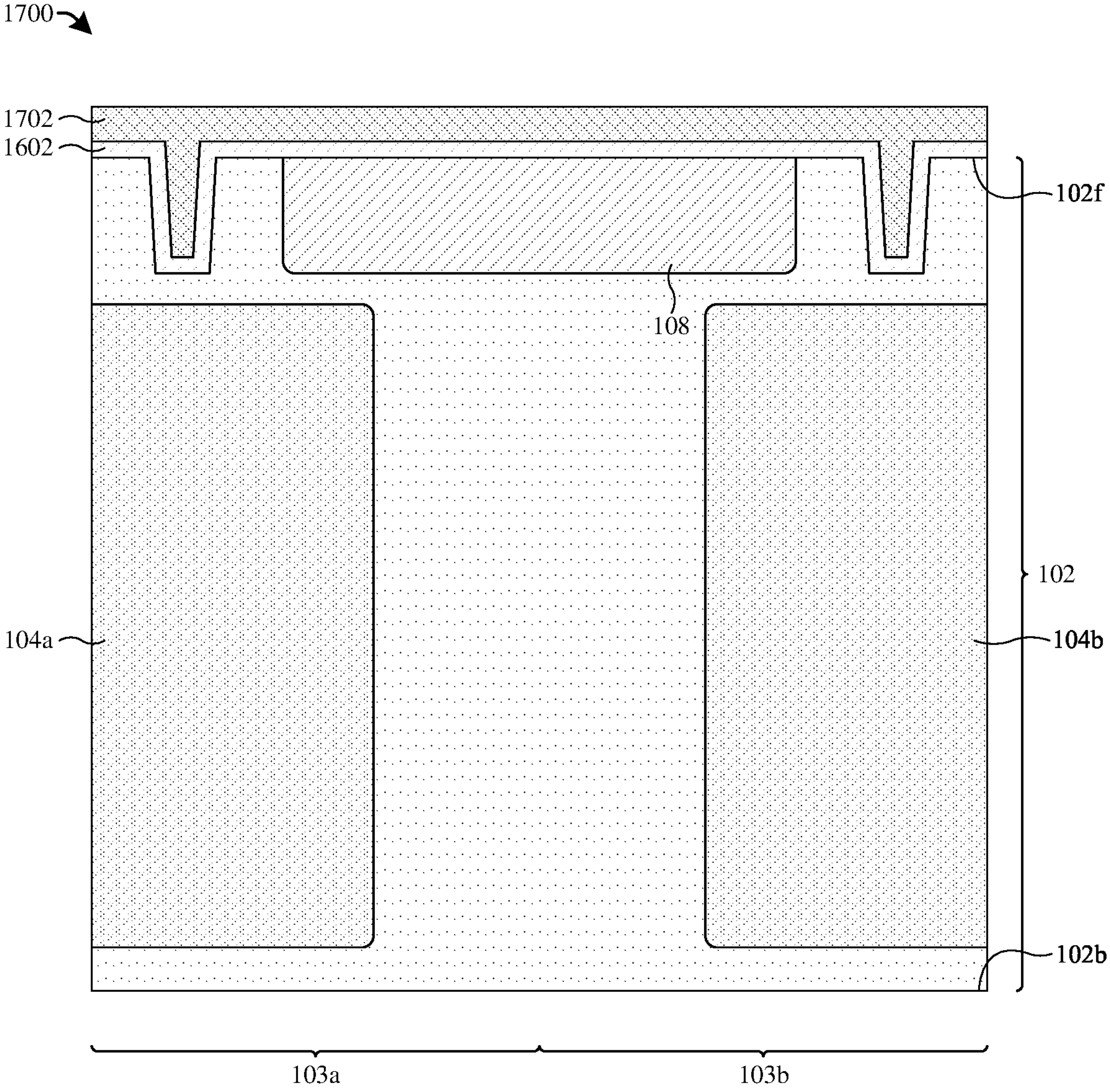

As shown in the cross-sectional view 1700 of FIG. 17, a gate electrode layer 1702 is formed over/on the gate dielectric layer 1602 and in the plurality of vertical gate openings 1502 (see, e.g., FIG. 16). In some embodiments, the gate electrode layer 1702 is or comprises, for example, polysilicon, a metal (e.g., aluminum (Al), copper (Cu), titanium (Ti), tantalum (Ta), tungsten (W), molybdenum (Mo), cobalt (Co), or the like), some other conductive material, or a combination of the foregoing. In some embodiments, a process for forming the gate electrode layer 1702 comprises depositing the gate electrode layer 1702 on the gate dielectric layer 1602 and in the plurality of vertical gate openings 1502. The gate electrode layer 1702 may be deposited by, for example, CVD, PVD, ALD, electrochemical plating, electroless plating, some other deposition process, or a combination of the foregoing.

Figure 18:
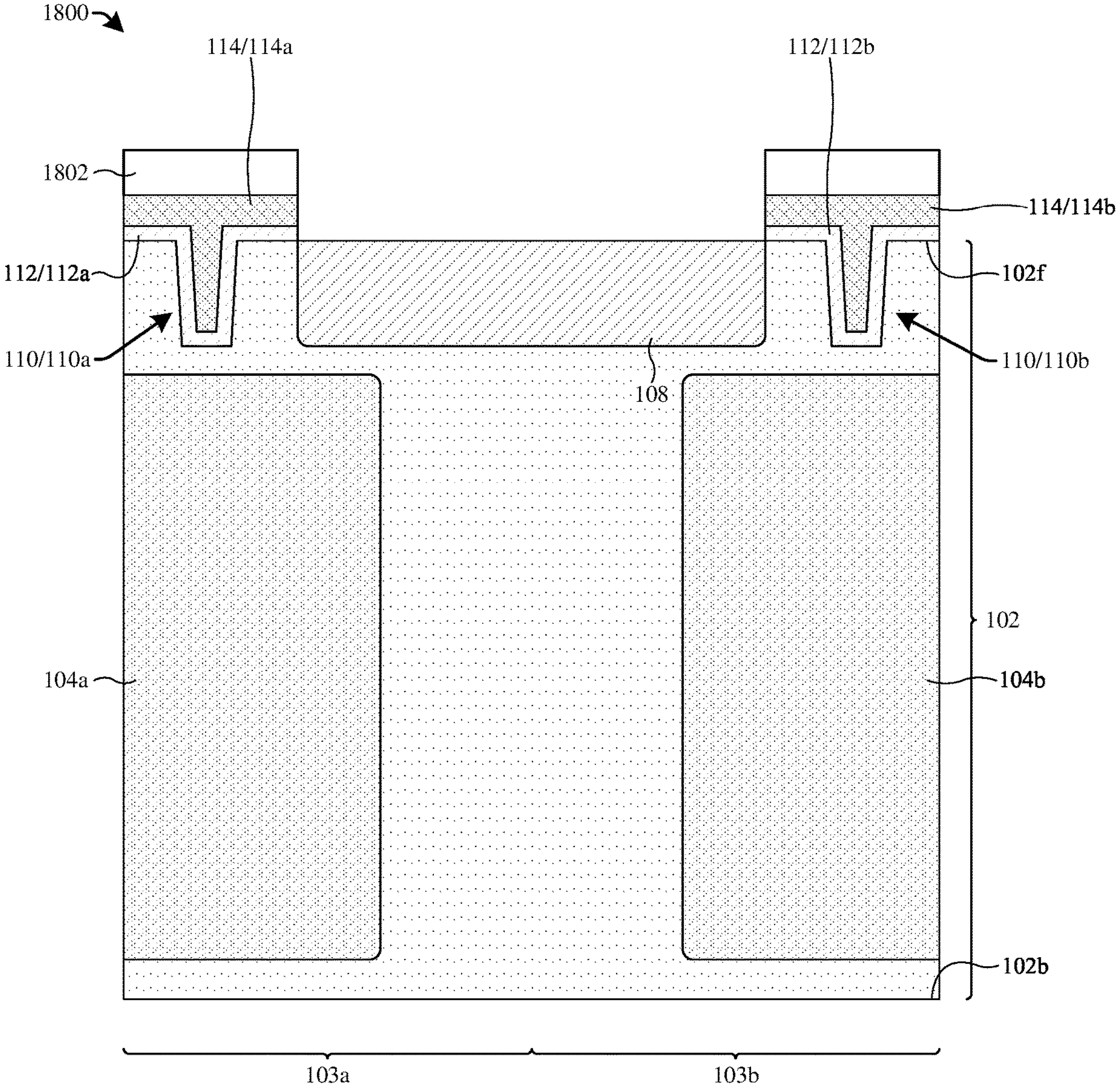

As shown in the cross-sectional view 1800 of FIG. 18, a plurality of transfer gates 110 are formed over/on the front side **102*f* of the substrate 102. The plurality of transfer gates 110 are formed overlying, at least partially, the plurality of pixel regions 103, respectively. The plurality of transfer gates 110 are formed with a plurality of gate dielectric structures 112, respectively. The plurality of transfer gates 110 are formed with a plurality of gate electrode structures 114, respectively. For example, a first transfer gate 110*a* is formed overlying the first pixel region 103*a*. The first transfer gate 110*a* is formed with a first gate electrode structure 114*a* overlying a first gate dielectric structure 112*a*. A second transfer gate 110*b* is formed overlying the second pixel region 103*b*. The second transfer gate 110*b* is formed with a second gate electrode structure 114*b* overlying a second gate dielectric structure 112*b***.

In some embodiments, a process for forming the plurality of transfer gates comprises forming a patterned masking layer 1802 (e.g., negative/positive photoresist, a hardmask, etc.) over the gate electrode layer 1702 (see, e.g., FIG. 18). In some embodiments, a process for forming the patterned masking layer 1802 comprises depositing a masking layer (not shown) on the gate electrode layer 1702. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 1802 over the gate electrode layer 1702.

With the patterned masking layer 1802 in place, an etching process is performed on the gate electrode layer 1702 and the gate dielectric layer 1602 (see, e.g., FIG. 17). The etching process removes unmasked portions of the gate electrode layer 1702, thereby forming the plurality of gate electrode structures 114. The etching process also removes unmasked portions of the gate dielectric layer 1602, thereby forming the plurality of gate dielectric structures 112. In some embodiments, the etching process may be or comprise, for example, a wet etching process, a dry etching process, a RIE process, some other etching process, or a combination of the foregoing. Subsequently, in some embodiments, the patterned masking layer 1802 is stripped away.

Figure 19:
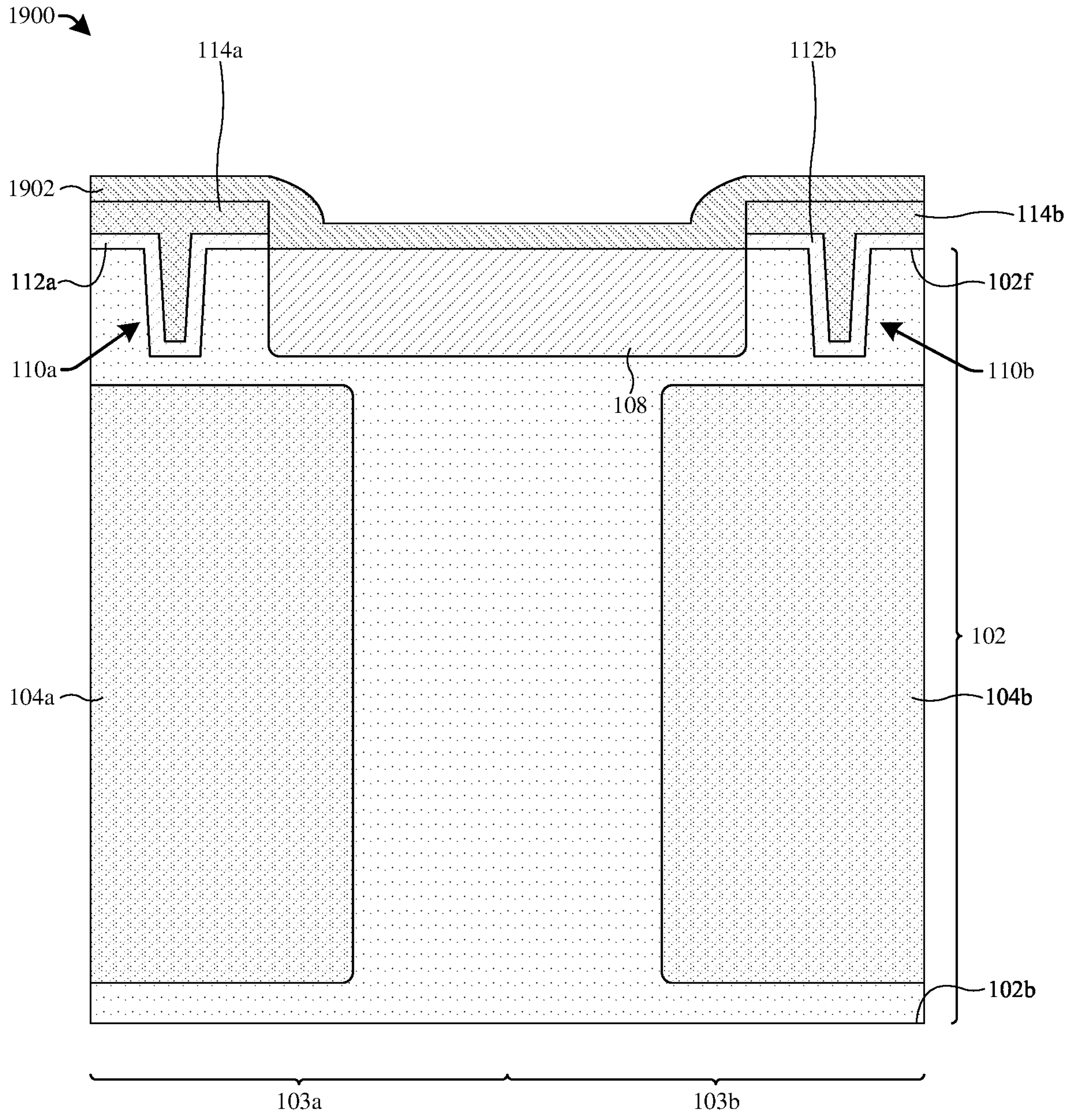

As shown in the cross-sectional view 1900 of FIG. 19, a dielectric layer 1902 is formed over/on the substrate 102 and over/on the plurality of transfer gates 110. In some embodiments, the dielectric layer 1902 is formed lining surfaces of the plurality of transfer gates 110 (e.g., upper surfaces of the plurality of gate electrodes structures 114, sidewalls of the plurality of gate electrode structures 114, sidewalls of the plurality of gate dielectric structures 112). In further embodiments, the dielectric layer 1902 is formed lining the front side **102*f* of the substrate 102**.

In some embodiments, the dielectric layer 1902 may be or comprise, for example, a nitride (e.g., SiN), an oxy-nitride (e.g., $SiO_XN_Y$), an oxide (e.g., $SiO_2$), a carbide (e.g., silicon carbide (SiC)), some other dielectric material, or a combination of the foregoing (e.g., oxide-nitride-oxide multilayer structure). In further embodiments, the dielectric layer 1902 may be or comprise silicon nitride (SiN). In some embodiments, the dielectric layer 1902 may be formed with a thickness (see, e.g., thickness 208) between about 150 Å and about 950 Å. In further embodiments, the dielectric layer 1902 may be formed with a thickness between about 400 Å and about 520 Å. In some embodiments, the dielectric layer 1902 may be formed with a thickness that is less than a thickness of the plurality of gate electrode structures 114 (see, e.g., the thickness 206). In further embodiments, the dielectric layer 1902 may be formed with a thickness that is between about 50% and about 65% of the thickness of the plurality of gate electrode structures 114.

In some embodiments, a process for forming the dielectric layer 1902 comprises depositing or growing the dielectric layer 1902 on the substrate 102 and on the plurality of transfer gates 110. In further embodiments, the dielectric layer 1902 may be deposited or grown by, for example, CVD, PVD, ALD, sputtering, thermal oxidation, some other deposition or growth process, or a combination of the foregoing. In some embodiments, the dielectric layer 1902 may be formed as a conformal layer.

Figure 20:
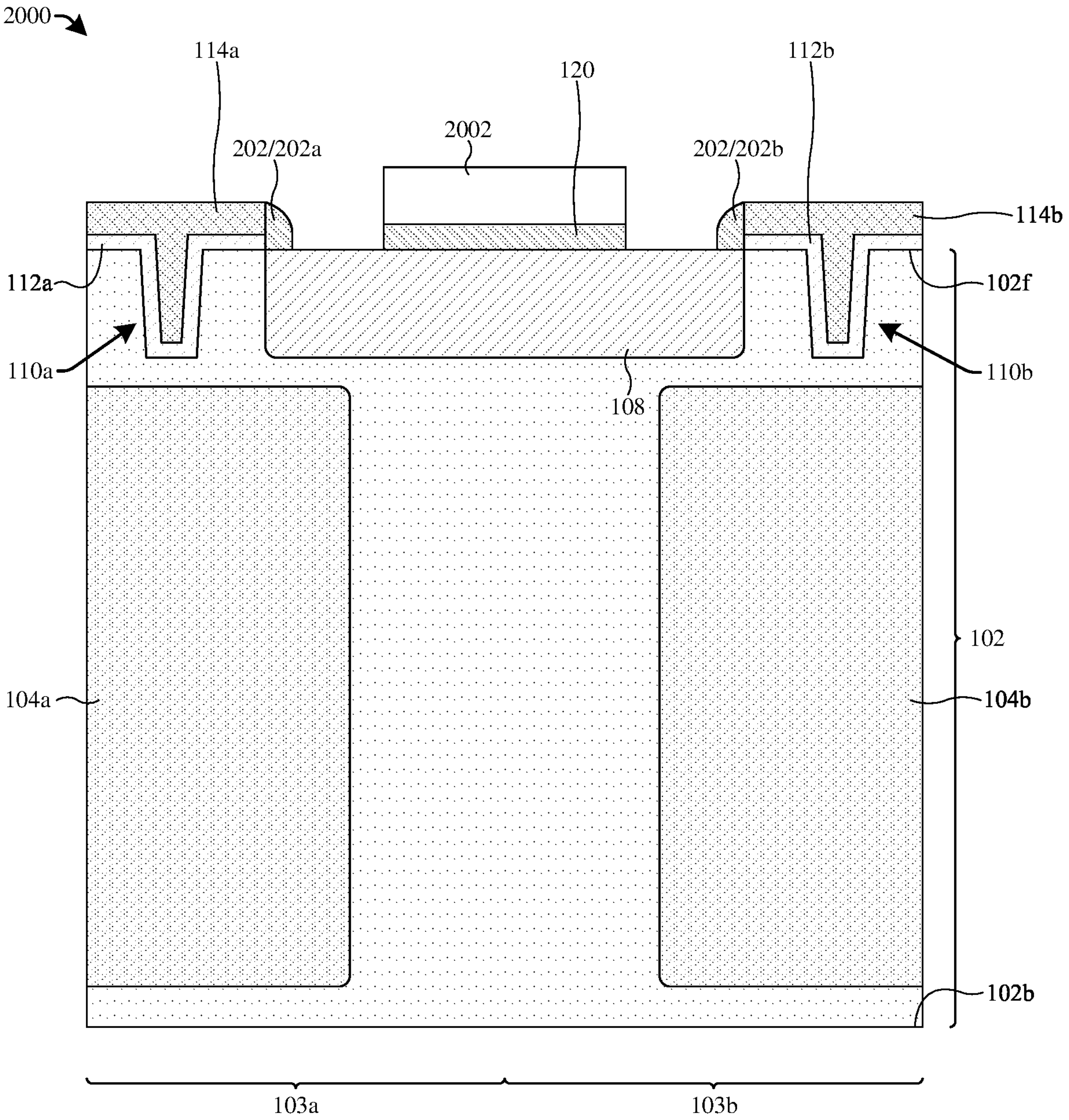

As shown in the cross-sectional view 2000 of FIG. 20, a plurality of sidewall spacers 202 are formed over the substrate and along sidewalls of the plurality of transfer gates 110. For example, a first sidewall spacer **202*a* is formed over the substrate 102 and along sidewalls of the first transfer gate 110*a*; a second sidewall spacer 202*b* is formed over the substrate 102 and along sidewalls of the second transfer gate 110*b*; and so forth. In some embodiments, the plurality of sidewall spacers 202 are formed along sidewalls of the plurality of gate electrode structures 114. In some embodiments, the plurality of sidewall spacers 202 are formed along sidewalls of the plurality of gate dielectric structures 112**.

Also shown in the cross-sectional view 2000 of FIG. 20, a dielectric structure 120 is formed over the substrate 102. The dielectric structure 120 is formed laterally spaced from the plurality of sidewall spacers 202. The dielectric structure 120 is formed overlying, at least partially, the plurality of pixel regions 103. In further embodiments, the dielectric structure 120 is formed overlying, at least partially, the doped well 108. In yet further embodiments, the dielectric structure 120 is formed with a cross-like shape when viewed along a layout view.

In some embodiments, a process for forming the plurality of sidewall spacers 202 and the dielectric structure 120 comprises forming a patterned masking layer 2002 (e.g., negative/positive photoresist, a hardmask, etc.) over the dielectric layer 1902 (see, e.g., FIG. 19). In some embodiments, a process for forming the patterned masking layer 2002 comprises depositing a masking layer (not shown) on the dielectric layer 1902. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer 2002 over the dielectric layer 1902.

With the patterned masking layer 2002 in place, an etching process is performed on the dielectric layer 1902. The etching process removes unmasked horizontal portions of dielectric layer 1902, thereby leaving masked portions of the dielectric layer 1902 in place as the dielectric structure 120 and vertical portions of the dielectric layer 1902 in place as the plurality of sidewall spacers 202. In some embodiments, the etching process may be or comprise, for example, a wet etching process, a dry etching process, a RIE process, some other etching process, or a combination of the foregoing. Subsequently, in some embodiments, the patterned masking layer 2002 is stripped away. In some embodiments, because the plurality of sidewall spacers 202 and the dielectric structure 120 are formed by etching the dielectric layer 1902 (e.g., by a same etching process), a cost to fabricate the image sensor of the present disclosure may be less than a cost to fabricate a typical image sensor (e.g., additional materials and/or fabrication tools may not be needed to form the dielectric structure 120).

Figure 21:
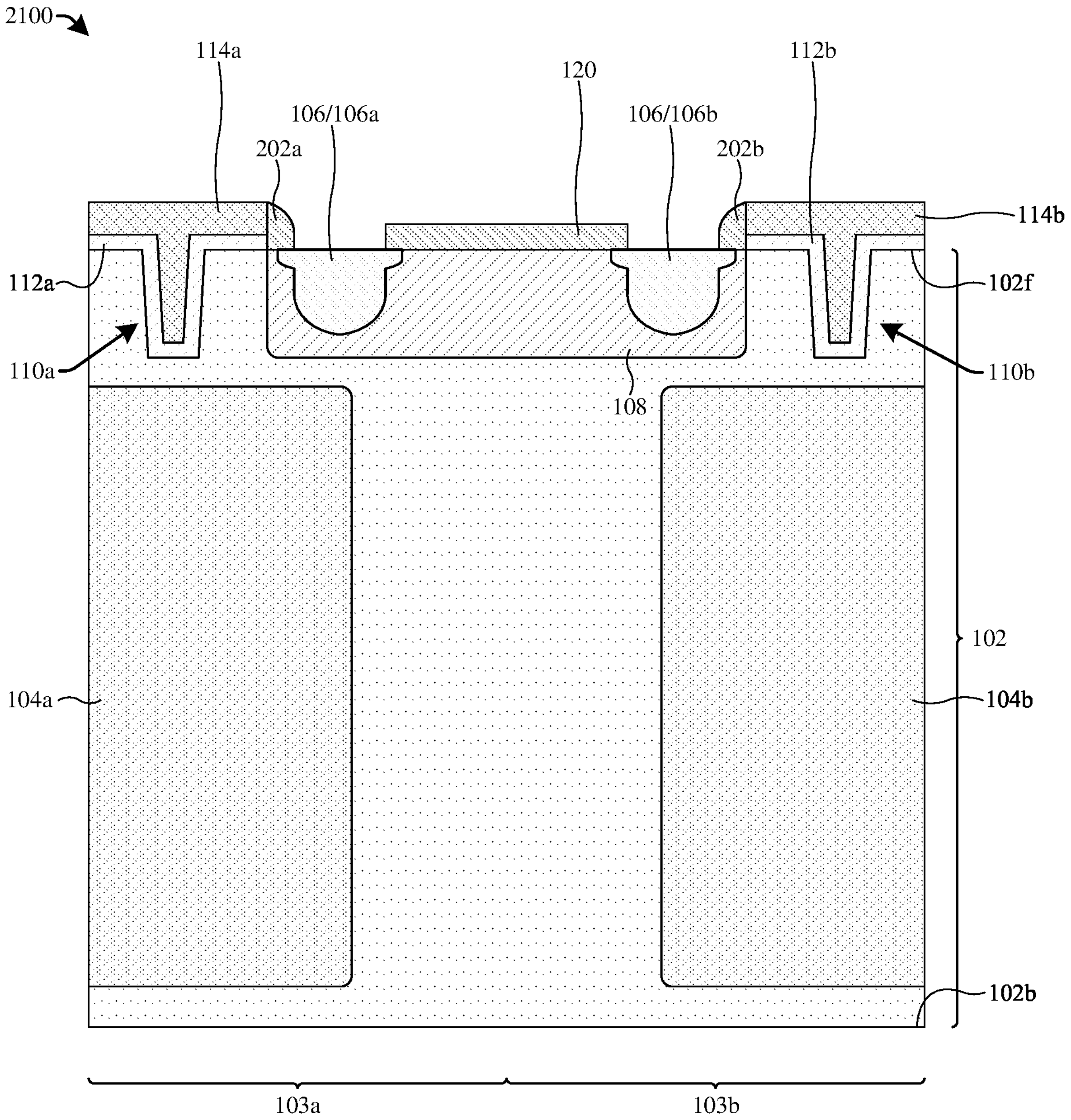

As shown in the cross-sectional view 2100 of FIG. 21, a plurality of floating diffusion nodes 106 are formed in the substrate 102. The plurality of floating diffusion nodes 106 are regions of the substrate 102 having the second doping type. The plurality of floating diffusion nodes 106 are formed in the plurality of pixel regions 103, respectively. For example, a first floating diffusion node 106*a* is formed in the first pixel region 103*a*; a second floating diffusion node 106*b* is formed in the second pixel region 103*b*; and so forth. In some embodiments, the plurality of floating diffusion nodes 106 are formed in the doped well 108. The plurality of floating diffusion nodes 106 are formed so that portions of the dielectric structure 120 are disposed laterally between neighboring floating diffusion nodes.

The first floating diffusion node 106*a* is formed laterally between the first transfer gate 110*a* and the dielectric structure 120. In some embodiments, the first floating diffusion node 106*a* is formed laterally between the first sidewall spacer 202*a* and the dielectric structure 120. The second floating diffusion node 106*b* is formed laterally between the second transfer gate 110*b* and the dielectric structure 120. In some embodiments, the second floating diffusion node 106*b* is formed laterally between the second sidewall spacer 202*b* and the dielectric structure 120.

The plurality of floating diffusion nodes 106 are formed via a doping process that utilizes the dielectric structure 120 as a masking structure to selectively implant second doping type dopants into the substrate 102. In some embodiments, the doping process may be, for example, an ion implantation process, an angled ion implantation process, a diffusion process, some other doping process, or a combination of the foregoing. In some embodiments, the doping process also utilizes the plurality of sidewall spacers 202 and/or the transfer gates 110 as masking structures. In further embodiments, the doping process may also utilize a patterned masking layer (in combination with the dielectric structure 120) (not shown) (e.g., positive/negative photoresist, a hardmask, etc.) over the front side 102*f* of the substrate 102 (and over the plurality of transfer gates 110) to selectively implant the second doping type dopants into the substrate 102. Subsequently, in such embodiments, the patterned masking layer may be stripped away.

By utilizing the dielectric structure 120 as a masking structure during the doping process, the locations in which the plurality of floating diffusion nodes 106 are formed may be more precisely controlled. For example, by utilizing the dielectric structure 120 as a masking structure during the doping process, a lateral spacing between the first floating diffusion node 106*a* and the second floating diffusion node 106*b* may be more precisely controlled.

Figure 22:
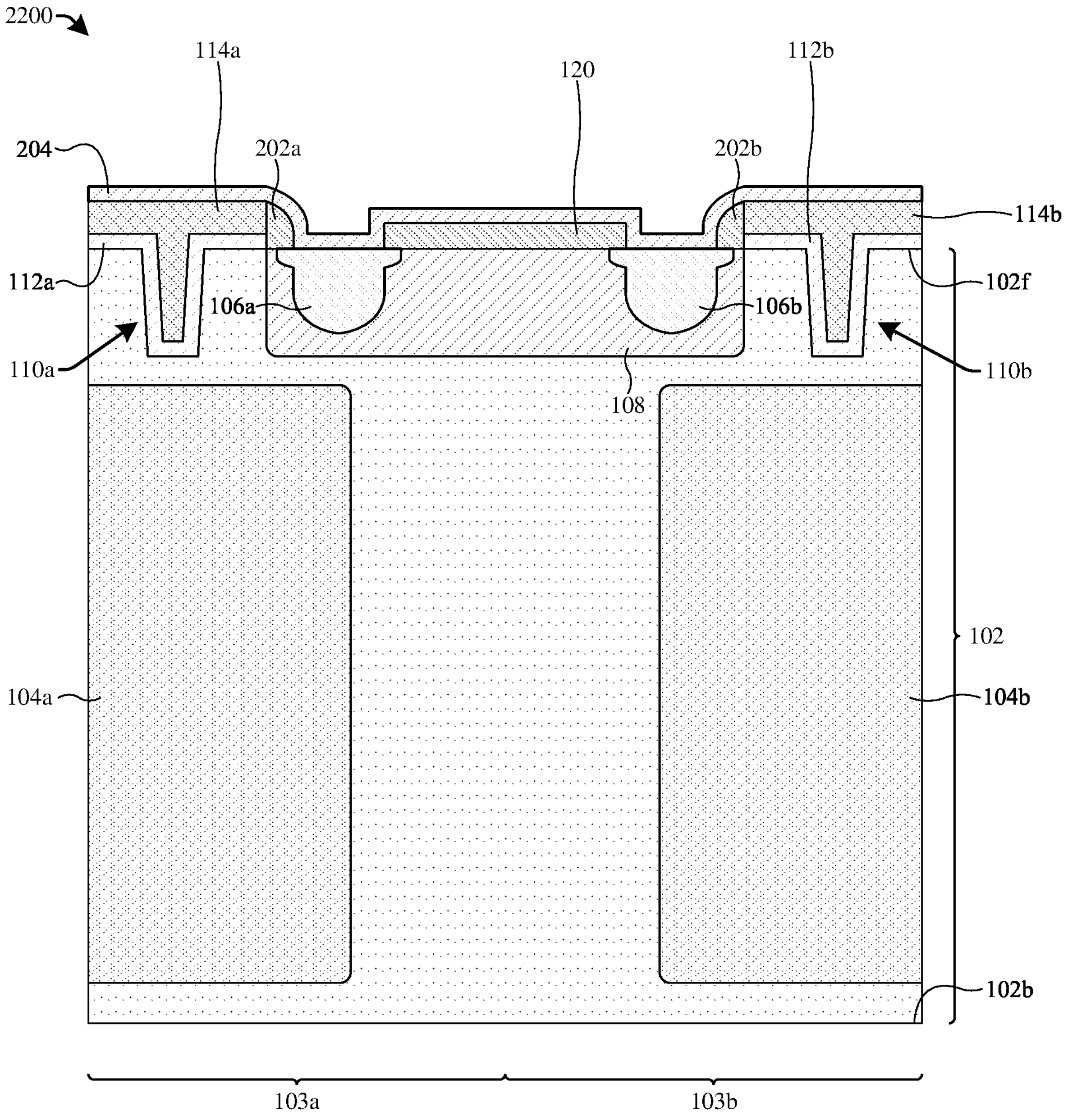

As shown in the cross-sectional view 2200 of FIG. 22, an etch stop layer 204 is formed over the plurality of transfer gates 110, the plurality of sidewall spacers 202, the dielectric structure 120, and the front side 102*f* of the substrate 102. In some embodiments, a process for forming the etch stop layer 204 comprises depositing the etch stop layer 204 on the plurality of transfer gates 110, the plurality of sidewall spacers 202, the dielectric structure 120, and the front side 102*f* of the substrate 102. The etch stop layer 204 may be deposited by, for example, CVD, PVD, ALD, some other deposition process, or a combination of the foregoing.

Figure 23:
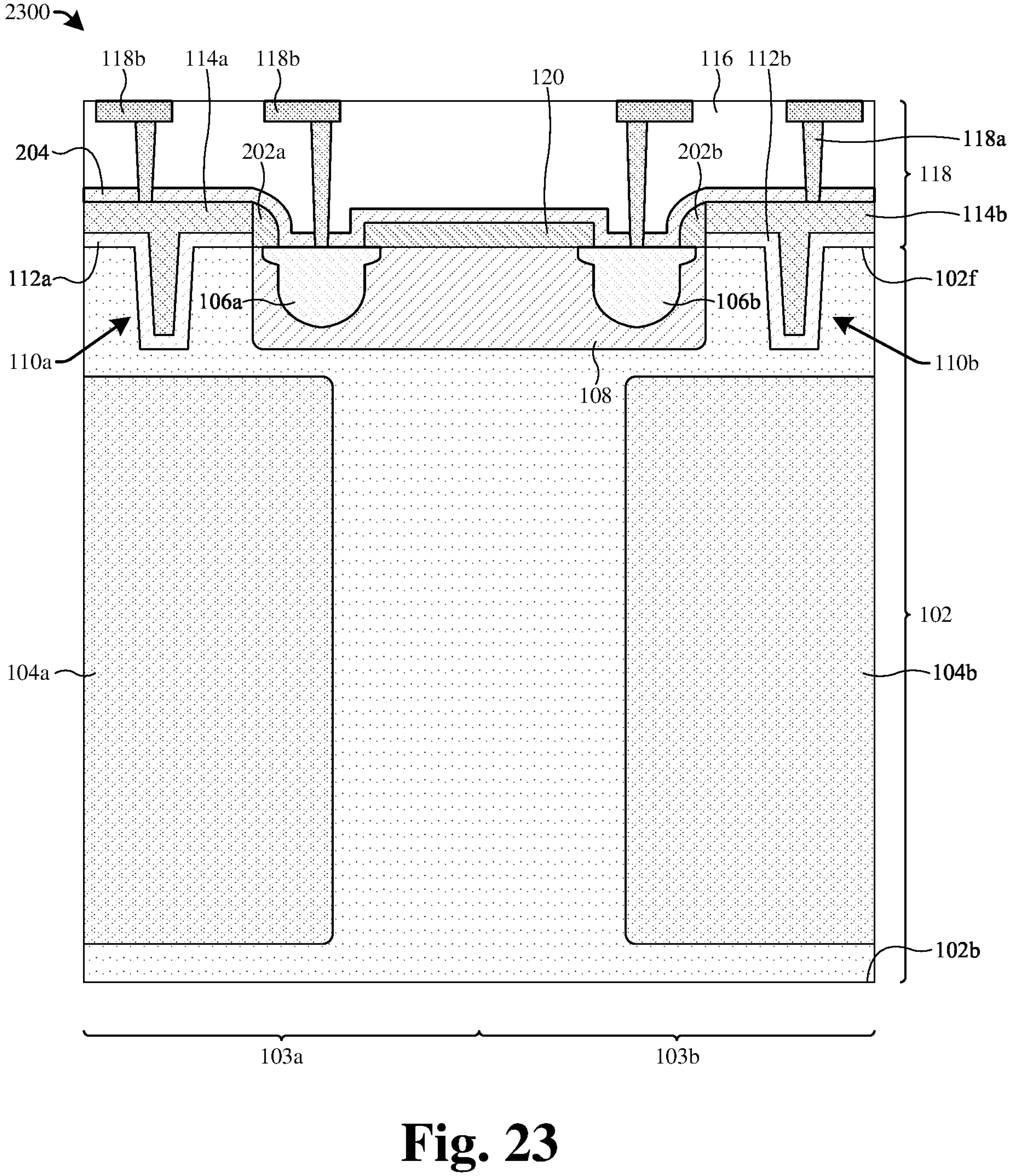

As shown in the cross-sectional view 2300 of FIG. 23, an ILD structure 116 is formed over the front side 102*f* of the substrate 102 and over the plurality of transfer gates 110. The ILD structure 116 may also be formed over the etch stop layer 204. Also shown in the cross-sectional view 2000 of FIG. 20, an interconnect structure 118 is formed in the ILD structure 116 (and in the etch stop layer 204) and over the front side 102*f* of the substrate 102. In some embodiments, the interconnect structure 118 comprises a plurality of conductive contacts 118*a* and a plurality of conductive wires 118*b*.

In some embodiments, a process for forming the ILD structure 116 and the interconnect structure 118 comprises forming a first ILD layer over the front side 102*f* of the substrate 102. Thereafter, contact openings are formed in the first ILD layer. A conductive material (e.g., tungsten (W)) is then formed on the first ILD layer and in the contact openings. Thereafter, a planarization process (e.g., chemical-mechanical planarization (CMP)) is performed on the conductive material to form the plurality of conductive contacts 118*a* in the first ILD layer. A second ILD layer is then formed over the first ILD layer and the plurality of conductive contacts 118*a*. A plurality of trenches are then formed in the second ILD layer. A conductive material (e.g., copper (Cu)) is formed on the second ILD layer and in the trenches. Thereafter, a planarization process (e.g., CMP) is performed into the conductive material to form the plurality of conductive wires 118*b*.

The ILD layers may be formed by, for example, CVD, PVD, ALD, some other deposition process, or a combination of the foregoing. The conductive material(s) (e.g., tungsten (W), copper (Cu), etc.) may be formed using a deposition process (e.g., CVD, PVD, sputtering, etc.) and/or a plating process (e.g., electrochemical plating, electroless plating, etc.). It will be appreciated that, in some embodiments, additional conductive features (e.g., conductive vias, additional conductive wires, etc.) of the interconnect structure 118 may be formed over the front side 102*f* of the substrate 102 (e.g., via a damascene process, such as a single damascene process, a dual damascene process, or the like).

Figure 24:
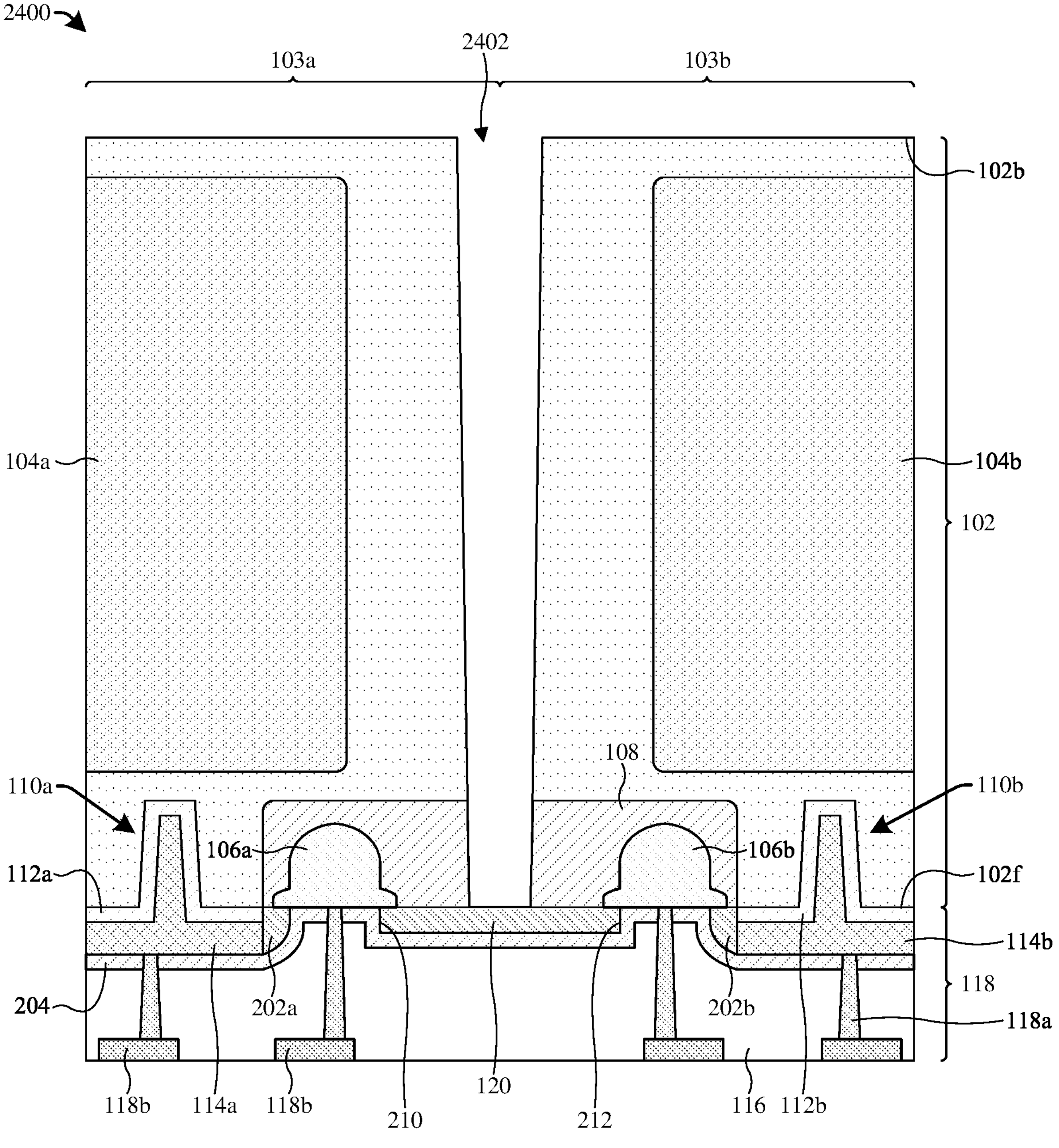

As shown in the cross-sectional view 2400 of FIG. 24, a trench 2402 is formed in the substrate 102. The trench 2402 is formed extending into the substrate 102 from the back side

102*b* of the substrate 102. The trench 2402 is formed extending laterally through the substrate 102, such that the trench 2402 laterally surrounds the plurality of pixel regions 103.

In some embodiments, the trench 2402 is formed extending fully through the substrate 102 from the back side 102*b* of the substrate 102 to the front side 102*f* of the substrate 102. In other embodiments, the DTI structure 115 may be formed extending partially through the substrate 102 (e.g., not fully through the substrate 102). In further embodiments, the trench 2402 is formed extending partially into the dielectric structure 120. In such embodiments, the trench 2402 may extend from the back side 102*b* of the substrate 102 to a location between an upper and lower surface of the dielectric structure 120 (see, e.g., the first lower surface 902).

The trench 2402 is formed laterally between the first floating diffusion node 106*a* and the second floating diffusion node 106*b*. The trench 2402 is formed laterally between the first sidewall spacer 202*a* and the second sidewall spacer 202*b*. The trench 2402 is formed laterally between a first sidewall 210 of the dielectric structure 120 and a second sidewall 212 of the dielectric structure 120. A portion of the trench 2402 is formed laterally within a perimeter of the dielectric structure 120.

In some embodiments, a layout of the trench 2402 has a grid-like shape. As such, the footprint of the trench 2402 has the grid-like shape. The grid-like shape of the trench 2402 comprises longitudinal portions of the trench 2402 and transverse portions of the trench 2402. The longitudinal portions of the trench 2402 extend in parallel with one another in a first lateral direction. The transverse portions of the trench 2402 extend in parallel with one another in a second lateral direction perpendicular to the first lateral direction. The longitudinal portions of the trench 2402 and the transverse portions of the trench 2402 intersect one another. The regions of the trench 2402 where the longitudinal portions of the trench 2402 intersect the transverse portions of the trench 2402 may be referred to as intersection portions of the trench 2402. In some embodiments, the trench 2402 is formed so that a portion of one of the longitudinal portions of the trench 2402, a portion of one of the transverse portions of the trench 2402, and the intersection portion in which the one of the longitudinal portions of the trench 2402 and the one of the transverse portions of the trench 2402 intersect are disposed within the perimeter of the dielectric structure 120.

In some embodiments, the trench 2402 may have angled sidewalls, as illustrated in the cross-sectional view 2400 of FIG. 24. In other embodiments, the sidewalls of the trench 2402 may be substantially straight (e.g., vertical). It will be appreciated that, in some embodiments, the trench 2402 may be formed to extend into the substrate from the front side 102*f* of the substrate 102, rather than the back side 102*b* of the substrate 102.

In some embodiments, a process for forming the trench 2402 comprises forming a patterned masking layer (not shown) (e.g., positive/negative photoresist, a hardmask, etc.) over the back side 102*b* of the substrate 102. In some embodiments, a process for forming the patterned masking layer comprises flipping (e.g., rotating 180 degrees) the structure illustrated in FIG. 23 so that the back side 102*b* of the substrate 102 is facing upward. Thereafter, a masking layer (not shown) is deposited on the back side 102*b* of the substrate 102. The masking layer may be deposited by, for example, CVD, PVD, ALD, a spin-on process, some other deposition process, or a combination of the foregoing. Thereafter, the masking layer is exposed to a pattern (e.g., via a lithography process, such as photolithography, extreme ultraviolet lithography, or the like) and developed, thereby forming the patterned masking layer over the back side 102*b* of the substrate 102.

With the patterned masking layer in place over the back side 102*b* of the substrate 102, an etching process is then performed on the substrate 102. The etching process removes unmasked portions of the substrate 102, thereby forming the trench 2402 in the substrate 102. In some embodiments, the etching process may stop on the dielectric structure 120. The etching process may be or comprise, for example, a wet etching process, a dry etching process, a RIE process, some other etching process, or a combination of the foregoing. Subsequently, in some embodiments, the patterned masking layer is stripped away.

Figure 25:
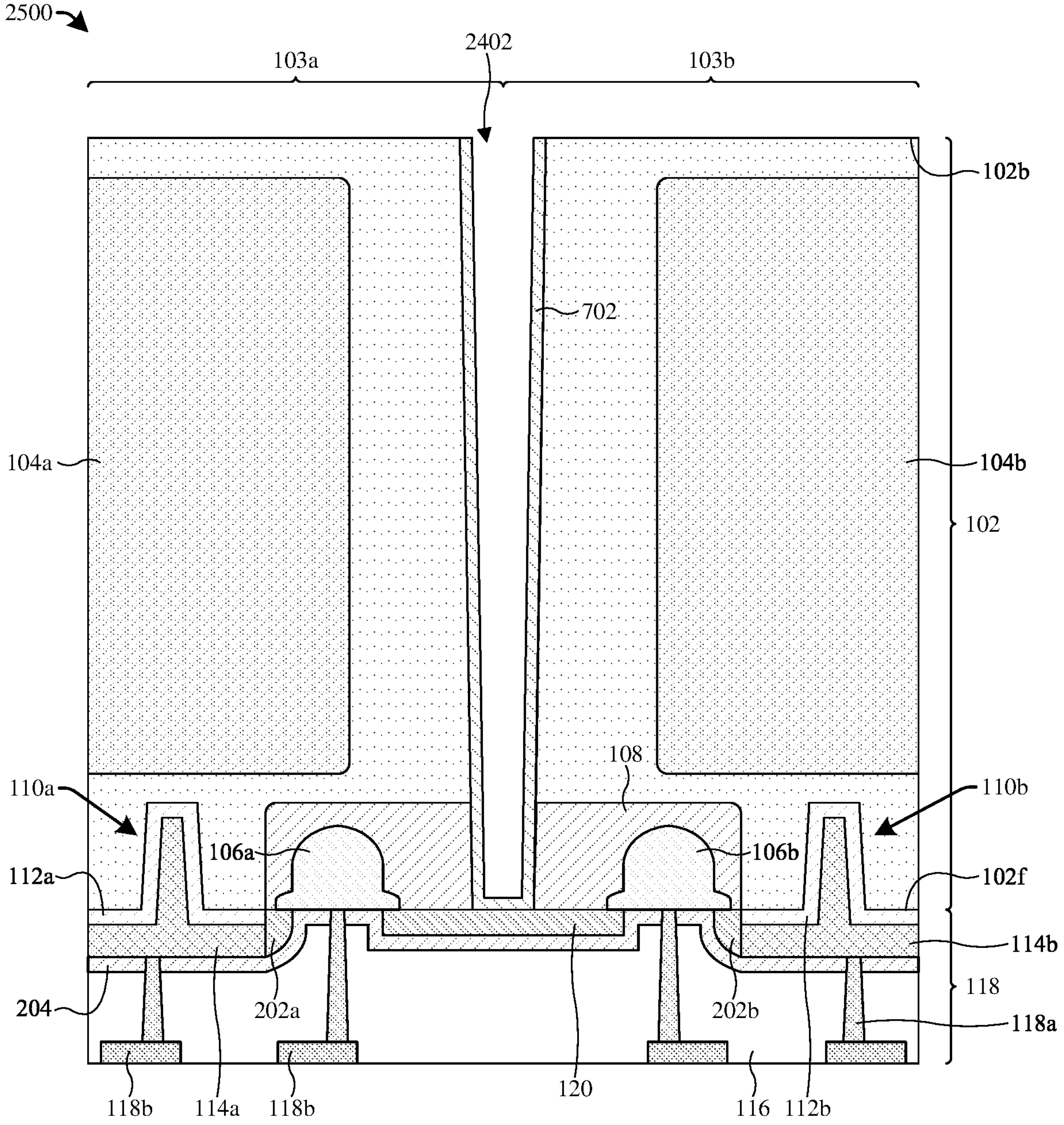

As shown in the cross-sectional view 2500 of FIG. 25, a dielectric liner structure 702 is formed lining surfaces of the trench 2402 (e.g., sidewalls of the trench 2402, lower surfaces of the trench 2402, etc.). In some embodiments, the dielectric liner structure 702 is formed contacting (e.g., directly contacting) the substrate 102. In some embodiments, the dielectric liner structure 702 is formed contacting (e.g., directly contacting) the dielectric structure 120. In some embodiments, the dielectric liner structure 702 is omitted.

In some embodiments, a process for forming the dielectric liner structure 702 comprises depositing or growing a dielectric liner layer (not shown) on the back side 102*b* of the substrate 102 and along the surfaces of the trench 2402. The dielectric liner layer may be or comprise, for example, a high-k dielectric material (e.g., HfO, TaO, HfSiO, HfTaO, AlO, ZrO, etc.), an oxide (e.g., $SiO_2$), a nitride (e.g., SiN), an oxy-nitride (e.g., SiON), a carbide (e.g., silicon carbide (SiC)), some other dielectric material, or a combination of the foregoing. The dielectric liner layer may be deposited or grown by, for example, CVD, PVD, ALD, thermal oxidation, sputtering, some other deposition or growth process, or a combination of the foregoing. Thereafter, an upper portion of the dielectric liner layer is removed, thereby leaving remaining portions in place as the dielectric liner structure 702. In some embodiments, the upper portion of the dielectric liner layer may be removed by, for example, a planarization process (e.g., chemical-mechanical planarization (CMP)), an etching process (e.g., wet etching, dry etching, etc.), some other removal process, or the like.

Figure 26:
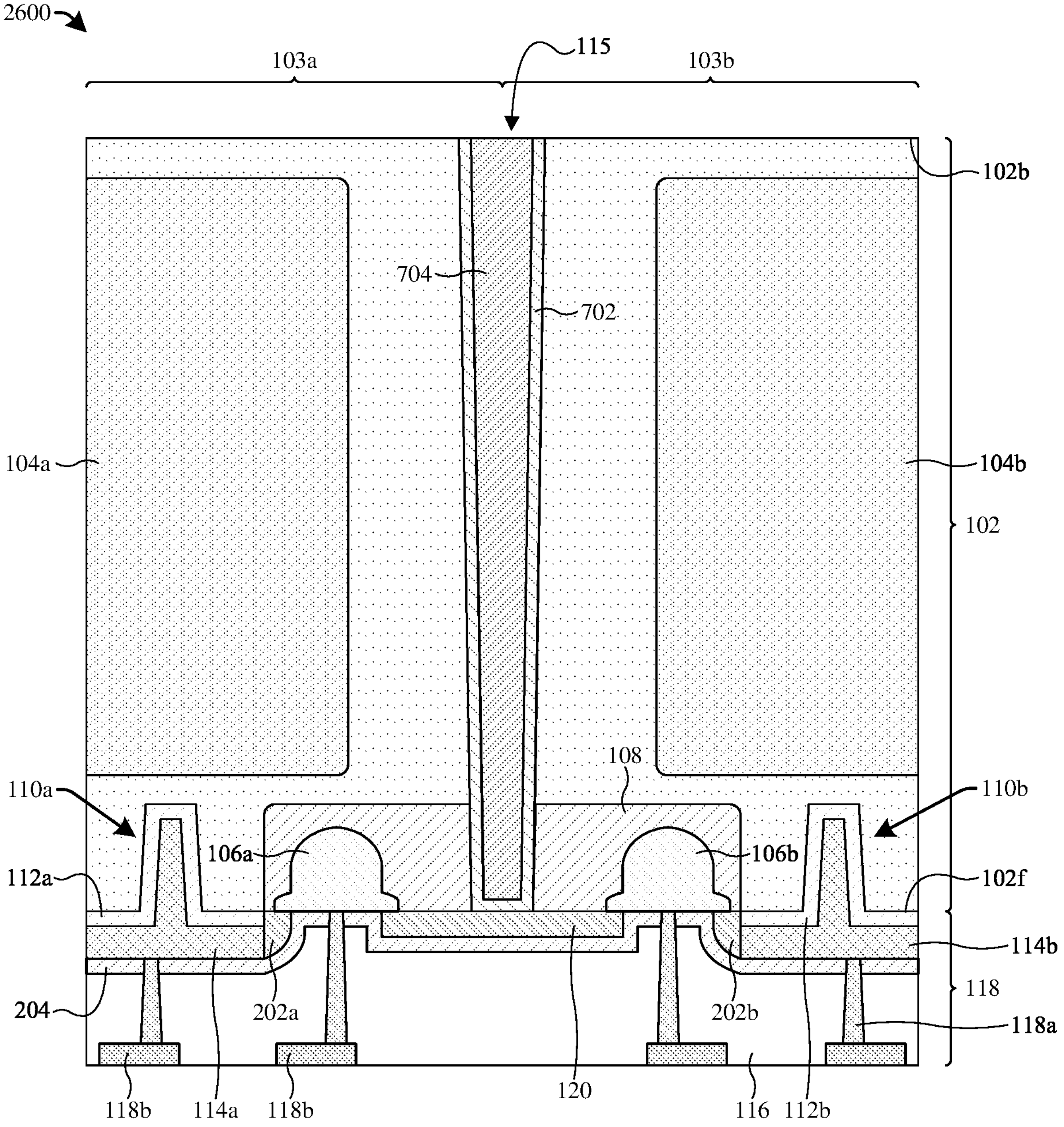

As shown in the cross-sectional view 2600 of FIG. 26, a dielectric filler structure 704 is formed in the trench 2402 (see, e.g., FIG. 25). In some embodiments, the dielectric filler structure 704 may also be formed over the back side 102*b* of the substrate 102. In such embodiments, a portion of the dielectric filler structure 704 is formed along the back side 102*b* of the substrate 102. In some embodiments, forming the dielectric filler structure 704 completes formation of a DTI structure 115 in the trench 2402. In other words, the DTI structure 115 is formed in the trench 2402, and forming the DTI structure 115 in the trench 2402 comprises forming the dielectric filler structure 704 in the trench 2402.

Because the DTI structure 115 is formed in the trench 2402, it will be appreciated that the trench 2402 comprises features (e.g., structural features) that correspond to features of the DTI structure 115 described herein. For example, as described herein, the DTI structure 115 may have a width 122. Thus, it will be appreciated that the trench 2402 may also have the width 122 (or a substantially similar width as the width 122). In some embodiments, the DTI structure 115 comprises longitudinal portions (see, e.g., the first longitudinal portion 115$L_1$) of the DTI structure 115, transverse portions (see, e.g., the first transverse portion 115$T_1$), and a plurality of intersection portions (see, e.g., the first intersection portion 115$X_1$) of the DTI structure 115.

Because the dielectric structure 120 provides more precise control over the location in which the plurality of floating diffusion nodes 106 are formed (e.g., due to being used as a masking structure), the DTI structure 115 may be formed more precisely laterally spaced from the plurality of floating diffusion nodes 106 (e.g., due to the lateral spacing between the first floating diffusion node 106*a* and the second floating diffusion node 106*b* being more precisely controlled). Because the DTI structure 115 may be formed more precisely laterally spaced from the plurality of floating diffusion nodes 106, in comparison to a typical image sensor (e.g., an image sensor not comprising the dielectric structure 120), the image sensor of the present disclosure may have improved performance (e.g., decreased dark current, decreased white pixels, etc.). In addition, in some embodiments, a cost to fabricate the image sensor of the present disclosure may be less than a cost to fabricate the typical image sensor (e.g., the dielectric structure 120 may allow better control over the lateral spacing while utilizing current generation fabrication tools, such as current generation lithography tools, current generation etching tools, etc.).

In some embodiments, a process for forming the dielectric filler structure 704 comprises depositing the dielectric filler structure 704 on the dielectric liner structure 702 and depositing the dielectric filler structure 704 in the trench 2402. In some embodiments, the dielectric filler structure 704 is also deposited on the back side 102*b* of the substrate 102. In some embodiments, a planarization process (e.g., CMP) is performed on the dielectric filler structure 704 to co-planarize a surface of the dielectric filler structure 704 with the back side 102*b* of the substrate 102 (and/or a surface of the dielectric liner structure 702).

Figure 27:
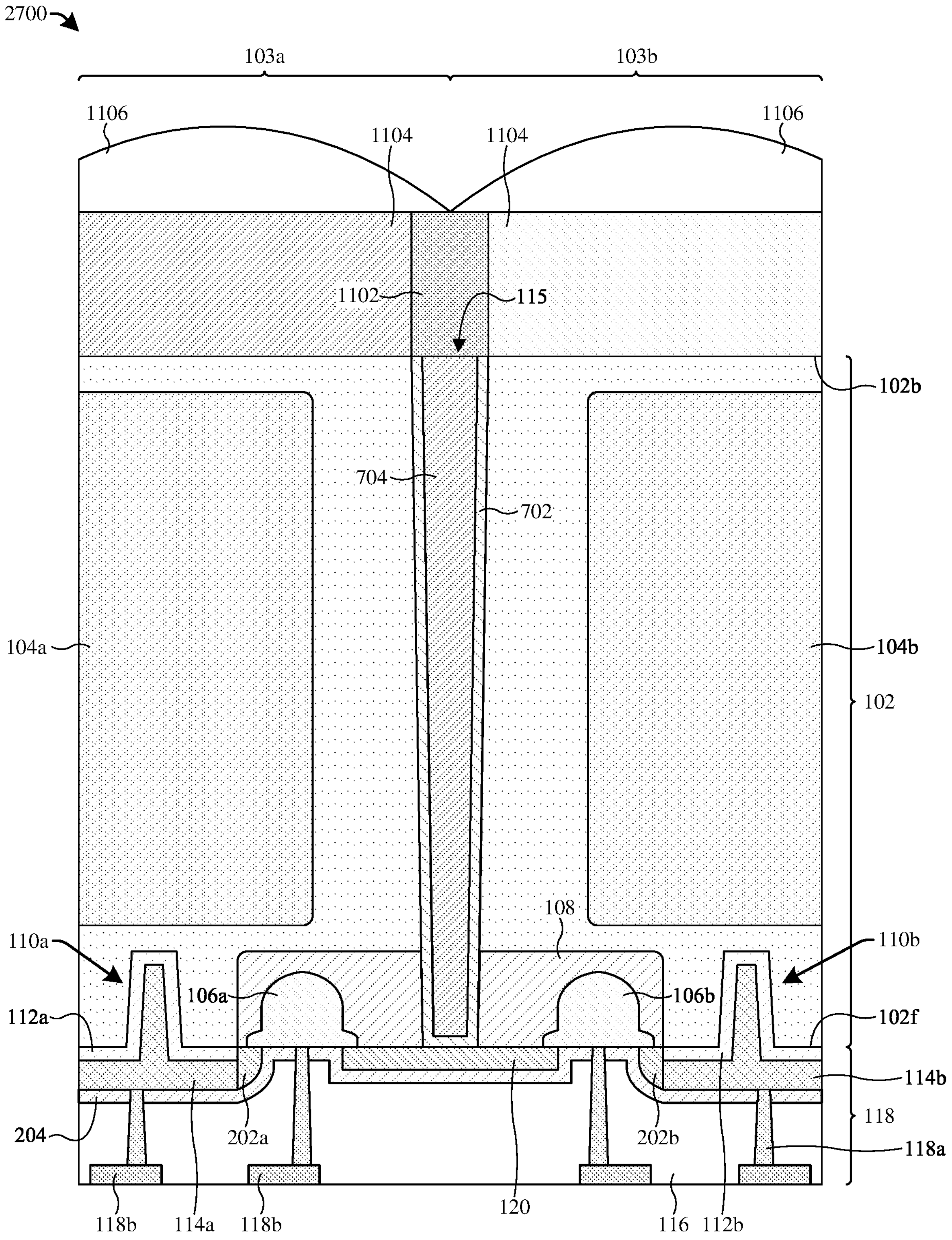

As shown in the cross-sectional view 2700 of FIG. 27, an isolation grid 1102 is formed along the back side 102*b* of the substrate 102. In some embodiments, the isolation grid 1102 is formed overlying, at least partially, the DTI structure 115. In some embodiments, a process for forming the isolation grid 1102 comprises forming a patterned masking layer (not shown), which has a trench disposed therein, along the back side 102*b* of the substrate 102. Thereafter, an isolation material is deposited on the patterned masking layer and in the trench. The isolation material may be or comprise, for example, a metal (e.g., tungsten (W), aluminum (Al), cobalt (Co), copper (Cu), silver (Ag), gold (Au), some other metal, or a combination of the foregoing), an oxide (e.g., SiO2), a nitride (e.g., SiN), a carbide (e.g., SiC), a high-k dielectric material (e.g., HfO, TaO, etc.), a low-k dielectric material, some other isolation material, or a combination of the foregoing. Thereafter, a planarization process is performed (e.g., CMP, etch back process, etc.) on the isolation material to remove an upper portion of the isolation material, thereby leaving lower portions of the isolation material in the trench as the isolation grid 1102. Subsequently, in some embodiments, the patterned masking layer is stripped away.

Also shown in the cross-sectional view 2700 of FIG. 27, an EMR filter 1104 is formed along the back side 102*b* of the substrate 102 and within the isolation grid 1102. In some embodiments, a process for forming the EMR filter 1104 comprises depositing (e.g., via CVD, PVD, ALD, sputtering, a spin-on process, etc.) one or more light filtering materials onto the back side 102*b* of the substrate 102 and within the isolation grid 1102. The one or more light filtering materials are materials that allow for the transmission of radiation (e.g., light) having a specific wavelength range, while blocking light of wavelengths outside of the specified range. Subsequently, in some embodiments, a planarization process (e.g., CMP) may be performed on the EMR filter 1104 to planarize an upper surface of the EMR filter 1104.

Also shown in the cross-sectional view 2700 of FIG. 27, a plurality of micro-lenses 1106 are formed on/over the EMR filter 1104. In some embodiments, the plurality of micro-lenses 1106 may be formed by depositing a micro-lens material on the EMR filter 1104 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The plurality of micro-lenses 1106 are then formed by selectively etching the micro-lens material according to the micro-lens template. In some embodiments, after the plurality of micro-lenses 1106 are formed, formation of the image sensor (see, e.g., FIG. 11) is complete.

For clarity, it will be appreciated that spatially relative terms (e.g., over, under, upper, lower, etc.) used herein to describe the structures illustrated in the figures are generally based on the orientation of such structures as illustrated in their respective figures. For example, in describing the structure illustrated in FIG. 27, it may be said that plurality of micro-lenses 1106 are formed over the EMR filter 1104. On the other hand, in describing the structure illustrated in FIG. 11, it may be said that the EMR filter 1104 overlies the plurality of micro-lenses 1106.

Figure 28:
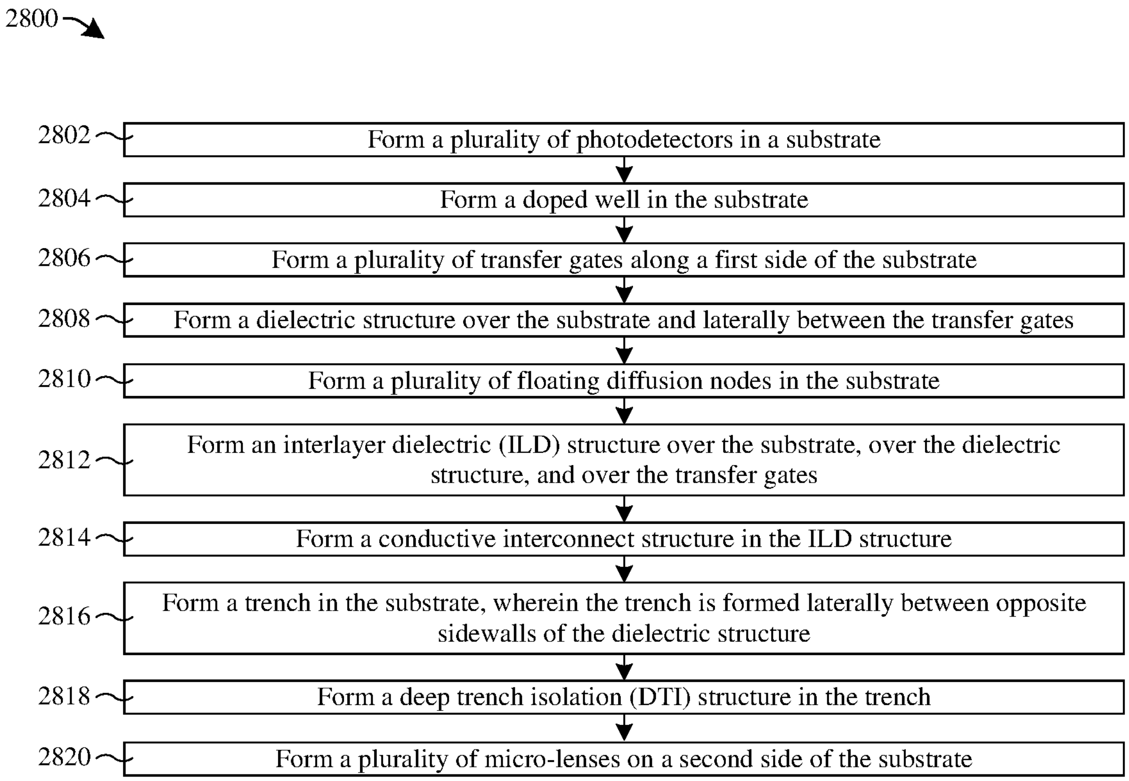
FIG. 28 illustrates a flowchart of some embodiments of a method for forming an image sensor having a dielectric structure for small pixel designs.

FIG. 28 illustrates a flowchart 2800 of some embodiments of a method for forming an image sensor having a dielectric structure for small pixel designs. While the flowchart 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2802, a plurality of photodetectors are formed in a substrate. FIG. 13 illustrates a cross-sectional view 1300 of some embodiments corresponding to act 2802.

At act 2804, a doped well is formed in the substrate. FIG. 14 illustrates a cross-sectional view 1400 of some embodiments corresponding to act 2804.

At act 2806, a plurality of transfer gates are formed along a first side of the substrate. FIGS. 15-18 illustrate a series of cross-sectional views 1500-1800 of some embodiments corresponding to act 2806.

At act 2808, a dielectric structure is formed over the substrate and laterally between the transfer gates. FIGS. 19-20 illustrate a series of cross-sectional views 1900-2000 of some embodiments corresponding to act 2808.

At act 2810, a plurality of floating diffusion nodes are formed in the substrate. FIG. 21 illustrates a cross-sectional view 2100 of some embodiments corresponding to act 2810.

At act 2812, an interlayer dielectric (ILD) structure is formed over the substrate, over the dielectric structure, and over the transfer gates. FIGS. 22-23 illustrate a series of cross-sectional views 2200-2300 of some embodiments corresponding to act 2812.

At act 2814, a conductive interconnect structure is formed in the ILD structure. FIG. 23 illustrates a cross-sectional view 2300 of some embodiments corresponding to act 2814.

At act 2816, a trench is formed in the substrate, wherein the trench is formed laterally between opposite sidewalls of the dielectric structure. FIG. 24 illustrates a cross-sectional view 2400 of some embodiments corresponding to act 2816.

At act 2818, a deep trench isolation (DTI) structure is formed in the trench. FIGS. 25-26 illustrate a series of cross-sectional views 2500-2600 of some embodiments corresponding to act 2818.

At act 2820, a plurality of micro-lenses are formed on a second side of the substrate. FIG. 27 illustrates a cross-sectional view 2700 of some embodiments corresponding to act 2820.

In some embodiments, the present application provides an image sensor. The image sensor comprises a semiconductor substrate, wherein the semiconductor substrate comprises a first pixel region and a second pixel region, wherein the semiconductor substrate has a first side, and wherein the semiconductor substrate has a second side opposite the first side of the semiconductor substrate. A first transfer gate overlies the first pixel region. A second transfer gate overlies the second pixel region. A deep trench isolation (DTI) structure is disposed in the semiconductor substrate and laterally between the first pixel region and the second pixel region, wherein the DTI structure extends fully through the semiconductor substrate from the first side of the semiconductor substrate to the second side of the semiconductor substrate. A first floating diffusion node is disposed in the first pixel region. A second floating diffusion node is disposed in the second pixel region, wherein the DTI structure is disposed laterally between the first floating diffusion node and the second floating diffusion node. An interlayer dielectric (ILD) structure is disposed over the semiconductor substrate, the first transfer gate, the second transfer gate, the DTI structure, the first floating diffusion node, and the second floating diffusion node. A dielectric structure is disposed between the ILD structure and the semiconductor substrate, wherein the dielectric structure is disposed laterally between the first floating diffusion node and the second floating diffusion node, wherein the dielectric structure is laterally spaced from the first transfer gate and the second transfer gate, wherein the dielectric structure overlies the DTI structure, and wherein a width of the dielectric structure is greater than a width of the DTI structure.

In some embodiments, the dielectric structure is a different material than the ILD structure.

In some embodiments, the DTI structure contacts the dielectric structure.

In further embodiments, the DTI structure contacts a first lower surface of the dielectric structure. The dielectric structure has a second lower surface disposed between the first lower surface of the dielectric structure and the first side of the semiconductor substrate.

In some embodiments, a first sidewall spacer is disposed over the semiconductor substrate and along sidewalls of the first transfer gate. A second sidewall spacer is disposed over the semiconductor substrate and along sidewalls of the second transfer gate, wherein the first sidewall spacer, the second sidewall spacer, and the dielectric structure are a same material.

In further embodiments, the dielectric structure is laterally spaced from the first sidewall spacer in a first direction. The dielectric structure is laterally spaced from the second sidewall spacer in a second direction opposite the first direction.

In some embodiments, the dielectric structure has a cross-like shape when viewed from a top view.

In some embodiments, an etch stop layer is disposed over the semiconductor substrate, the dielectric structure, the first transfer gate, the second transfer gate, the first floating diffusion node, and the second floating diffusion node, wherein the etch stop layer is disposed vertically between the dielectric structure and the ILD structure.

In some embodiments, the width of the dielectric structure and the width of the DTI structure are both measured along a plane. The plane intersects the semiconductor substrate and extends fully through the semiconductor substrate from the first side of the semiconductor substrate to the second side of the semiconductor substrate.

In some embodiments, the present application provides an image sensor. The image sensor comprises a first photodetector disposed in a first pixel region of a semiconductor substrate, wherein the semiconductor substrate has a first side and a second side opposite the first side. A second photodetector is disposed in a second pixel region of the semiconductor substrate. A first floating diffusion node is disposed in the first pixel region. A second floating diffusion node is disposed in the second pixel region. A deep trench isolation (DTI) structure is disposed in the semiconductor substrate and laterally surrounding both the first pixel region and the second pixel region, wherein the DTI structure extends fully through the semiconductor substrate from the first side of the semiconductor substrate to the second side of the semiconductor substrate, wherein a first portion of the DTI structure extends laterally through the semiconductor substrate in a first direction, wherein a second portion of the DTI structure extends laterally through the semiconductor substrate in a second direction perpendicular to the first direction, and wherein the first portion of the DTI structure intersects the second portion of the DTI structure at a third portion of the DTI structure. An interlayer dielectric (ILD) structure is disposed over the semiconductor substrate, the DTI structure, the first floating diffusion node, and the second floating diffusion node. A dielectric structure is disposed between the ILD structure and semiconductor substrate, wherein the dielectric structure is disposed laterally between the first floating diffusion node and the second floating diffusion node, and wherein the dielectric structure overlies, at least partially, each of the third portion of the DTI structure, the second portion of the DTI structure, and the first portion of the DTI structure.

In some embodiments, a first conductive contact is disposed in the ILD structure and electrically coupled to the first floating diffusion node. A second conductive contact is disposed in the ILD structure and electrically coupled to the second floating diffusion node, wherein the first conductive contact extends vertically from the first floating diffusion node, wherein the second conductive contact extends vertically from the second floating diffusion node, wherein the first conductive contact is disposed laterally between a first sidewall of the dielectric structure and a second sidewall of the dielectric structure, wherein the first sidewall of the dielectric structure is opposite the second sidewall of the dielectric structure, wherein the first conductive contact is disposed laterally between a third sidewall of the dielectric structure and a fourth sidewall of the dielectric structure, wherein the third sidewall of the dielectric structure is opposite the fourth sidewall of the dielectric structure, wherein the second conductive contact is disposed laterally between the first sidewall of the dielectric structure and the second sidewall of the dielectric structure, and wherein the second conductive contact is disposed laterally between the third sidewall of the dielectric structure and the fourth sidewall of the dielectric structure.

In further embodiments, the first sidewall of the dielectric structure is spaced from the second sidewall of the dielectric structure in the first direction. The third sidewall of the dielectric structure is spaced from the fourth sidewall of the dielectric structure in the second direction.

In some embodiments, a third photodetector is disposed in a third pixel region of the semiconductor substrate. A fourth photodetector is disposed in a fourth pixel region of the semiconductor substrate, wherein the DTI structure laterally surrounds each of the first pixel region, the second pixel region, the third pixel region, and the fourth pixel region, wherein the first portion of the DTI structure is disposed laterally between the first pixel region and the third pixel region, wherein the first portion of the DTI structure is disposed laterally between the fourth pixel region and the second pixel region, wherein the second portion of the DTI structure is disposed laterally between the first pixel region and the fourth pixel region, and wherein the second portion of the DTI structure is disposed laterally between the third pixel region and the second pixel region.

In further embodiments, a third floating diffusion node is disposed in the third pixel region. A fourth floating diffusion node is disposed in the fourth pixel region. A first conductive contact is disposed in the ILD structure and is electrically coupled to the first floating diffusion node. A second conductive contact is disposed in the ILD structure and is electrically coupled to the second floating diffusion node. A third conductive contact is disposed in the ILD structure and is electrically coupled to the third floating diffusion node. A fourth conductive contact is disposed in the ILD structure and is electrically coupled to the fourth floating diffusion node, wherein each of the first, second, third, and fourth floating diffusion nodes are disposed laterally between a first sidewall of the dielectric structure and a second sidewall of the dielectric structure, wherein each of the first, second, third, and fourth floating diffusion nodes are disposed laterally between a third sidewall of the dielectric structure and a fourth sidewall of the dielectric structure, wherein the first sidewall of the dielectric structure is spaced from the second sidewall of the dielectric structure in the first direction, and wherein the third sidewall of the dielectric structure is spaced from the fourth sidewall of the dielectric structure in the second direction.

In some embodiments, the second portion of the DTI structure has a first sidewall and a second sidewall. The first sidewall of the second portion of the DTI structure is laterally spaced a first distance from the second sidewall of the second portion of the DTI structure in the first direction. The dielectric structure has a first sidewall and a second sidewall. The first sidewall of the dielectric structure is laterally spaced from the second sidewall of the dielectric structure in the first direction. The dielectric structure has a third sidewall and a fourth sidewall. The third sidewall of the dielectric structure and the fourth sidewall of the dielectric structure are both disposed laterally between the first sidewall of the dielectric structure and the second sidewall of the dielectric structure. The third sidewall of the dielectric structure is laterally spaced a second distance from the fourth sidewall of the dielectric structure in the first direction. The second distance is greater than the first distance.

In further embodiments, the first portion of the DTI structure has a first sidewall and a second sidewall. The first sidewall of the first portion of the DTI structure is laterally spaced a third distance from the second sidewall of the first portion of the DTI structure in the second direction. The dielectric structure has a fifth sidewall and a sixth sidewall. The fifth sidewall of the dielectric structure is laterally spaced from the sixth sidewall of the dielectric structure in the second direction. The dielectric structure has a seventh sidewall and an eighth sidewall. The seventh sidewall of the dielectric structure and the eighth sidewall of the dielectric structure are both disposed laterally between the fifth sidewall of the dielectric structure and the sixth sidewall of the dielectric structure. The seventh sidewall of the dielectric structure is laterally spaced a fourth distance from the eighth sidewall of the dielectric structure in the second direction. The fourth distance is greater than the third distance.

In further embodiments, the fourth distance is substantially the same as the second distance.

In some embodiments, the present application provides a method for forming an image sensor. The method comprises forming a first transfer gate along a first side of a semiconductor substrate, wherein the semiconductor substrate has a second side opposite the first side. A second transfer gate is formed along the first side of the semiconductor substrate. A dielectric structure is formed along the first side of the semiconductor substrate and laterally between the first transfer gate and the second transfer gate. After the dielectric structure is formed, a first floating diffusion node is formed in the semiconductor substrate and laterally between the first transfer gate and the dielectric structure. After the dielectric structure is formed, a second floating diffusion node is formed in the semiconductor substrate and laterally between the second transfer gate and the dielectric structure. An etch stop layer is formed over the first transfer gate, the second transfer gate, the dielectric structure, the first side of the semiconductor substrate, the first floating diffusion node, and the second floating diffusion node. An interlayer dielectric (ILD) structure is formed over the etch stop layer. A trench is formed in the semiconductor substrate, wherein the trench is formed laterally between the first floating diffusion node and the second floating diffusion node, wherein the trench is formed extending fully through the semiconductor substrate from the first side of the semiconductor substrate to the second side of the semiconductor substrate, and wherein the trench is formed with a portion of the trench disposed laterally within a perimeter of the dielectric structure. A deep trench isolation (DTI) structure is formed in the semiconductor substrate, wherein forming the DTI structure comprises depositing a dielectric material in the trench.

In some embodiments, forming the dielectric structure comprises performing a process. The process comprises depositing a dielectric layer over the first side of the semiconductor substrate, the first transfer gate, and the second transfer gate before the etch stop layer is formed. A patterned masking layer is formed on the dielectric layer. With the patterned masking layer on the dielectric layer, performing an etching process on the dielectric layer to etch the dielectric layer according to the patterned masking layer.

In further embodiments, a first sidewall spacer is formed over the first side of the semiconductor substrate and along sidewalls of the first transfer gate. A second sidewall spacer is formed over the first side of the semiconductor substrate and along sidewalls of the second transfer gate, wherein forming the first sidewall spacer and the second sidewall spacer comprises the etching process removing horizontal portions of the dielectric layer, thereby leaving vertical portions of the dielectric layer in place as the first sidewall spacer and the second sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

forming a first photodetector and a second photodetector bordering each other in a semiconductor substrate;

forming a first transfer gate along a first side of the semiconductor substrate, wherein the semiconductor substrate has a second side opposite the first side;

forming a second transfer gate along the first side of the semiconductor substrate;

forming a dielectric structure along the first side of the semiconductor substrate and laterally between the first transfer gate and the second transfer gate, wherein the dielectric structure has a cross-shaped top geometry at a boundary between the first and second photodetectors;

after the dielectric structure is formed, forming a first floating diffusion node in the semiconductor substrate and laterally between the first transfer gate and the dielectric structure;

after the dielectric structure is formed, forming a second floating diffusion node in the semiconductor substrate and laterally between the second transfer gate and the dielectric structure;

forming an etch stop layer over the first transfer gate, the second transfer gate, the dielectric structure, the first side of the semiconductor substrate, the first floating diffusion node, and the second floating diffusion node;

forming an interlayer dielectric (ILD) structure over the etch stop layer;

forming a trench in the semiconductor substrate, wherein the trench is formed laterally between the first floating diffusion node and the second floating diffusion node, wherein the trench is formed extending fully through the semiconductor substrate from the first side of the semiconductor substrate to the second side of the semiconductor substrate, and wherein the trench is formed with a portion of the trench disposed laterally within a perimeter of the dielectric structure; and forming a deep trench isolation (DTI) structure in the semiconductor substrate, wherein forming the DTI structure comprises depositing a dielectric material in the trench.

2. The method of claim 1, wherein forming the dielectric structure comprises:

before the etch stop layer is formed, depositing a dielectric layer over the first side of the semiconductor substrate, the first transfer gate, and the second transfer gate;

forming a patterned masking layer on the dielectric layer; and with the patterned masking layer on the dielectric layer, performing an etching process on the dielectric layer to etch the dielectric layer according to the patterned masking layer.

3. The method of claim 2, further comprising:

forming a first sidewall spacer over the first side of the semiconductor substrate and along sidewalls of the first transfer gate; and forming a second sidewall spacer over the first side of the semiconductor substrate and along sidewalls of the second transfer gate, wherein forming the first sidewall spacer and the second sidewall spacer comprises the etching process removing horizontal portions of the dielectric layer, thereby leaving vertical portions of the dielectric layer in place as the first sidewall spacer and the second sidewall spacer.

4. The method of claim 1, wherein the DTI structure has a distal end contacting the dielectric structure and spaced from the first floating diffusion node and the second floating diffusion node.

5. The method of claim 1, further comprising:

doping the semiconductor substrate to form a p-well straddling a first photosensitive region of the semiconductor substrate and a second photosensitive region of the semiconductor substrate, wherein the dielectric structure contacts both the p-well and the DTI structure after forming the DTI structure.

6. A method for forming an image sensor, the method comprising:

forming a pair of photodetectors bordering in a semiconductor substrate;

forming a pair of gate electrodes respectively overlying the pair of photodetectors;

depositing a dielectric layer overlying the pair of gate electrodes and a boundary region between the pair of gate electrodes;

forming a mask overlying the boundary region, between and laterally offset from the pair of gate electrodes;

performing an etch into the dielectric layer with the mask in place to form a dielectric structure underlying the mask at the boundary region and to further form a pair of sidewall spacers respectively on sidewalls of the pair of gate electrodes;

doping the semiconductor substrate with the dielectric structure in place to form a pair of floating diffusion nodes respectively bordering the pair of gate electrodes and outside the boundary region; and forming a trench isolation structure extending completely through the semiconductor substrate at the boundary region;

wherein the dielectric layer extends along individual top surfaces of the pair of gate electrodes and the sidewalls of the pair of gate electrodes, wherein the etch clears the dielectric layer from the individual top surfaces of the pair of gate electrodes to expose the individual top surfaces of the pair of gate electrodes and concurrently forms the dielectric structure and the pair of sidewall spacers, and wherein the etch further forms the pair of sidewall spacers with a height greater than a height of the dielectric structure and from portions of the dielectric layer having individual top surfaces exposed at completion of the etch.

7. The method of claim 6, wherein the trench isolation structure contacts the dielectric structure.

8. The method of claim 6, further comprising:

depositing an etch stop layer overlying the pair of gate electrodes, the pair of sidewall spacers, and the dielectric structure; and forming a pair of contacts extending through the etch stop layer respectively to the pair of floating diffusion nodes.

9. The method of claim 6, wherein the forming of the trench isolation structure comprises:

performing an additional etch into the semiconductor substrate from an opposite side of the semiconductor substrate as the pair of gate electrodes, wherein the additional etch forms a trench exposing the dielectric structure and spaced from the pair of floating diffusion nodes.

10. The method of claim 6, wherein the dielectric structure blocks dopants from entering the semiconductor substrate at the boundary region during the doping.

11. The method according to claim 6, wherein the dielectric layer contacts the individual top surfaces of the pair of gate electrodes and the sidewalls of the pair of gate electrodes.

12. The method according to claim 11, wherein the dielectric layer, the dielectric structure, and the pair of sidewall spacers have only one material composition.

13. A method for forming an image sensor, the method comprising:

forming a pair of photodetectors bordering in a semiconductor substrate;

doping the semiconductor substrate to form a well region spaced from the pair of photodetectors;

forming a pair of gate electrodes respectively overlying the pair of photodetectors and respectively on opposite sides of the well region;

depositing a dielectric layer overlying the pair of gate electrodes and the well region;

patterning the dielectric layer to form a dielectric structure between and spaced from the pair of gate electrodes;

doping the semiconductor substrate with the dielectric structure in place to form a pair of floating diffusion nodes respectively bordering the pair of gate electrodes in the well region and separated from each other by a portion of the well region masked by the dielectric structure; and forming a pair of contact vias extending respectively to the pair of floating diffusion nodes with the dielectric structure in place, wherein the pair of contact vias are formed spaced from the dielectric structure, which is entirely formed before the pair of floating diffusion nodes are formed.

14. The method of claim 13, wherein the pair of floating diffusion nodes have a doping type opposite a doping type of the well region.

15. The method of claim 13, wherein the dielectric structure comprises silicon nitride.

16. The method according to claim 13, wherein the dielectric structure has a cross-shaped top geometry at a boundary between the pair of photodetectors.

17. The method according to claim 13, further comprising:

depositing an etch stop layer overlying the pair of gate electrodes and the dielectric structure after the doping and before the forming of the pair of contact vias, wherein the etch stop layer extends to the pair of floating diffusion nodes and contacts individual top surfaces of the pair of gate electrodes.

18. The method according to claim 13, wherein the dielectric structure has a top geometry with a first lateral recess and a second lateral recess in which the pair of contact vias are respectively arranged.

19. The method according to claim 13, further comprising:

forming four photodetectors, including the pair of photodetectors, arranged in two rows and two columns to form a two-by-two photodetector group, wherein, in a plan view, the four photodetectors have individual inner corners at a center of the two-by-two photodetector group, and wherein, in the plan view, the dielectric structure has a lateral recess at each of the individual inner corners of the four photodetectors and is laterally offset from remaining corners of the four photodetectors.

20. The method according to claim 19, wherein, in the plan view, the dielectric structure is spaced from an outer perimeter of the two-by-two photodetector group.

* * * * *